United States Patent
Yoshinari et al.

(10) Patent No.: US 12,066,700 B2
(45) Date of Patent: Aug. 20, 2024

(54) VIEWING ANGLE CONTROL SYSTEM AND IMAGE DISPLAY DEVICE

(71) Applicant: FUJIFILM Corporation, Tokyo (JP)

(72) Inventors: Shinichi Yoshinari, Kanagawa (JP); Eiichiro Aminaka, Kanagawa (JP); Naoya Nishimura, Kanagawa (JP); Naoya Shibata, Kanagawa (JP); Shinya Watanabe, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/052,438

(22) Filed: Nov. 3, 2022

(65) Prior Publication Data
US 2023/0118336 A1 Apr. 20, 2023

Related U.S. Application Data

(63) Continuation of application No. PCT/JP2021/016015, filed on Apr. 20, 2021.

(30) Foreign Application Priority Data

May 12, 2020 (JP) .................................. 2020-083971
Mar. 5, 2021 (JP) .................................. 2021-035455

(51) Int. Cl.
G02F 1/13 (2006.01)
G02F 1/1335 (2006.01)
G02F 1/13363 (2006.01)

(52) U.S. Cl.
CPC ...... *G02F 1/1323* (2013.01); *G02F 1/133531* (2021.01); *G02F 1/133562* (2021.01); *G02F 1/133634* (2013.01)

(58) Field of Classification Search
CPC .......... G09F 9/30; G09F 9/00; G02F 1/13363; G02F 2413/08; G02F 1/133634; G02F 1/133562; G02F 1/133531; G02F 1/1323
See application file for complete search history.

(56) References Cited

U.S. PATENT DOCUMENTS

2006/0103782 A1  5/2006 Adachi et al.
2009/0153783 A1* 6/2009 Umemoto .............. G02B 27/28
                                                   359/487.01
(Continued)

FOREIGN PATENT DOCUMENTS

EP           2390717 A1    11/2011
JP       2006-139160 A     6/2006
(Continued)

OTHER PUBLICATIONS

International Search Report issued in PCT/JP2021/016015 on Jun. 29, 2021.
(Continued)

*Primary Examiner* — Mariam Qureshi
(74) *Attorney, Agent, or Firm* — Edwards Neils LLC; Jean C. Edwards, Esq.

(57) ABSTRACT

Provided is a viewing angle control system and an image display device which are capable of controlling the viewing angle of a display screen in a longitudinal direction and improving the visibility in a specific lateral direction. The viewing angle control system includes a polarizer, and a light absorption anisotropic layer, in which the polarizer has an in-plane absorption axis in a film, an angle θ between a transmittance central axis of the light absorption anisotropic layer and a normal line of the film is in a range of 0.1° to 45°, and an angle φ between a direction in which the transmittance central axis of the light absorption anisotropic layer is orthographically projected onto the film surface and the absorption axis of the polarizer is 0° or greater and less than 85°, greater than 95° and less than 265°, or greater than 275° and 360° or less.

14 Claims, 7 Drawing Sheets

(56) References Cited

U.S. PATENT DOCUMENTS

2020/0026120 A1* 1/2020 Kato .................. G09F 9/00
2020/0103710 A1* 4/2020 Park ............. G02F 1/133634

FOREIGN PATENT DOCUMENTS

| JP | 2010-139938 A | 6/2010 |
|---|---|---|
| JP | 2011-248114 A | 12/2011 |
| JP | 4902516 B2 | 3/2012 |
| JP | 2012-256071 A | 12/2012 |
| WO | 2010/101141 A1 | 9/2010 |

OTHER PUBLICATIONS

Written Opinion issued in PCT/JP2021/016015 on Jun. 29, 2021.
International Preliminary Report on Patentability completed by WIPO on Nov. 15, 2022 in connection with International Patent Application No. PCT/JP2021/016015.
Office Action, issued by the Japanese Patent Office on Nov. 28, 2023, in connection with Japanese Patent Application No. 2022-521792.
Office Action, issued by the Japanese Patent Office on May 14, 2024, in connection with Japanese Patent Application No. 2022-521792.

* cited by examiner

VIEWING ANGLE CONTROL SYSTEM AND IMAGE DISPLAY DEVICE

CROSS-REFERENCE TO RELATED APPLICATIONS

This application is a Continuation of PCT International Application No. PCT/JP2021/016015 filed on Apr. 20, 2021, which was published under PCT Article 21(2) in Japanese, and which claims priority under 35 U.S.C. § 119(a) to Japanese Patent Application No. 2020-083971 filed on May 12, 2020 and Japanese Patent Application No. 2021-035455 filed on Mar. 5, 2021. The above applications are hereby expressly incorporated by reference, in their entirety, into the present application.

BACKGROUND OF THE INVENTION

1. Field of the Invention

The present invention relates to a viewing angle control system and an image display device.

2. Description of the Related Art

In a case where an in-vehicle display such as a car navigation system is used, there is a problem in that light emitted upward from a display screen is reflected on a windshield or the like and interferes with driving. For the purpose of solving such a problem, for example, JP4902516B suggests a method of using a first polarizer that has an absorption axis in a plane and a second polarizer (light absorption anisotropic layer) in which an absorption axis of a dichroic substance is aligned at 0° to 45° with respect to a normal direction in combination. Here, a polarizer on a viewing side in a liquid crystal display device can be used as the first polarizer.

SUMMARY OF THE INVENTION

However, the above-described viewing angle control method has a problem that the direction in which the viewing angle can be controlled is determined to a longitudinal direction or a lateral direction depending on the direction of the first polarizer having an absorption axis in the plane.

For example, in an in-vehicle application such as a car navigation system, reflection of light on the windshield can be prevented by disposing the absorption axis of the first polarizer having the absorption axis in the plane in the lateral direction so that the viewing angle in the longitudinal direction can be narrowed. In the description above, the longitudinal direction denotes the vertical direction, and the lateral direction denotes the horizontal direction orthogonal to the vertical direction.

Further, as described in JP4902516B, the center of the viewing angle is simply changed in the longitudinal direction only by inclining the absorption axis of the second polarizer in the longitudinal direction. In other words, visual recognition is unlikely to be made on any one side in the longitudinal direction and visual recognition is likely to be made on other sides.

Meanwhile, the aspect described in JP4902516B cannot satisfy the need to improve the visibility in a specific lateral direction (for example, the passenger seat). In other words, the aspect cannot satisfy the need to make visual recognition difficult on any side in the lateral direction and to make visual recognition easy on other sides.

Therefore, an object of the present invention is to provide a viewing angle control system and an image display device which are capable of controlling the viewing angle (for example, capable of preventing reflection on the windshield in a case of in-vehicle application) of a display screen in a longitudinal direction and improving the visibility in a specific lateral direction (for example, in a direction from the passenger seat in a case of in-vehicle application).

The present inventors found that the above-described problems can be solved by employing the following configurations.

(1) A viewing angle control system comprising: a polarizer; and a light absorption anisotropic layer, in which the polarizer has an in-plane absorption axis in a film, an angle $\theta$ between a transmittance central axis of the light absorption anisotropic layer and a normal line of the film is in a range of 0.1° to 45°, and an angle $\varphi$ between a direction in which the transmittance central axis of the light absorption anisotropic layer is orthographically projected onto the film surface and the absorption axis of the polarizer is 0° or greater and less than 85°, greater than 95° and less than 265°, or greater than 275° and 360° or less.

(2) The viewing angle control system according to (1), further comprising: a retardation layer provided between a polarizer layer and the light absorption anisotropic layer, in which an angle between a slow axis of the retardation layer and the absorption axis of the polarizer is in a range of 0° to 10°.

(3) The viewing angle control system according to (2), in which the retardation layer is a B-plate having an Nz coefficient of 1.5 or greater.

(4) The viewing angle control system according to (2) or (3), in which an in-plane retardation Re of the retardation layer at a wavelength of 550 nm is greater than 60 nm.

(5) An image display device comprising: the viewing angle control system according to any one of (1) to (4).

(6) The image display device according to (5), comprising: a liquid crystal cell; and the viewing angle control system, in which the viewing angle control system is disposed on the liquid crystal cell.

(7) The image display device according to (5), comprising: a self-light emitting type display device; and the viewing angle control system, in which the viewing angle control system is disposed on a viewing side of the self-light emitting type display device.

(8) The image display device according to any one of (5) to (7), in which a light absorption anisotropic layer is disposed on a viewing side with respect to a polarizer in the viewing angle control system.

According to the present invention, it is possible to provide a viewing angle control system and an image display device which are capable of controlling the viewing angle (for example, capable of preventing reflection on the windshield in a case of in-vehicle application) of a display screen in a longitudinal direction and improving the visibility in a specific lateral direction (for example, in a direction from the passenger seat in a case of in-vehicle application).

DESCRIPTION OF THE PREFERRED EMBODIMENTS

Figure 1:
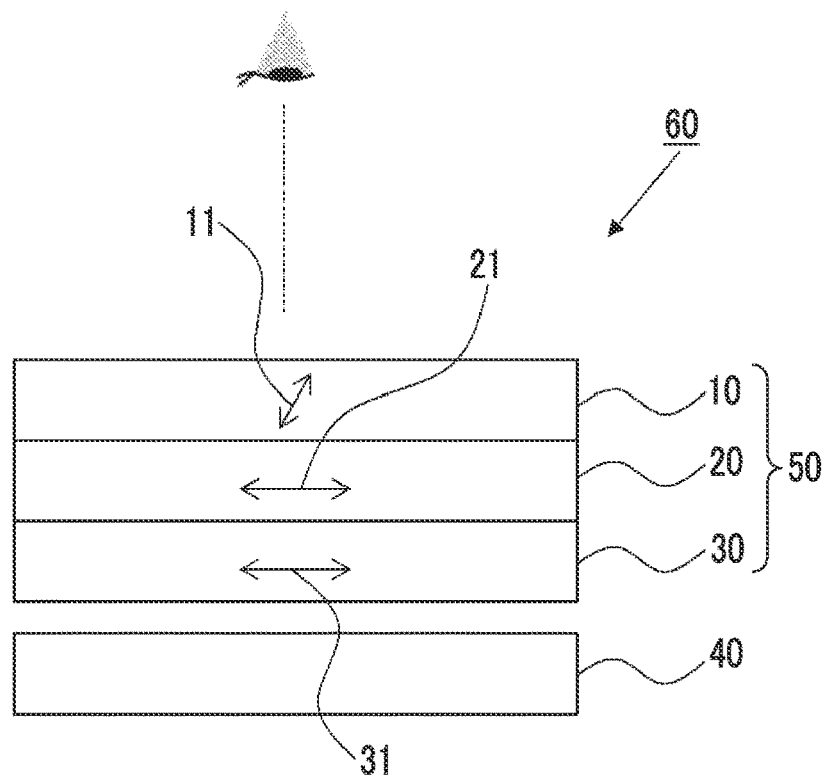
FIG. 1 is a schematic view illustrating a viewing angle control system and an image display device according to the present invention.

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit value and an upper limit value.

Further, in the present specification, the term parallel does not denote parallel in a strict sense, but denotes a range of parallel±5°.

Further, in the present specification, the term orthogonal does not denote orthogonal in a strict sense, but denotes a range of orthogonal±5°.

In the present specification, Re (λ) and Rth (λ) respectively represent an in-plane retardation at a wavelength λ and a retardation at a wavelength λ in a thickness direction, and refractive indices nx, ny, and nz are represented by Equation (1) and Equation (2) using a film thickness d (μm).

$$Re(\lambda)=(nx-ny)\times d\times 1000(nm) \quad \text{Equation (1):}$$

$$Rth(\lambda)=((nx+ny)/2-nz)\times d\times 1000(nm) \quad \text{Equation (2):}$$

The wavelength λ is set to 550 nm unless otherwise specified.

The slow axis azimuth, Re (λ), and Rth (λ) can be measured using, for example, AxoScan OPMF-1 (manufactured by Opto Science Inc.).

In the present specification, the Nz coefficient is defined by Equation (3).

$$Nz=(nx-nz)/(nx-ny) \quad \text{Equation (3):}$$

Further, the Nz coefficient can also be acquired by Equation (4) based on the definition of Re and Rth.

$$Nz=0.5+Rth/Re \quad \text{Equation (4):}$$

The Nz coefficient is set to a value at a wavelength of 550 nm unless otherwise specified.

In the present specification, the B-plate denotes a biaxial optical member in which the refractive indices nx, ny, and nz are values different from each other.

Further, in the present specification, the concepts of the liquid crystal composition and the liquid crystal compound also include those that no longer exhibit liquid crystallinity due to curing or the like.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Substituent S]

A substituent S used in the present specification represents any of the following groups.

Examples of the substituent S include a halogen atom, an alkyl group having 1 to 20 carbon atoms, a halogenated alkyl group having 1 to 20 carbon atoms, a cycloalkyl group having 1 to 20 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an alkylamino group having 1 to 10 carbon atoms, an alkylaminocarbonyl group, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), or a sulfate group (—OSO$_3$H), and other known substituents.

The details of the substituent are described in paragraph [0023] of JP2007-234651A.

Further, the substituent S may be a group represented by Formula (W1).

In Formula (W1), LW represents a single bond or a divalent linking group, SPW represents a divalent spacer group, Q represents Q1 or Q2 in Formula (LC) described below, and * represents a bonding position.

Examples of the divalent linking group represented by LW include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C (Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O) O—, —O—C(O)—C(Z)=C(Z')—, —C(Z)=N—, —N=C (Z)—, —C(Z)=C(Z')—C(O)N(Z")—, —N(Z")—C(O)—C (Z)=C(Z')—, —C(Z)=C(Z')—C(O)—S—, —S—C(O)— C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —N=N—, —S—, —S(O)—, —S(O)(O)—, —(O)S(O)O—, —O(O)S (O)O—, —SC(O)—, and —C(O)S—. LW may represent a group in which two or more of these groups are combined (hereinafter, also referred to as "L-C").

Examples of the divalent spacer group represented by SPW include a linear, branched, or cyclic alkylene group having 1 to 50 carbon atoms, and a heterocyclic group having 1 to 20 carbon atoms.

The carbon atoms of the alkylene group and the heterocyclic group may be substituted with —O—, —Si(CH$_3$)$_2$—, —(Si(CH$_3$)$_{20}$)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N (Z)—, —C(Z)=C(Z')—C(O)O—, —O—C(O)—C(Z)=C (Z')—, —C(Z)=N—, —N=C(Z)—, —C(Z)=C(Z')—C (O)N(Z")—, —N(Z")—C(O)—C(Z)=C(Z')—, —C(Z)=C (Z')—C(O)—S—, —S—C(O)—C(Z)=C(Z')—, —C(Z) =N—N=C(Z')— (here, Z, Z', and Z" each independently represent a hydrogen atom, an alkyl group having 1 to 4 carbon atoms, a cycloalkyl group, an aryl group, a cyano group, or a halogen atom), —N=N—, —S—, —C(S)—, —S(O)—, —SO$_2$—, —(O)S(O)O—, —O(O)S(O)O—, —SC(O)—, —C(O)S—, or a group obtained by combining two or more of these groups (hereinafter, also referred to as "SP—C").

Further, the hydrogen atom of the alkylene group and the hydrogen atom of the heterocyclic group may be substituted with a halogen atom, a cyano group, —Z$^H$, —OH—, —OZ$^H$, —COOH, —C(O)Z$^H$, —C(O)OZ$^H$, —OC(O)Z$^H$, —OC(O)OZ$^H$, —NZ$^H$Z$^{Hh}$, —NZ$^H$C(O)Z$^H$, —NZ$^H$C(O) OZ$^{Hh}$, —C(O)NZ$^H$Z$^{Hh}$, —OC(O)NZ$^H$Z$^{Hh}$, —NZ$^H$C(O) NZ$^{Hh}$OZ$^{Hh'}$, —SH, —SZ$^H$, —C(S)Z$^H$, —C(O)SZ$^H$, or —SC (O)Z$^H$ (hereinafter, also referred to as "SP—H"). Here, Z$^H$ and Z$^{Hh}$ represent an alkyl group having 1 to 10 carbon atoms, a halogenated alkyl group, or -L-CL (L represents a single bond or a divalent linking group, specific examples of the divalent linking group are the same as those for LW and SPW described above, CL represents a crosslinkable group, and examples thereof include a group represented by Q1 or Q2 in Formula (LC), and among these, a crosslinkable group represented by any of Formulae (P-1) to (P-30) is preferable).

As illustrated in FIG. 1, an example of an image display device 60 according to the embodiment of the present invention includes a light absorption anisotropic layer 10, a retardation layer 20, a polarizer 30, and a display panel 40 in this order from a viewing side. The light absorption anisotropic layer 10, the retardation layer 20, and the polarizer 30 constitute a viewing angle control system 50. The light absorption anisotropic layer 10, the retardation layer 20, and the polarizer 30 may be disposed on a non-viewing side of a display panel 40. The polarizer 30 has an in-plane absorption axis 31 in a film (in-plane direction of the film). That is, the direction of the absorption axis 31 of the polarizer 30 is parallel to the in-plane direction.

Figure 11:
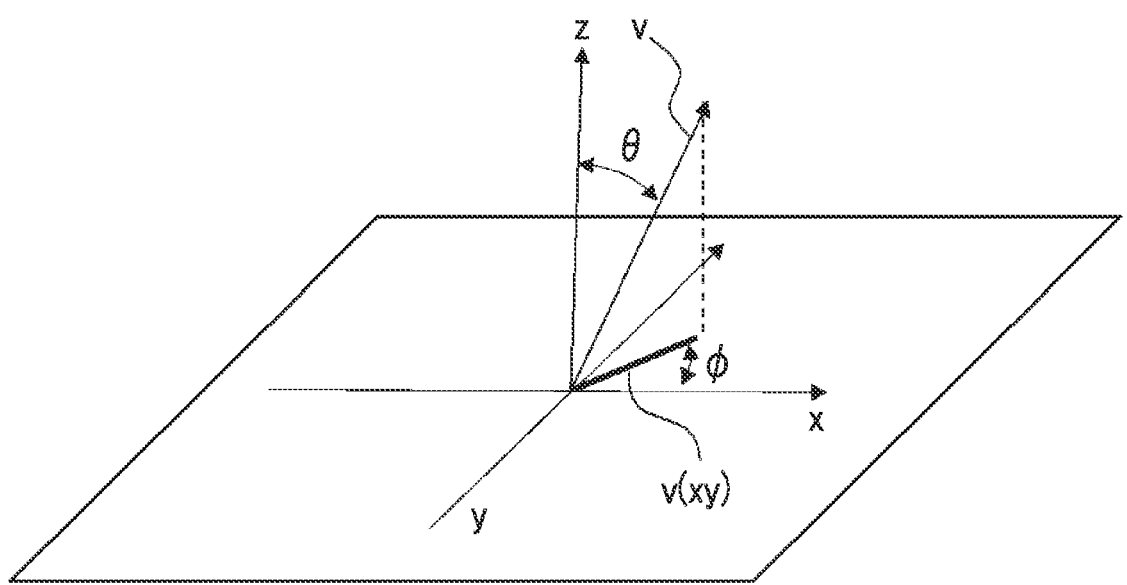
FIG. 11 is a schematic view for describing a direction in which a transmittance central axis of a light absorption anisotropic layer is orthographically projected onto a film surface.

FIG. 11 illustrates a schematic view for describing a direction in which the transmittance central axis of the light absorption anisotropic layer is orthographically projected onto the film surface. As illustrated in FIG. 11, the direction in which a transmittance central axis v of the light absorption anisotropic layer is orthographically projected onto the film surface (the surface of the optically anisotropic layer) is defined as v (xy).

Figure 2:
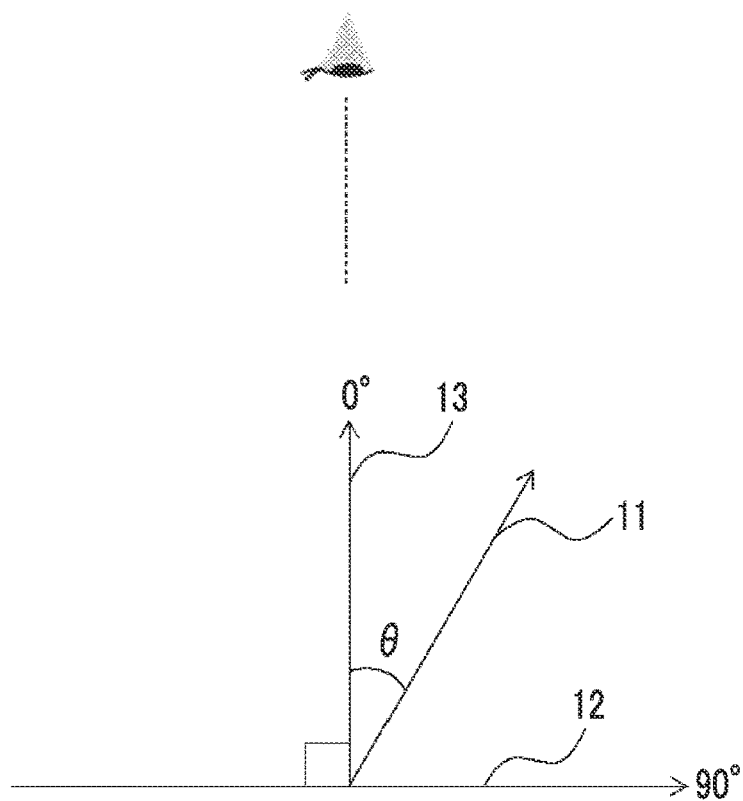
FIG. 2 is a schematic view illustrating the definition of an angle $\theta$ between a transmittance central axis of a light absorption anisotropic layer and a normal line of a film of the viewing angle control system according to the present invention.

As illustrated in FIG. 2, an angle between a film normal direction (normal direction of the light absorption anisotropic layer) 13 and a transmittance central axis 11 of the light absorption anisotropic layer is defined as an angle θ. Further, the angle θ is described as an angle between the transmittance central axis v and the film normal direction (z-axis direction) even in FIG. 11.

Figure 3:
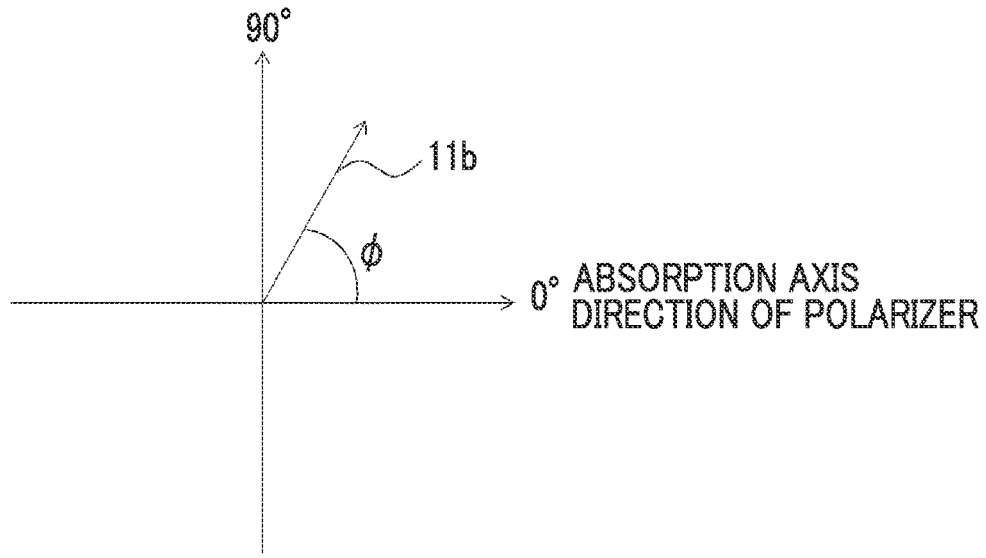
FIG. 3 is a schematic view illustrating the definition of an angle φ between a line (direction) in which a transmittance central axis of the absorption anisotropic layer of the viewing angle control system of the present invention is orthographically projected onto a film surface and an absorption axis of a polarizer.

FIG. 3 illustrates the axial disposition of FIG. 2 as viewed from the film normal direction 13. An angle between the absorption axis direction of the polarizer and a direction (line) 11b in which a transmittance central axis 11 of the light absorption anisotropic layer is orthographically projected onto the film surface is defined as an angle φ. Further, the angle φ is described as an angle between a direction v (xy) in which the transmittance central axis is orthographically projected and the absorption axis direction of the polarizer (corresponding to the x-axis direction in FIG. 11) even in FIG. 11.

Further, the angle φ is represented by a positive angle value in the counterclockwise direction and a negative angle value in a clockwise direction with reference to the absorption axis of the polarizer in a case where the viewing angle control system is observed from the light absorption anisotropic layer side.

In the present invention, the direction of the absorption axis of the polarizer may be referred to as a longitudinal direction or a lateral direction, but typically in a state where an image display device is used, the direction of a side of the image display device which is close to the vertical direction is referred to as the longitudinal direction and the direction of a side of the image display device which is close to the horizontal direction is referred to as the lateral direction.

<Light Absorption Anisotropic Layer>

The light absorption anisotropic layer used in the present invention is not particularly limited except that the angle between the transmittance central axis and the film normal line (normal direction with respect to the surface of the light absorption anisotropic layer) is in a range of 0.1° to 45° and that the angle φ between the direction in which the transmittance central axis is orthographically projected onto the film surface and the absorption axis of the polarizer is 0° or greater and less than 85°, greater than 95° and less than 265°, or greater than 275° and 360° or less.

Here, the transmittance central axis denotes a direction in which the highest transmittance is shown in a case where the transmittance is measured by changing the inclination angle and the inclination direction with respect to the film normal direction. More specifically, the transmittance of P polarized light having a wavelength of 550 nm which is incident on the light absorption anisotropic layer is measured using AxoScan OPMF-1 (manufactured by Opto Science Inc.). More specifically, in the measurement, the transmittance of the light absorption anisotropic layer is measured by first investigating the azimuthal angle at which the transmittance central axis is inclined and allowing P polarized light having a wavelength of 550 nm to be incident while the polar angle which is the angle of the surface of the light absorption anisotropic layer in the normal direction is changed from 0° to 60° for every 5° in the plane (the plane that has the transmittance central axis and is orthogonal to the layer surface) having the normal direction of the light absorption anisotropic layer along the azimuthal angle thereof. As a result, the direction at which the highest transmittance is exhibited is defined as the transmittance central axis.

The center of the viewing angle of the image display device can be deviated not only in the longitudinal direction but also in the lateral direction from the front by adjusting the angle θ between the transmittance central axis of the light absorption anisotropic layer 10 and the normal line of the film and the angle φ between the direction in which the transmittance central axis is orthographically projected onto the film surface and the absorption axis of the polarizer.

The angle θ between the transmittance central axis and the normal line of the film is preferably in a range of 2° to 25°.

In the image display device according to the embodiment of the present invention, the transmittance central axis of the light absorption anisotropic layer is inclined with respect to the normal line of the film surface, and the angle φ between the direction in which the transmittance central axis of the light absorption anisotropic layer is orthographically projected onto the film surface and the absorption axis of the polarizer is preferably in a range of 30° to 60°, 120° to 150°, 210° to 240°, or 300° to 330°. As the angle is closer to 45°, 135°, 225°, or 315°, both reduction of the brightness of the image display device in a specific direction and improvement of the brightness in another specific direction can be achieved at the same time.

For example, in an image display device for in-vehicle application, the brightness of the display on the passenger seat side is improved while the driver's view is ensured by reducing the reflection of an image on the windshield, and thus the visibility can be improved.

In order to control the transmittance central axis of the light absorption anisotropic layer, an aspect of aligning a dichroic substance having absorption in a visible region is preferable, and an aspect of aligning an organic dichroic substance using alignment of a liquid crystal compound is more preferable.

Examples of such an aspect include a light absorption anisotropic layer in which at least one kind of organic dichroic substance is obliquely aligned with respect to the film normal direction (the normal direction with respect to the surface of the light absorption anisotropic layer).

Examples of a technique of desirably aligning the organic dichroic substance include a technique of preparing a polarizer formed of an organic dichroic substance and a technique of preparing a guest-host liquid crystal cell. For example, the technique used in the method of preparing a dichroic polarizer described in JP1999-305036A (JP-H11-305036A) or JP2002-090526A and the technique used in the method of preparing a guest-host type liquid crystal display device described in JP2002-099388A or JP2016-027387A can also be used for preparation of the light absorption anisotropic layer used in the present invention.

For example, molecules of the organic dichroic substance can be desirably aligned as described above in association with the alignment of host liquid crystals using the technique of the guest-host type liquid crystal cell. Specifically, the light absorption anisotropic layer used in the present invention can be prepared by mixing an organic dichroic substance serving as a guest and a rod-like liquid crystal compound serving as a host liquid crystal, aligning the host liquid crystal, aligning molecules of the organic dichroic substance along the alignment of the liquid crystal molecules, and fixing the alignment state.

It is preferable that the alignment of the organic dichroic substance is fixed by forming a chemical bond in order to prevent fluctuation of the light absorption characteristics of the light absorption anisotropic layer used in the present invention depending on the use environment. For example, the alignment can be fixed by advancing polymerization of the host liquid crystal, the organic dichroic substance, or a polymerizable component added as desired.

Further, the guest-host type liquid crystal cell having a liquid crystal layer that contains at least an organic dichroic substance and a host liquid crystal on a pair of substrates may be used as the light absorption anisotropic layer used in the present invention. The alignment of the host liquid crystal (the alignment of the organic dichroic substance in association with the alignment of the host liquid crystal) is made such that the alignment state thereof is maintained as long as the alignment can be controlled by the alignment layer formed on the inner surface of the substrate and an external stimulus such as an electric field is not applied, and the light absorption characteristics of the light absorption anisotropic layer used in the present invention can be set to be constant.

Further, a polymer film that satisfies the light absorption characteristics required for the light absorption anisotropic layer used in the present invention can be prepared by allowing the organic dichroic substance to permeate into the polymer film and aligning the organic dichroic substance along the alignment of the polymer molecules in the polymer film.

Specifically, a light absorption anisotropic layer can be prepared by coating the surface of the polymer film with a solution of the organic dichroic substance and allowing the organic dichroic substance to permeate into the film. The alignment of the organic dichroic substance can be adjusted by the alignment of a polymer chain in the polymer film, the properties thereof (chemical and physical properties of the polymer chain, a functional group of the polymer chain, and the like), the coating method, and the like. The details of this method are described in JP2002-090526A.

In the light absorption anisotropic layer used in the present invention, the transmittance at a wavelength of 550 nm in the direction inclined by 30° from the transmittance central axis is preferably 60% or less, more preferably 50% or less, and still more preferably 45% or less. The lower limit thereof is not particularly limited, but is 20% or greater in many cases.

In this manner, the contrast of the illuminance between the direction of the transmittance central axis and the direction deviated from the transmittance central axis can be increased, and thus the viewing angle can be sufficiently narrowed.

In the light absorption anisotropic layer used in the present invention, the transmittance at a wavelength of 550 nm in the direction of the transmittance central axis is preferably 65% or greater, more preferably 75% or greater, and still more preferably 85% or greater. The lower limit thereof is not particularly limited, but is 95% or less in many cases.

In this manner, the illuminance at the center of the viewing angle of the image display device can be increased to enhance the visibility.

(Liquid Crystal Compound)

It is preferable that the light absorption anisotropic layer used in the present invention contains a liquid crystal compound. In a case where the light absorption anisotropic layers contain a liquid crystal compound, the dichroic substances can be aligned with a high alignment degree while the precipitation of the dichroic substances is suppressed.

As the liquid crystal compound, any of a low-molecular-weight liquid crystal compound or a polymer liquid crystal compound can be used, but it is preferable to use a polymer liquid crystal compound from the viewpoint of obtaining a high alignment degree. It is also preferable to use both a low-molecular-weight liquid crystal compound and a polymer liquid crystal compound in combination. Here, "low-molecular-weight liquid crystal compound" denotes a liquid crystal compound having no repeating units in the chemical structure. Here, "polymer liquid crystal compound" is a liquid crystal compound having a repeating unit in the chemical structure.

Examples of the low-molecular-weight liquid crystal compound include liquid crystal compounds described in JP2013-228706A. A low-molecular-weight liquid crystal compound exhibiting smectic properties is preferable from the viewpoint of enhancing the aligning properties.

Typically, the low-molecular-weight liquid crystal compound can be classified into a rod type compound and a disk type compound depending on the shape thereof.

A liquid crystal compound that does not exhibit dichroic properties in a visible region is preferable as the rod-like liquid crystal compound.

The low-molecular-weight liquid crystal compound may be used alone or in combination of two or more kinds thereof.

A liquid crystal compound represented by Formula (LC) is preferable as the rod-like liquid crystal compound. The liquid crystal compound represented by Formula (LC) is a compound exhibiting liquid crystallinity. The liquid crystallinity may be a nematic phase or a smectic phase, and may exhibit both a nematic phase and a smectic phase and preferably at least a nematic phase.

The smectic phase may be a higher-order smectic phase. The higher-order smectic phase here denotes a smectic B phase, a smectic D phase, a smectic E phase, a smectic F phase, a smectic G phase, a smectic H phase, a smectic I phase, a smectic J phase, a smectic K phase, or a smectic L phase. Among these, a smectic B phase, a smectic F phase, or a smectic I phase is preferable.

In a case where the smectic liquid crystal phase exhibited by the liquid crystal compound is any of these higher-order smectic liquid crystal phases, a light absorption anisotropic layer with a higher alignment degree order can be prepared. Further, the light absorption anisotropic layer prepared from such a higher-order smectic liquid crystal phase with a high alignment degree order is a layer in which a Bragg peak derived from a higher-order structure such as a hexatic phase or a crystal phase in X-ray diffraction measurement is obtained. The Bragg peak denotes a peak derived from the surface periodic structure of molecular alignment, and a light absorption anisotropic layer having a periodic interval of 3.0 to 5.0 Å can be obtained.

$$Q1—S1—MG—S2—Q2 \quad (LC)$$

In Formula (LC), Q1 and Q2 each independently represent a hydrogen atom, a halogen atom, a linear, branched, or cyclic alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), or a crosslinkable group represented by any of Formulae (P-1) to (P-30), and it is preferable that at least one of Q1 or Q2 represents a crosslinkable group represented by any of the following formulae.

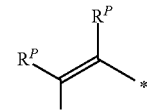

(P-1)

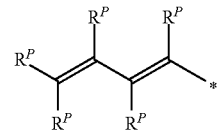

(P-2)

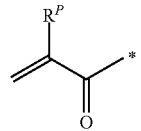

(P-3)

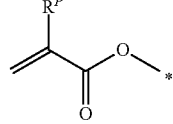

(P-4)

-continued
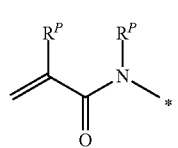 (P-5)
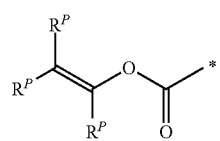 (P-6)
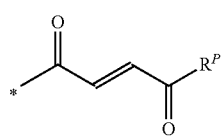 (P-7)
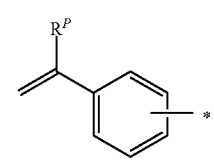 (P-8)
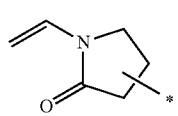 (P-9)
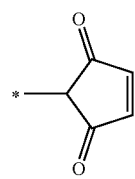 (P-10)
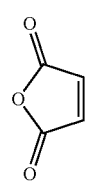 (P-11)
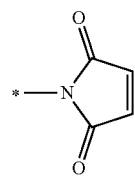 (P-12)
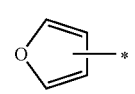 (P-13)
 (P-14)
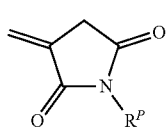 (P-15)
-continued
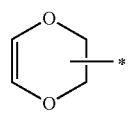 (P-16)
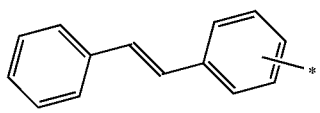 (P-17)
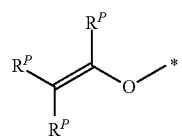 (P-18)
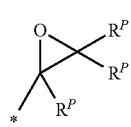 (P-19)
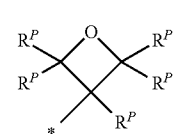 (P-20)
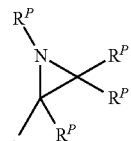 (P-21)
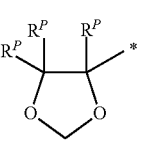 (P-22)
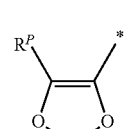 (P-23)
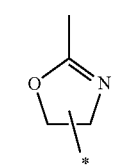 (P-24)
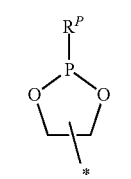 (P-25)

(P-26)
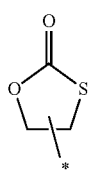

(P-27)
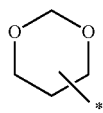

(P-28)
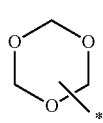

(P-29)
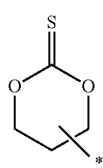

(P-30)
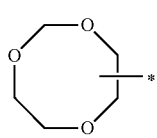

In Formulae (P-1) to (P-30), RP represents a hydrogen atom, a halogen atom, a linear, branched, or cyclic alkylene group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), or a sulfate group (—OSO$_3$H), and a plurality of RP's may be the same as or different from each other.

Examples of preferable aspects of the crosslinkable group include a radically polymerizable group and a cationically polymerizable group. As the radically polymerizable group, a vinyl group represented by Formula (P-1), a butadiene group represented by Formula (P-2), a (meth)acryl group represented by Formula (P-4), a (meth)acrylamide group represented by Formula (P-5), a vinyl acetate group represented by Formula (P-6), a fumaric acid ester group represented by Formula (P-7), a styryl group represented by Formula (P-8), a vinylpyrrolidone group represented by Formula (P-9), a maleic acid anhydride represented by Formula (P-11), or a maleimide group represented by Formula (P-12) is preferable. As the cationically polymerizable group, a vinyl ether group represented by Formula (P-18), an epoxy group represented by Formula (P-19), or an oxetanyl group represented by Formula (P-20) is preferable.

In Formula (LC), S1 and S2 each independently represent a divalent spacer group, and suitable aspects of S1 and S2 include the same structures as those for SPW in Formula (W1), and thus the description thereof will not be repeated.

In Formula (LC), MG represents a mesogen group described below. The mesogen group represented by MG is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

The mesogen group represented by MG has preferably 2 to 10 cyclic structures and more preferably 3 to 7 cyclic structures.

Specific examples of the cyclic structure include an aromatic hydrocarbon group, a heterocyclic group, and an alicyclic group.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group represented by MG, a group represented by Formula (MG-A) or Formula (MG-B) is preferable, and a group represented by Formula (MG-B) is more preferable.

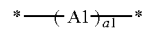
(MG-A)

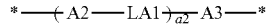
(MG-B)

In Formula (MG-A), A1 represents a divalent group selected from the group consisting of an aromatic hydrocarbon group, a heterocyclic group, and an alicyclic group. These groups may be substituted with a substituent such as the substituent S.

It is preferable that the divalent group represented by A1 is a 4- to 15-membered ring. Further, the divalent group represented by A1 may be a monocycle or a fused ring.

Further, * represents a bonding position with respect to S1 or S2.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, a thienooxazole-diyl group, and the following structures (II-1) to (II-4).

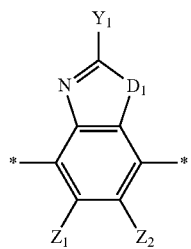

(II-1)

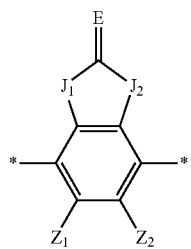

(II-2)

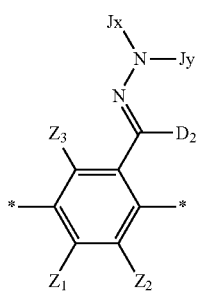

(II-3)

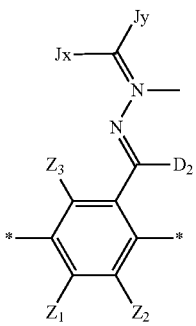

(II-4)

In Formulae (II-1) to (II-4), $D_1$ represents —S—, —O—, or $NR^{11}$—, $R^{11}$ represents a hydrogen atom or an alkyl group having 1 to 6 carbon atoms, $Y_1$ represents an aromatic hydrocarbon group having 6 to 12 carbon atoms or an aromatic heterocyclic group having 3 to 12 carbon atoms, $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, $-NR^{12}R^{13}$, or $-SR^{12}$, $Z_1$ and $Z_2$ may be bonded to each other to form an aromatic ring or an aromatic heterocyclic ring, $R^{12}$ and $R^{13}$ each independently represent a hydrogen atom or an alkyl group having 1 to 6 carbon atoms, $J_1$ and $J_2$ each independently represent a group selected from the group consisting of —O—, $-NR^{21}$— ($R^{21}$ represents a hydrogen atom or a substituent), —S—, and C(O)—, E represents a hydrogen atom or a non-metal atom of a Group 14 to a Group 16 to which a substituent may be bonded, Jx represents an organic group having 2 to 30 carbon atoms, which has at least one aromatic ring selected from the group consisting of an aromatic hydrocarbon ring and an aromatic heterocyclic ring, Jy represents a hydrogen atom, an alkyl group having 1 to 6 carbon atoms which may have a substituent, or an organic group having 2 to 30 carbon atoms which has at least one aromatic ring selected from the group consisting of an aromatic hydrocarbon ring and an aromatic heterocyclic ring, the aromatic ring of Jx and Jy may have a substituent, Jx and Jy may be bonded to each other to form a ring, and $D_2$ represents a hydrogen atom or an alkyl group having 1 to 6 carbon atoms which may have a substituent.

In Formula (II-2), in a case where $Y_1$ represents an aromatic hydrocarbon group having 6 to 12 carbon atoms, the aromatic hydrocarbon group may be monocyclic or polycyclic. In a case where $Y_1$ represents an aromatic heterocyclic group having 3 to 12 carbon atoms, the aromatic heterocyclic group may be monocyclic or polycyclic.

In Formula (II-2), in a case where $J_1$ and $J_2$ represent $-NR^{21}$—, the substituent as $R^{21}$ can refer to, for example, the description in paragraphs [0035] to [0045] of JP2008-107767A, and the content thereof is incorporated in the present specification.

In Formula (II-2), in a case where E represents a non-metal atom of a Group 14 to a Group 16 to which a substituent may be bonded, =O, =S, =NR', or =C(R')R' is preferable. R' represents a substituent, and the substituent can refer to, for example, the description in paragraphs [0035] to [0045] of JP2008-107767A, and $-NZ^{41}Z^{42}$ ($Z^{41}$ and $Z^{42}$ each independently represent a hydrogen atom, an alkyl group, or an aryl group) is preferable.

Specific examples of the divalent alicyclic group represented by A1 include a cyclopentylene group and a cyclohexylene group, and the carbon atoms thereof may be substituted with —O—, —Si(CH$_3$)$_2$—, —N(Z)— (Z represents a hydrogen atom, an alkyl group having 1 to 4 carbon atoms, a cycloalkyl group, an aryl group, a cyano group, or a halogen atom), —C(O)—, —S—, —C(S)—, —S(O)—, —SO$_2$—, or a group obtained by combining two or more of these groups.

In Formula (MG-A), a1 represents an integer of 2 to 10. The plurality of A1's may be the same as or different from each other.

In Formula (MG-B), A2 and A3 each independently represent a divalent group selected from the group consisting of an aromatic hydrocarbon group, a heterocyclic group, and an alicyclic group. Specific examples and suitable aspects of A2 and A3 are the same as those for A1 in Formula (MG-A), and thus description thereof will not be repeated.

In Formula (MG-B), a2 represents an integer of 1 to 10, a plurality of A2's may be the same as or different from each other, and a plurality of LA1's may be the same as or different from each other. From the viewpoint that the effects of the present invention are more excellent, it is preferable that a2 represents 2 or greater.

In Formula (MG-B), LA1 represents a single bond or a divalent linking group. Here, LA1 represents a divalent linking group in a case where a2 represents 1, and at least one of the plurality of LA1's represents a divalent linking group in a case where a2 represents 2 or greater.

In Formula (MG-B), examples of the divalent linking group represented by LA1 are the same as those for LW, and thus the description thereof will not be repeated.

Specific examples of MG include the following structures, the hydrogen atoms on the aromatic hydrocarbon group, the heterocyclic group, and the alicyclic group in the following structures may be substituted with the substituent S described above.

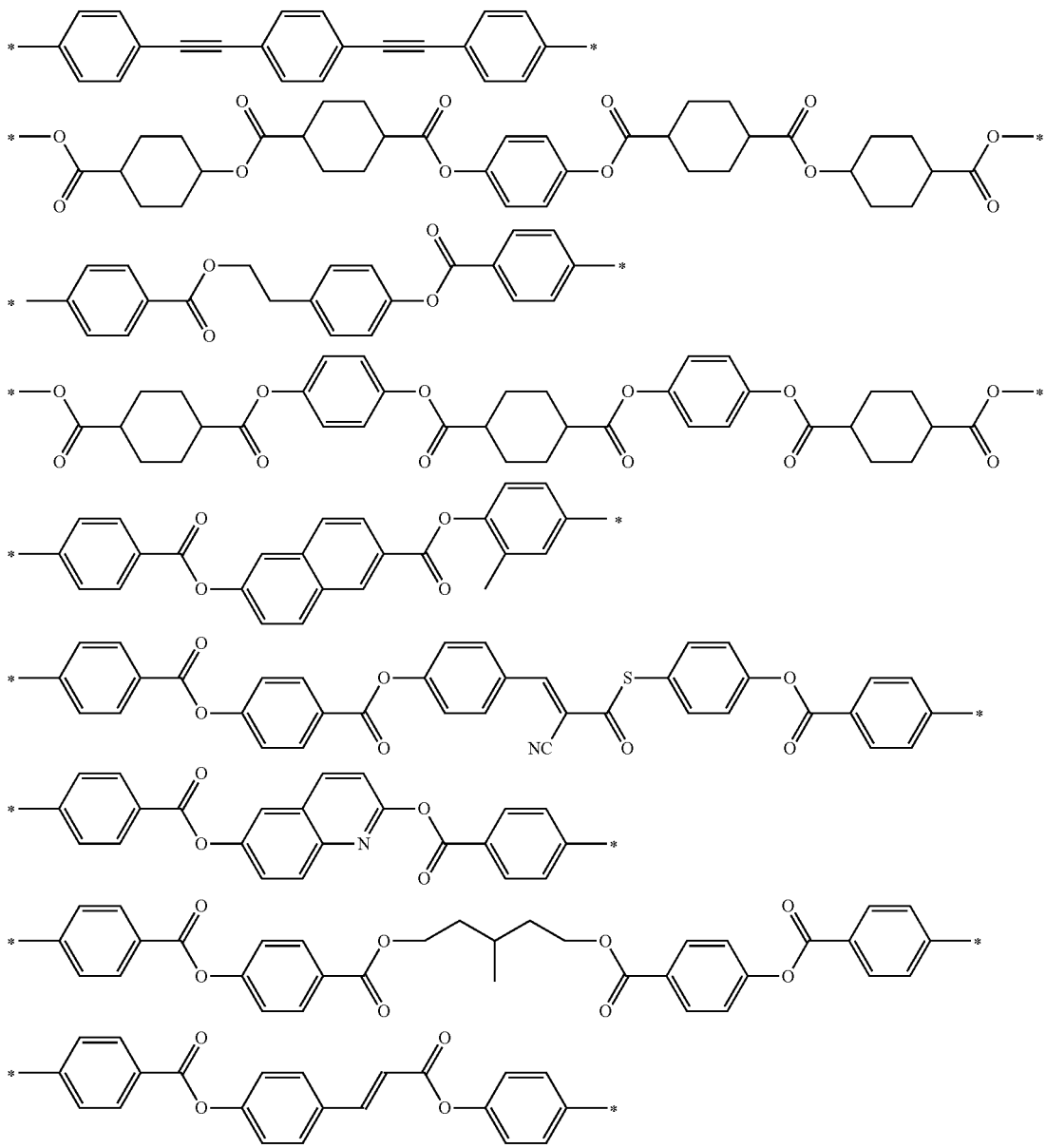

-continued
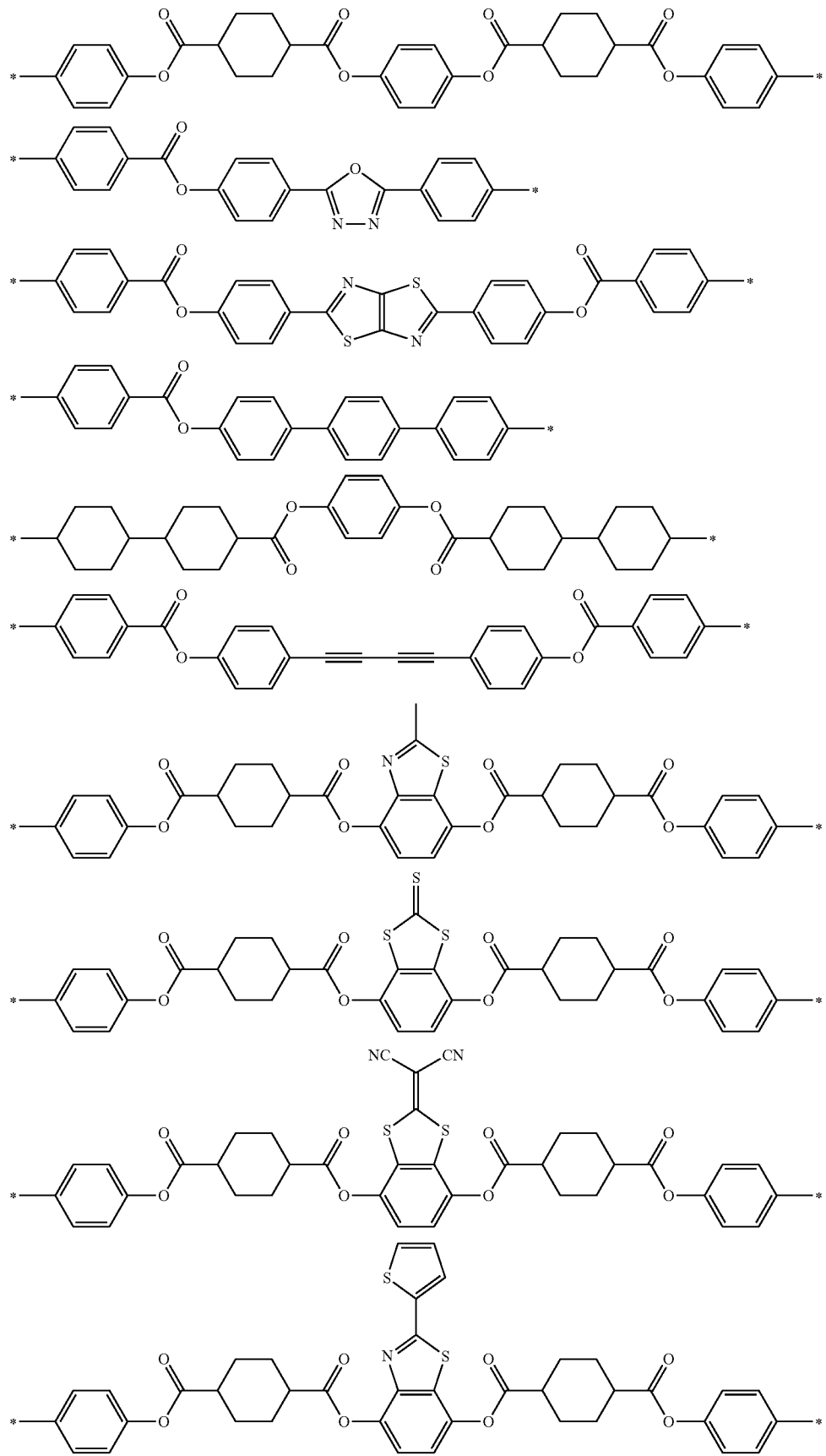

-continued
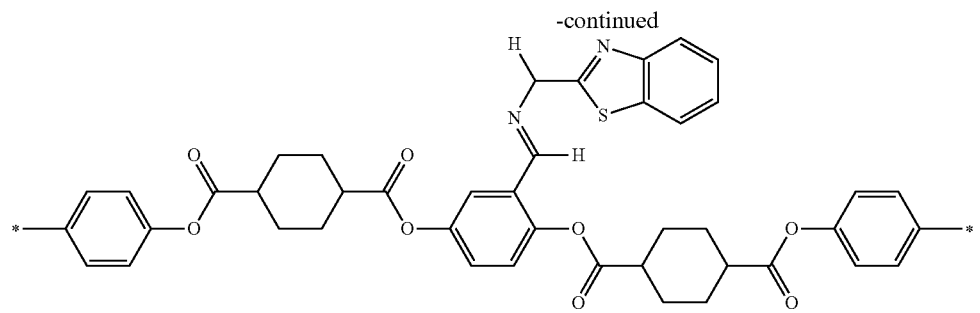
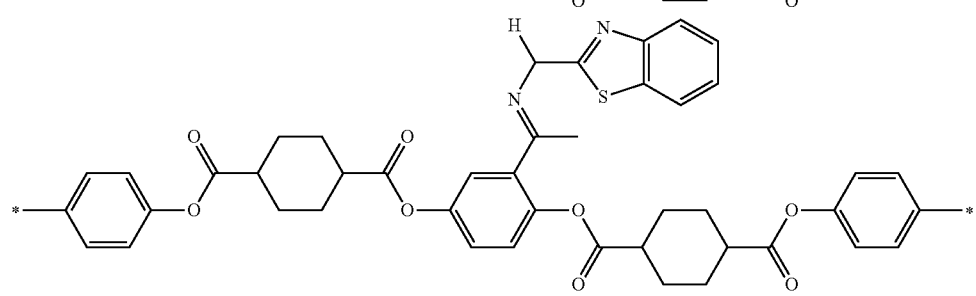
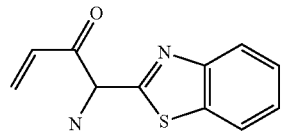
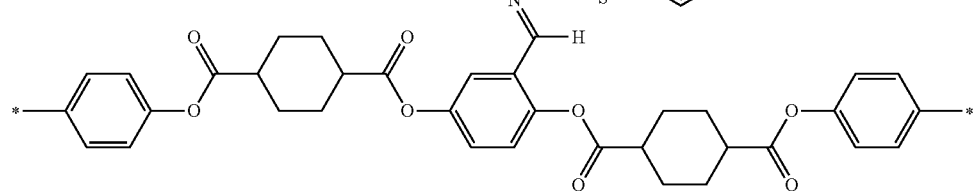
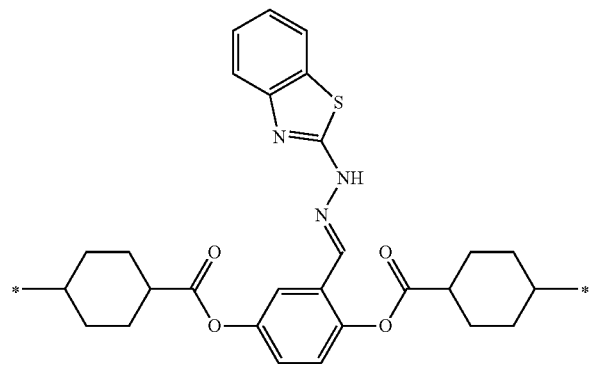
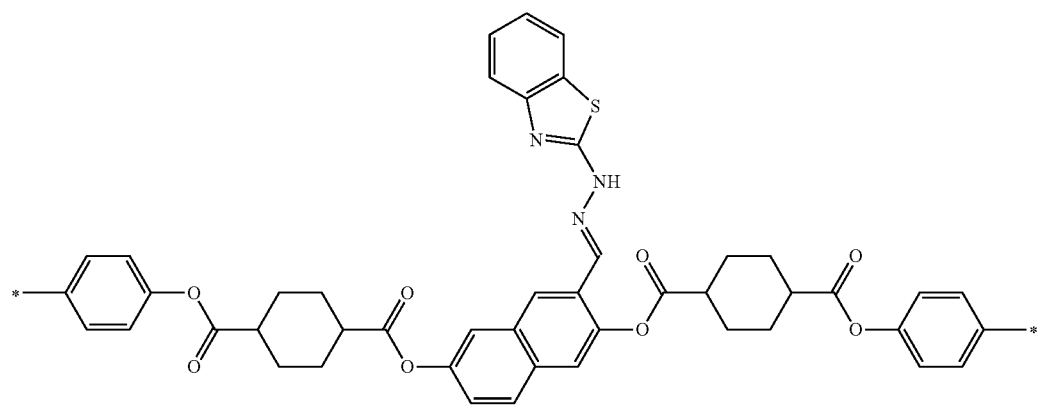

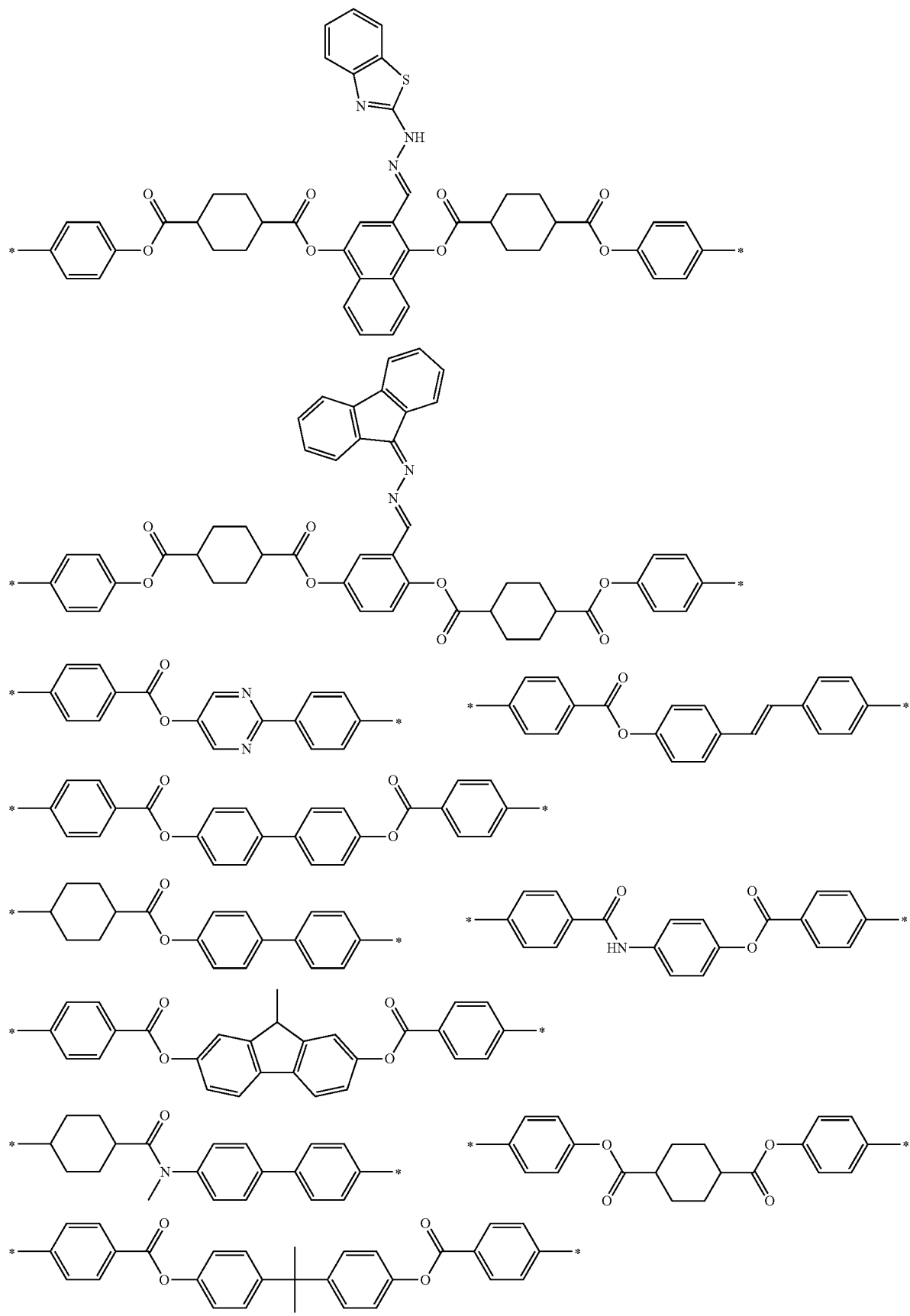

-continued
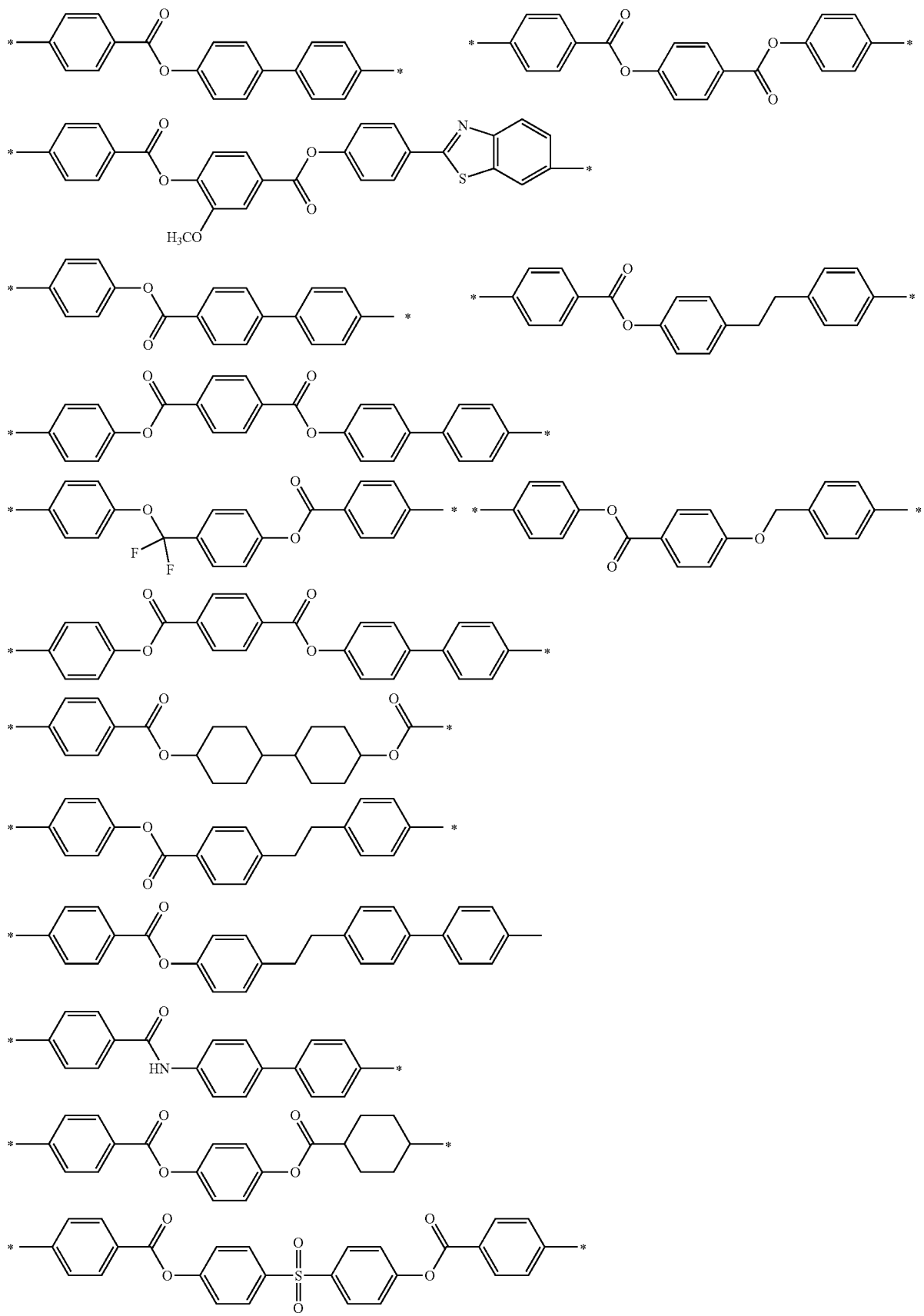

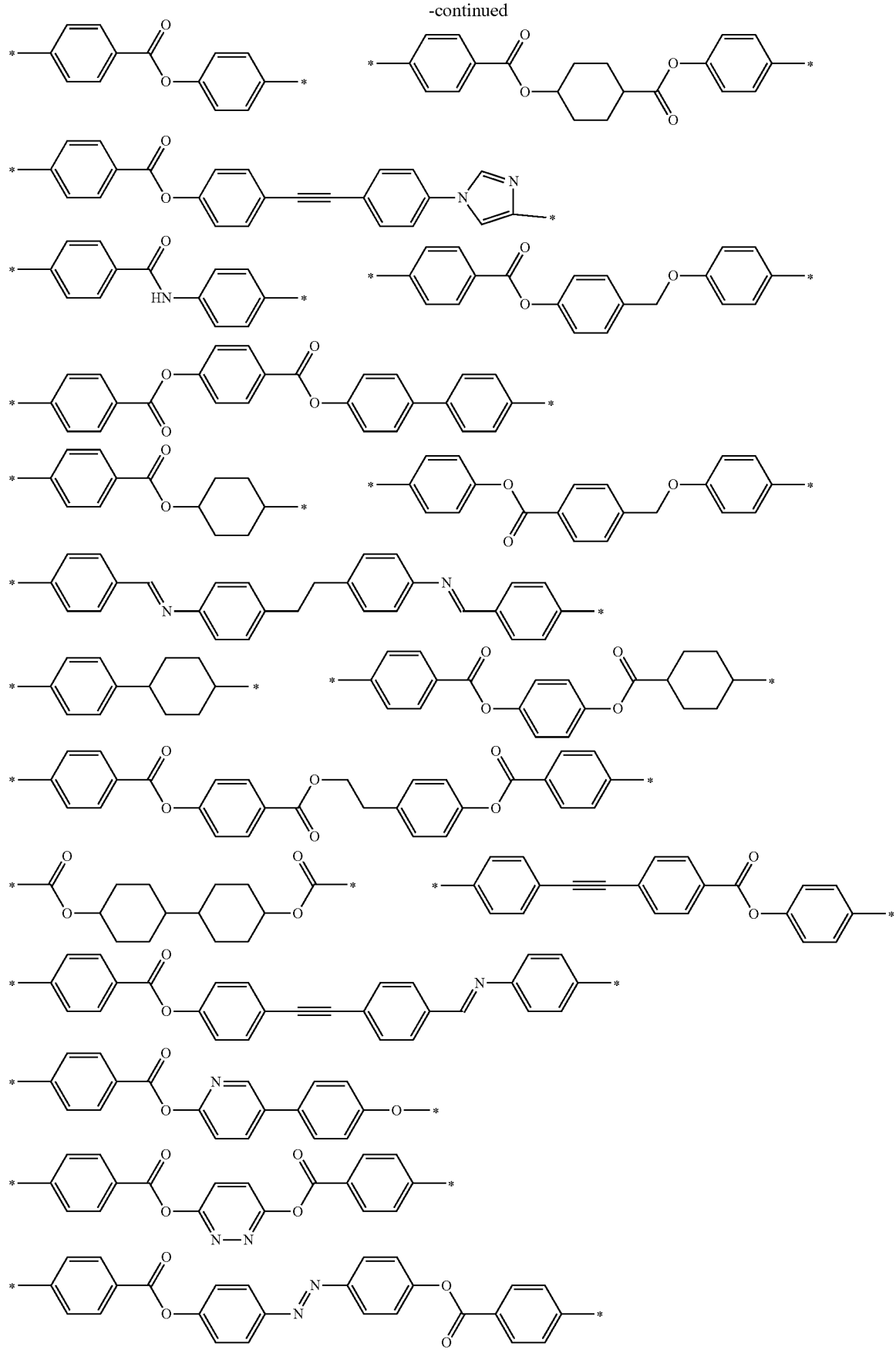

-continued
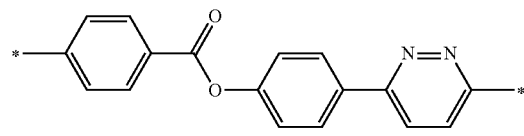
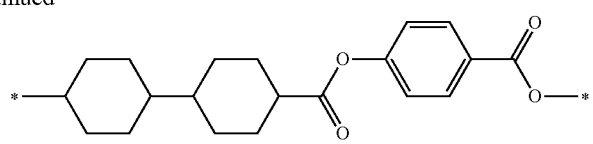
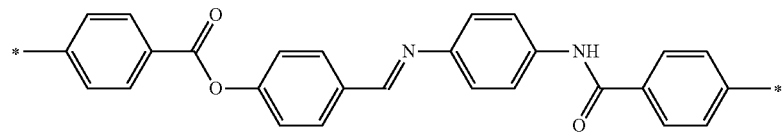
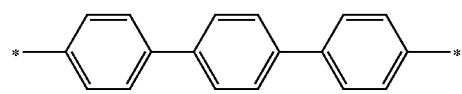
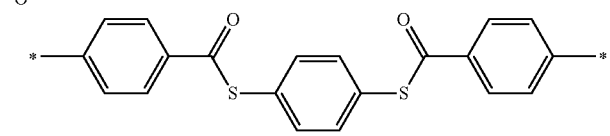
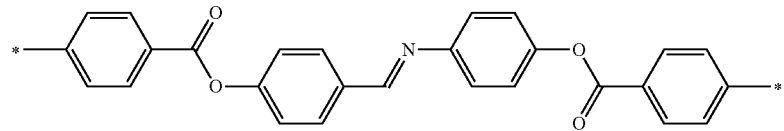
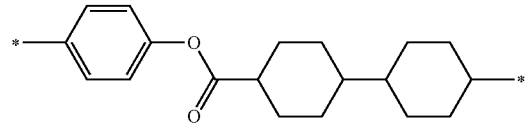
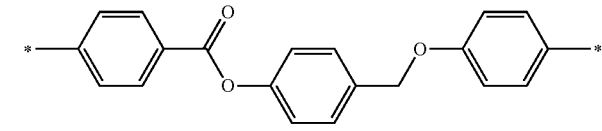
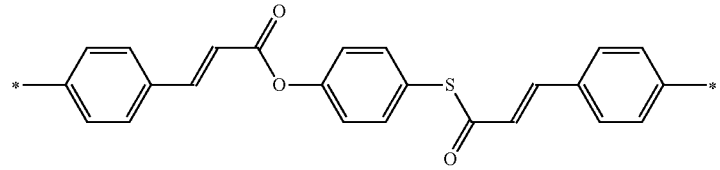
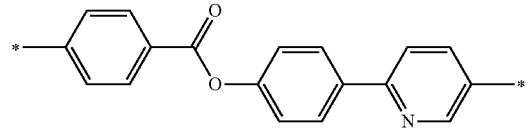
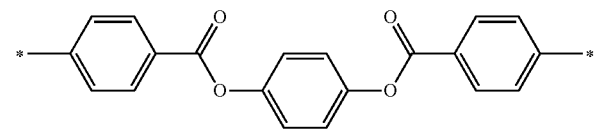
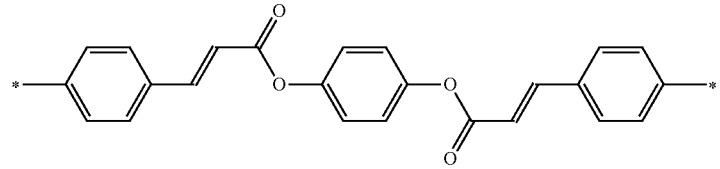
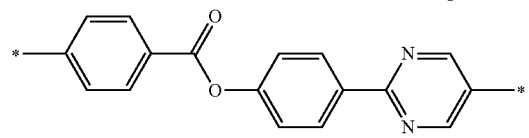
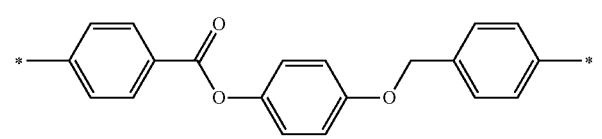
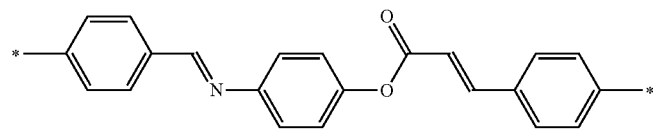
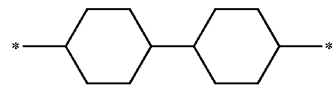
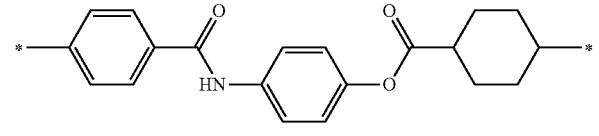
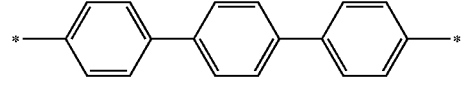

Examples of preferable aspects of the cyclic structure of the mesogen group MG include a cyclohexylene group, a cyclopentylene group, a phenylene group, a naphthylene group, a fluorene-diyl group, a pyridine-diyl group, a pyridazine-diyl group, a thiophene-diyl group, an oxazole-diyl group, a thiazole-diyl group, and a thienothiophene-diyl group, and the number of cyclic structures is preferably in a range of 2 to 10 and more preferably in a range of 3 to 7.

Examples of preferable aspects of the substituent S having a mesogen structure include a halogen atom, a halogenated alkyl group, a cyano group, a hydroxy group, a nitro group, a carboxy group, an alkoxy group having 1 to 10 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an amino group, an alkylamino group having 1 to 10 carbon atoms, an alkylaminocarbonyl group, and a group in which LW in the Formula (W1) represents a single bond, SPW represents a divalent spacer group, and Q represents a crosslinkable group represented by any of Formulae (P-1) to (P-30), and preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group.

Since the preferable aspects of the divalent spacer groups S1 and S2 are the same as those of the SPW, the description thereof will not be repeated.

In a case where a low-molecular-weight liquid crystal compound exhibiting smectic properties is used, the number of carbon atoms of the spacer group (the number of atoms in a case where the carbon atoms are substituted "SP—C") is preferably 6 or more and more preferably 8 or more.

A plurality of low-molecular-weight liquid crystal compounds may be used in combination, and preferably 2 to 6 kinds thereof and more preferably 2 to 4 kinds thereof may be used in combination. By using low-molecular-weight liquid crystal compounds in combination, the solubility can be improved and the phase transition temperature of the liquid crystal composition can be adjusted.

Specific examples of the low-molecular-weight liquid crystal compound include compounds represented by Formulae (LC-1) to (LC-77), but the low-molecular-weight liquid crystal compound is not limited thereto.

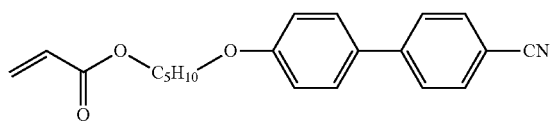

(LC-1)

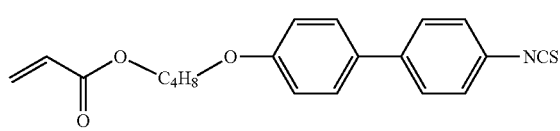

(LC-2)

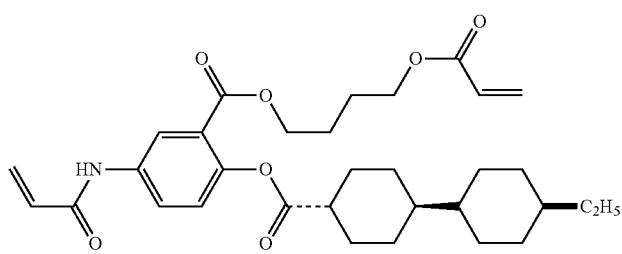

(LC-3)

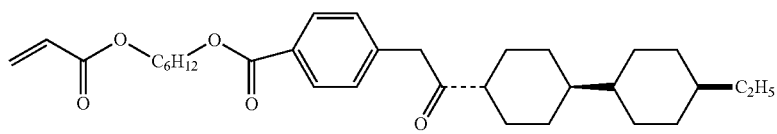

(LC-4)

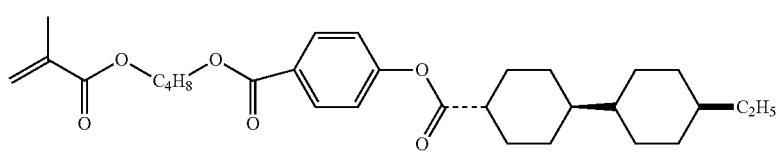

(LC-5)

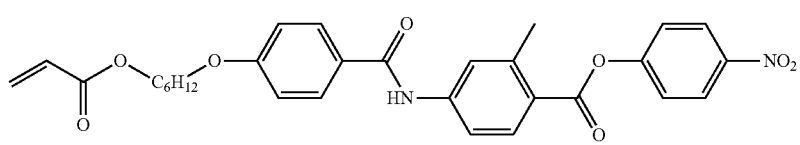

(LC-6)

-continued
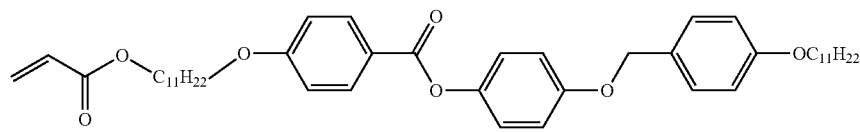
(LC-7)
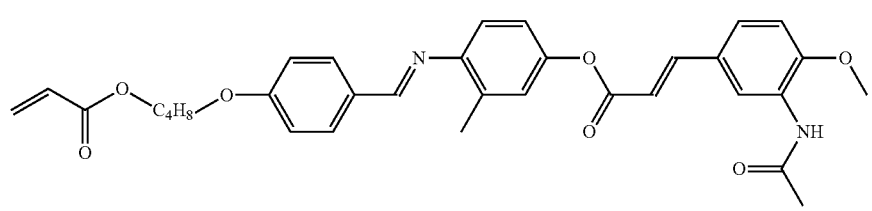
(LC-8)
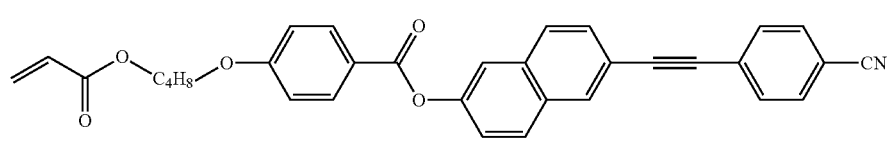
(LC-9)
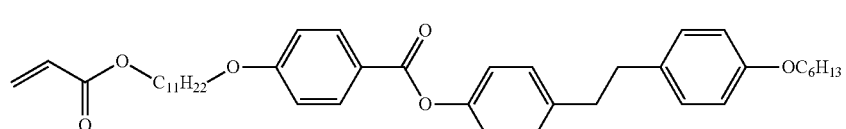
(LC-10)
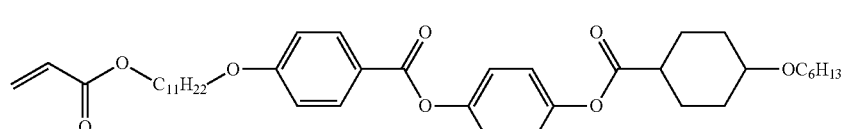
(LC-11)
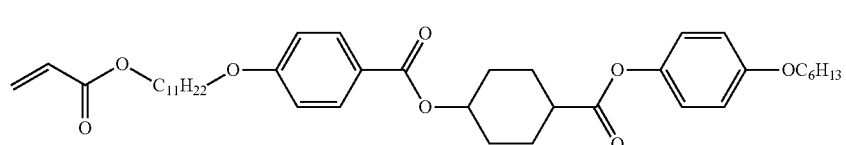
(LC-12)
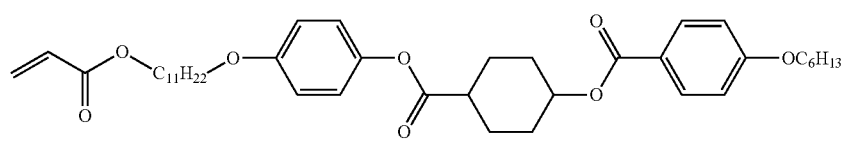
(LC-13)
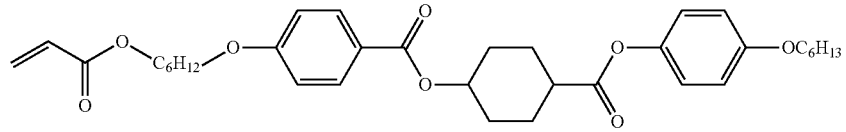
(LC-14)
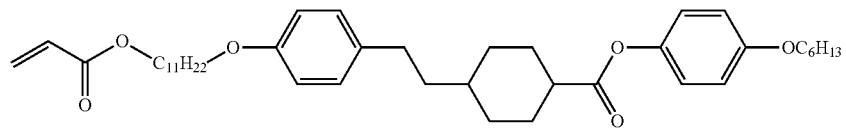
(LC-15)
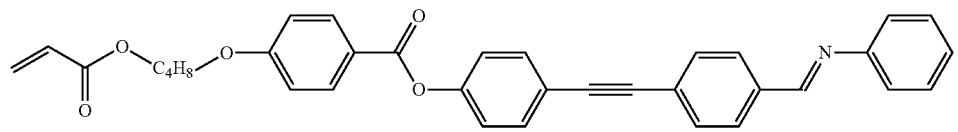
(LC-16)
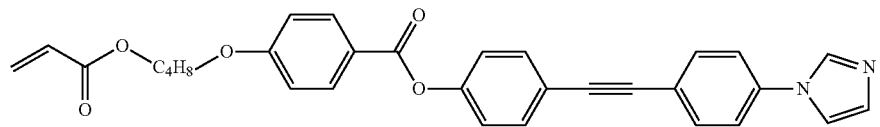
(LC-17)

-continued
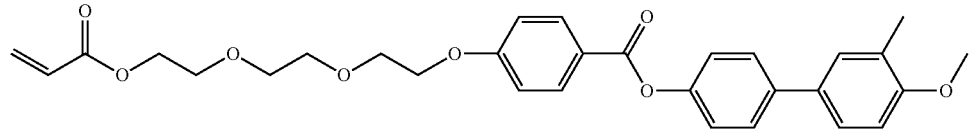
(LC-18)
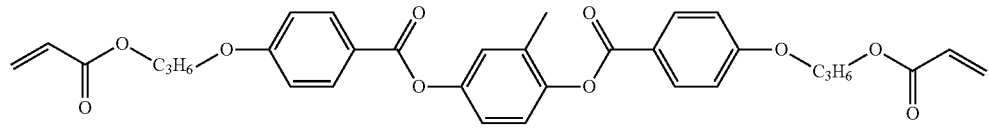
(LC-19)
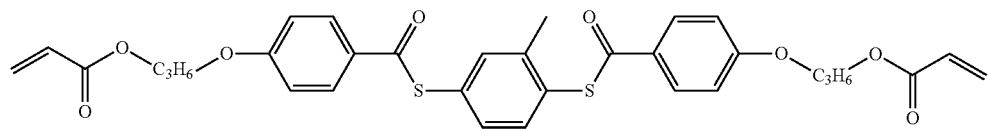
(LC-20)
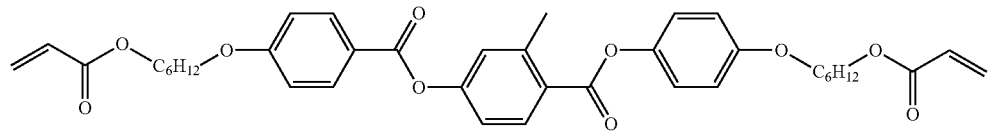
(LC-21)
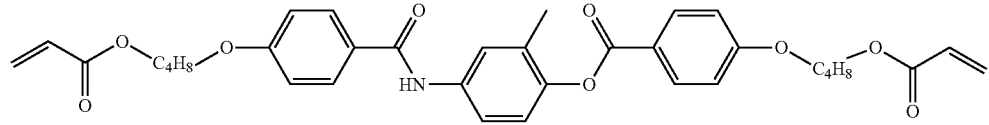
(LC-22)
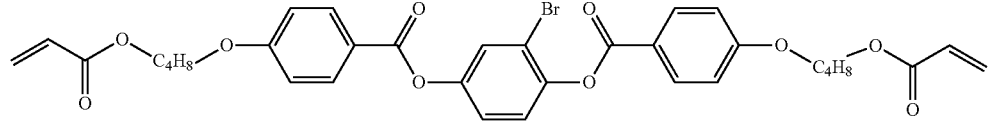
(LC-23)
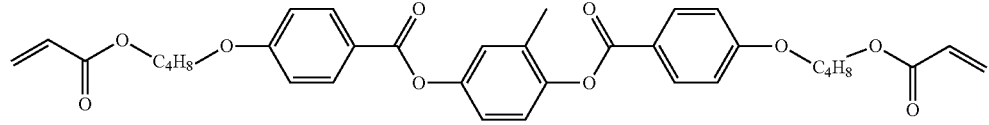
(LC-24)
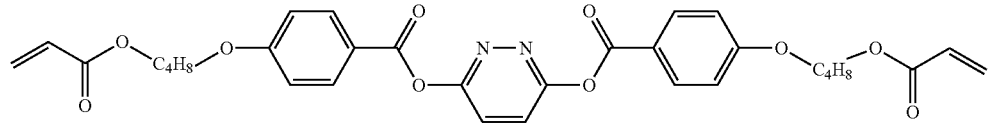
(LC-25)
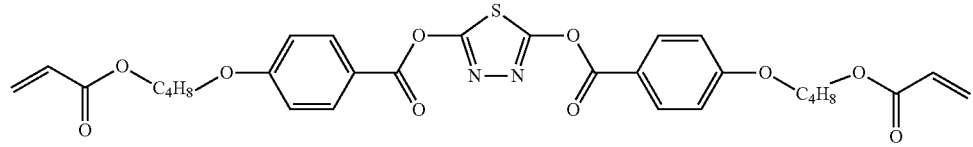
(LC-26)
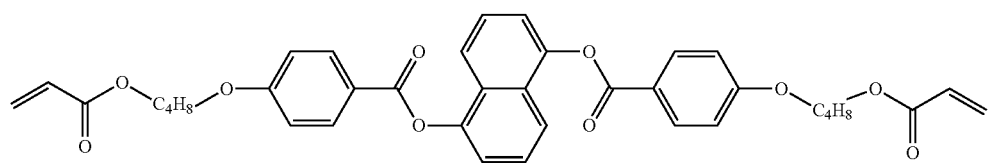
(LC-27)

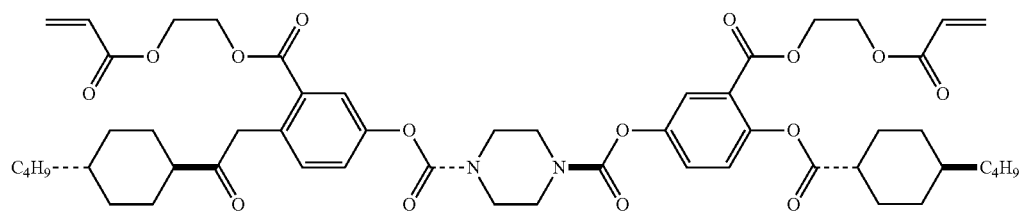
(LC-28)
(LC-29)
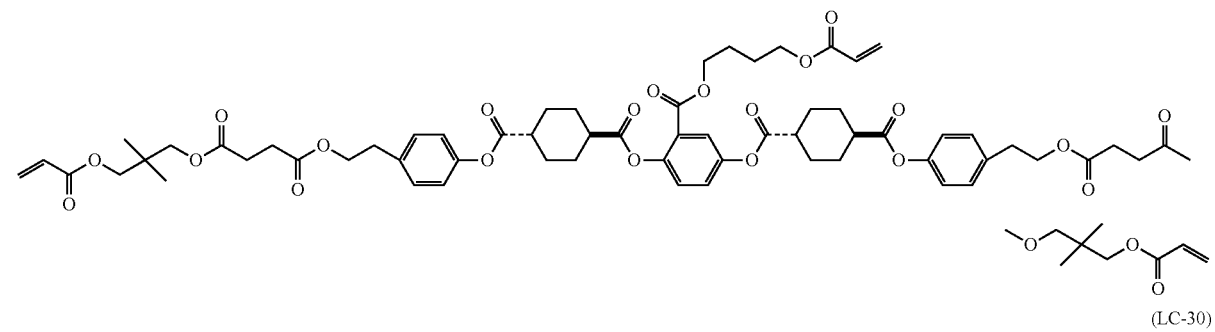
(LC-30)
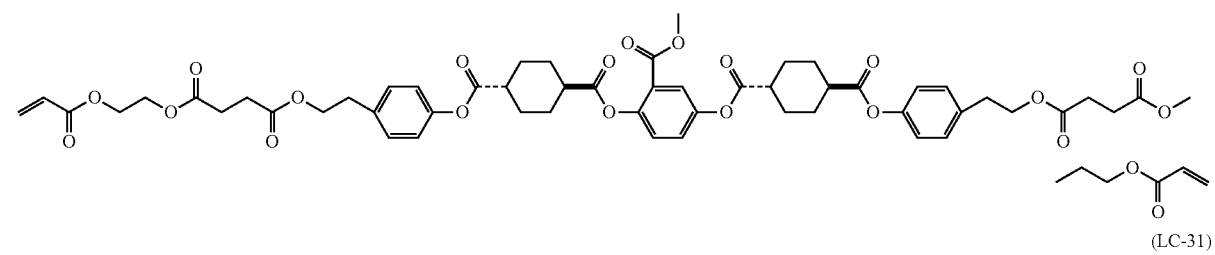
(LC-31)
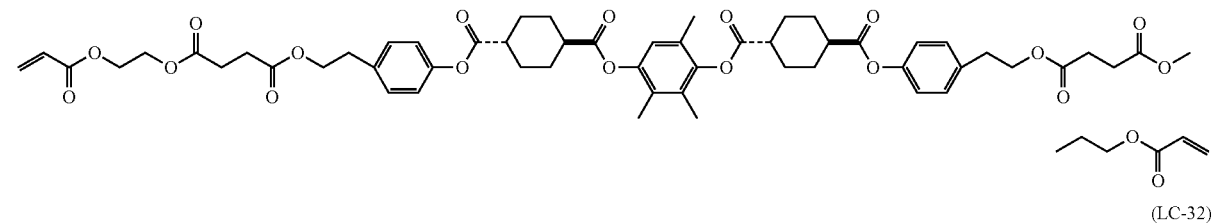
(LC-32)
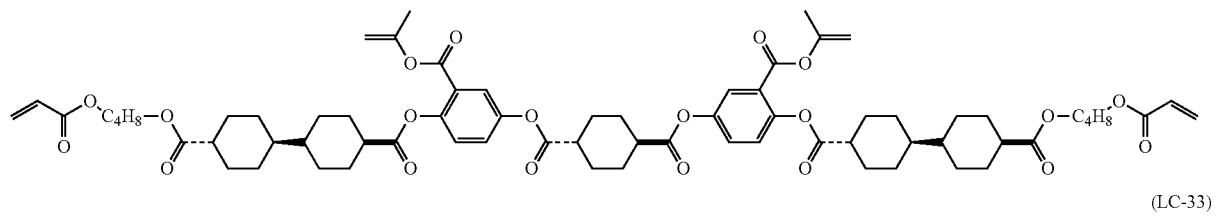
(LC-33)
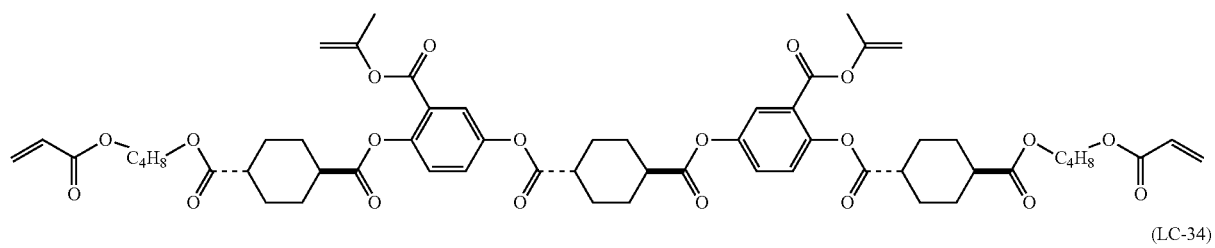
(LC-34)
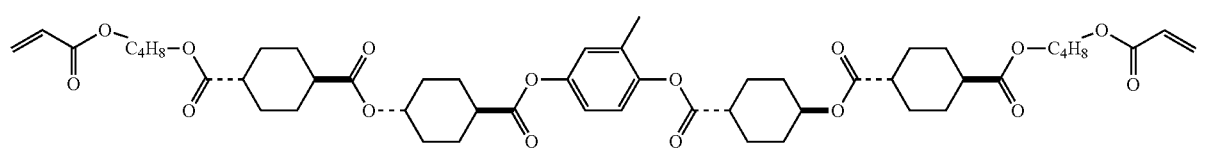

-continued
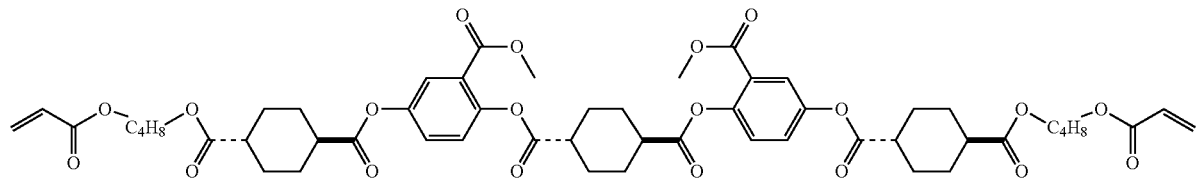
(LC-35)
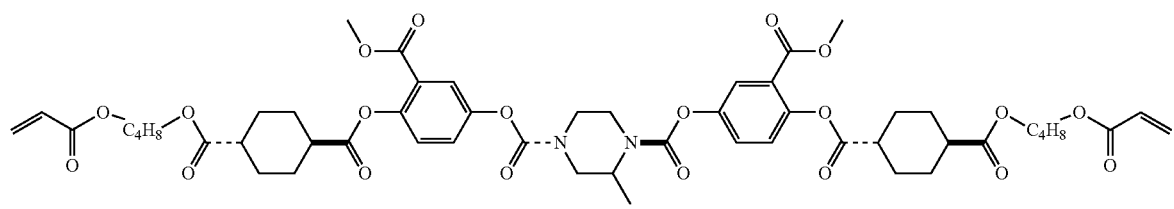
(LC-36)
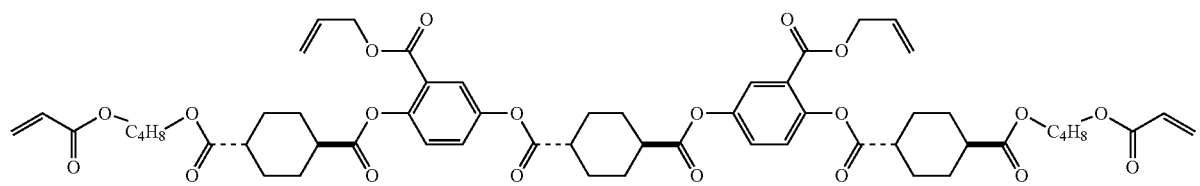
(LC-37)
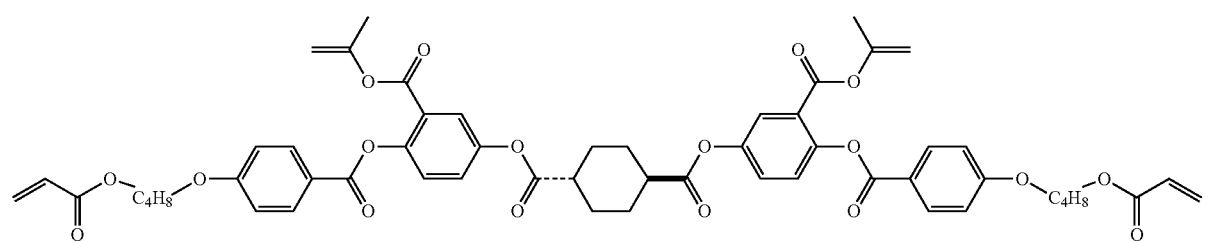
(LC-38)
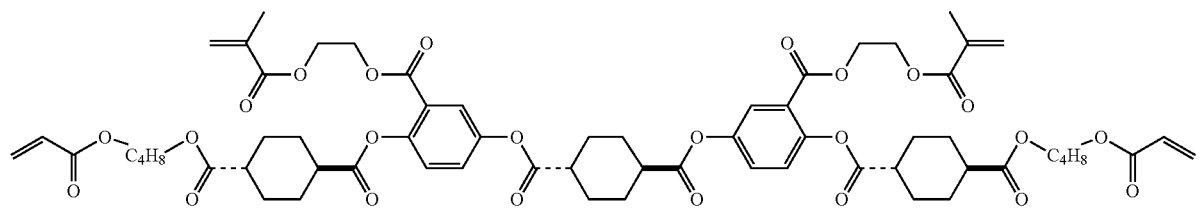
(LC-39)
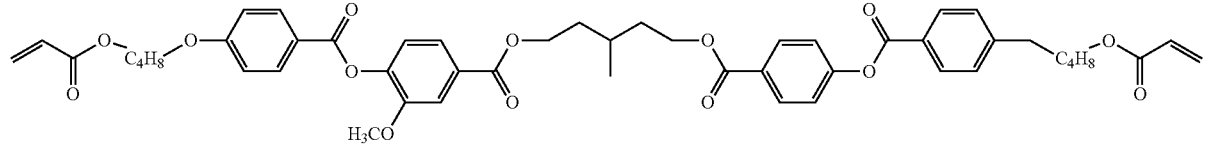
(LC-40)
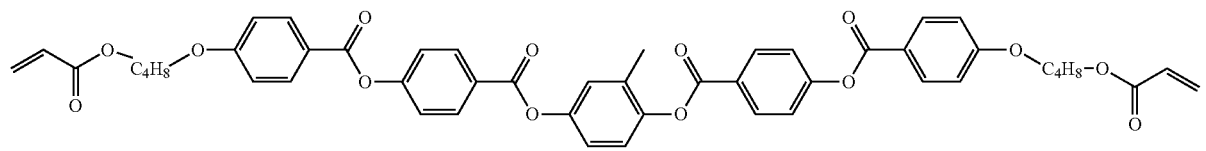
(LC-41)

-continued
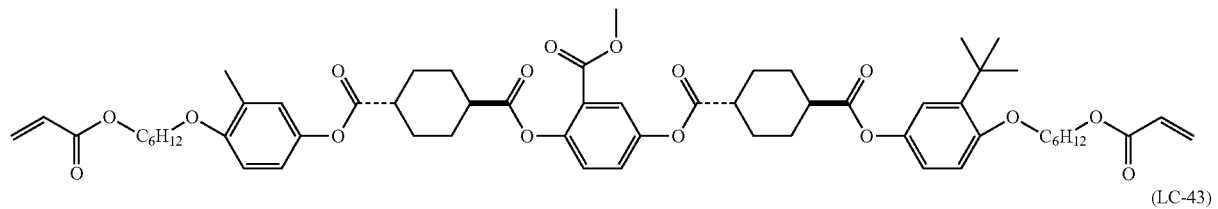
(LC-42)
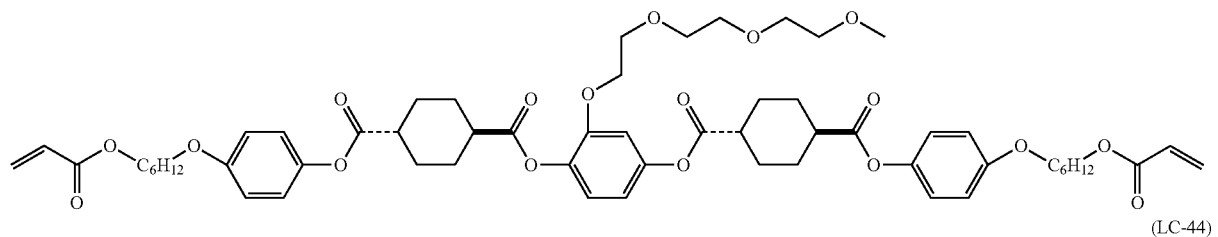
(LC-43)
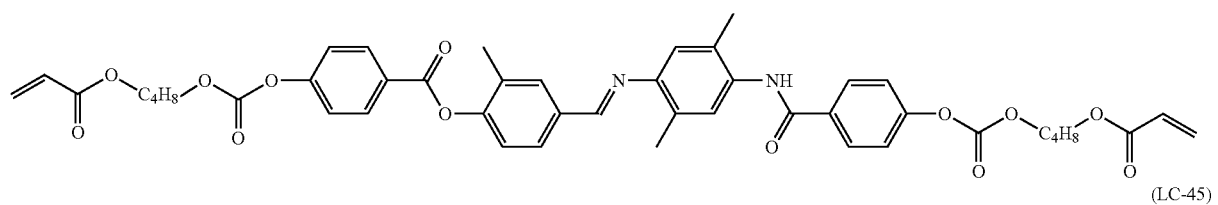
(LC-44)
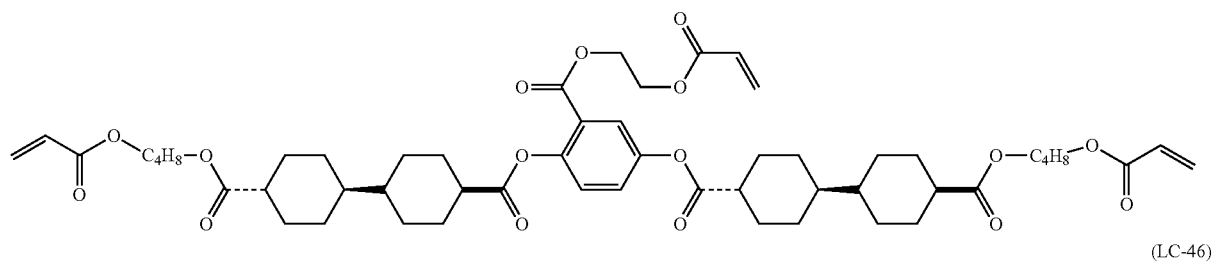
(LC-45)
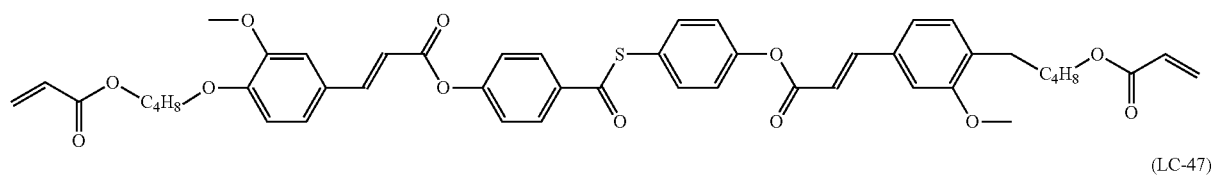
(LC-46)
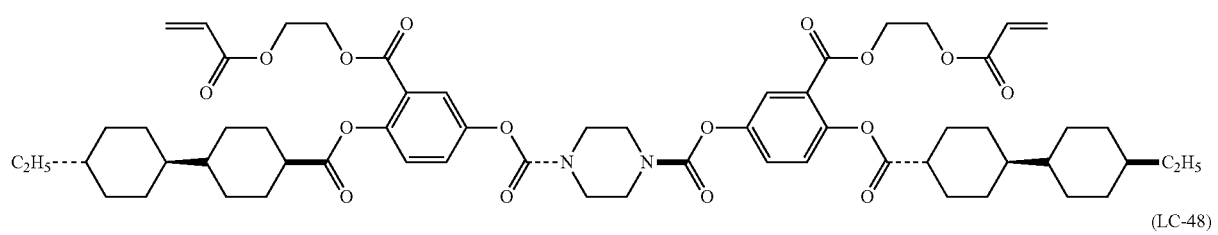
(LC-47)
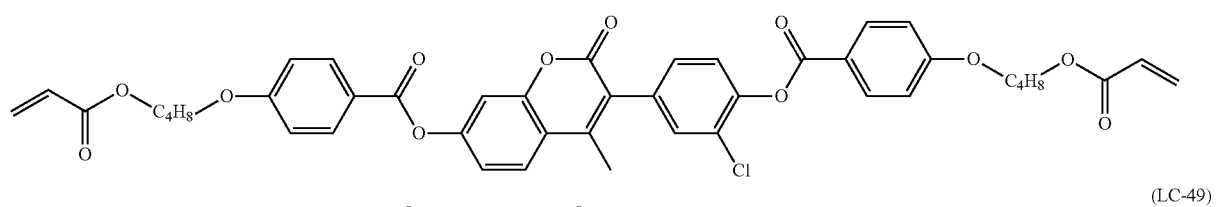
(LC-48)
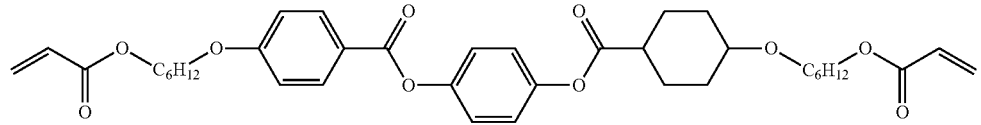
(LC-49)

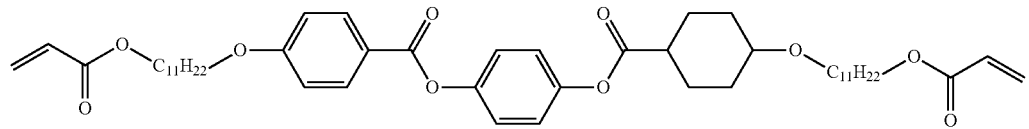
(LC-50)
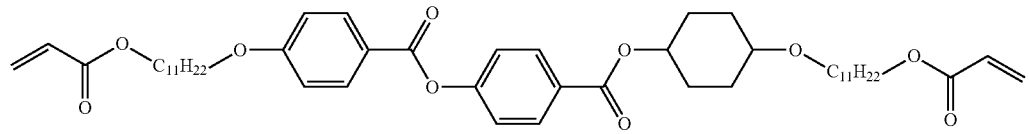
(LC-51)
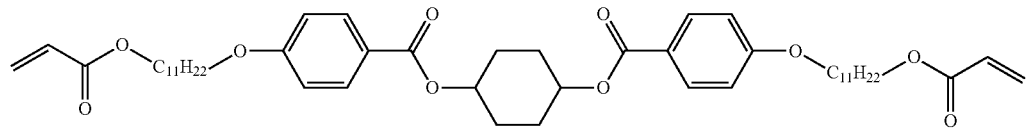
(LC-52)
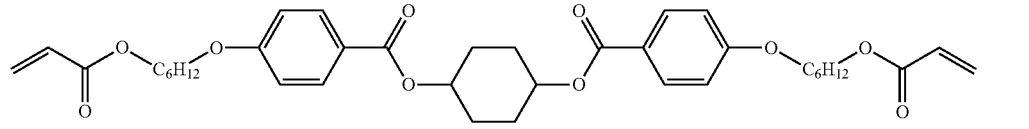
(LC-53)
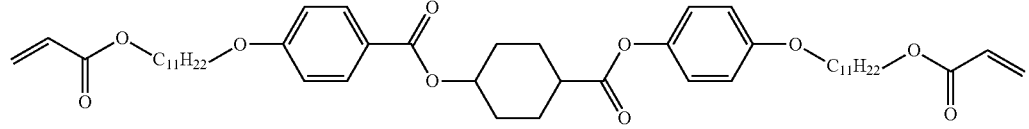
(LC-54)
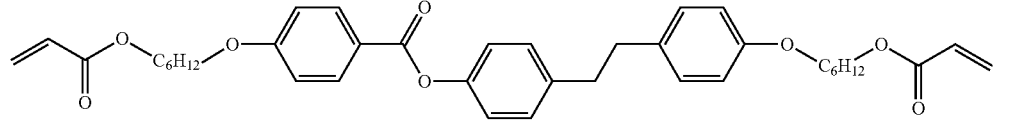
(LC-55)
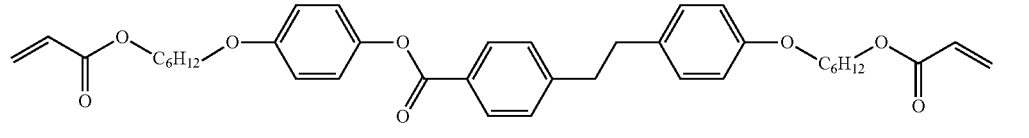
(LC-56)
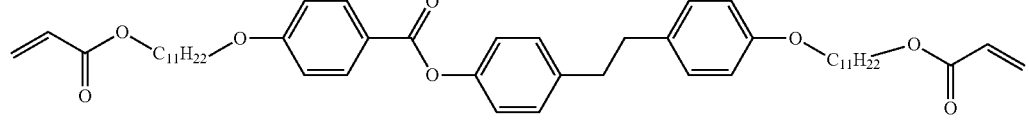
(LC-57)
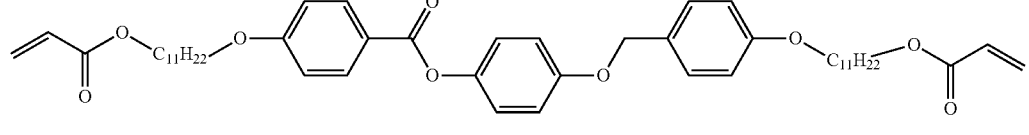
(LC-58)
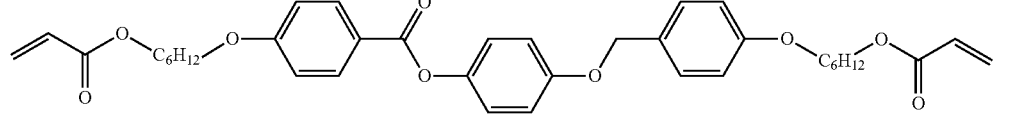
(LC-59)
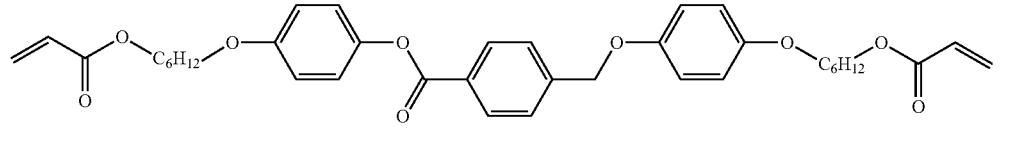
(LC-60)

-continued
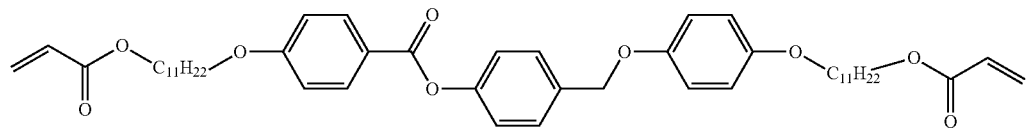
(LC-61)
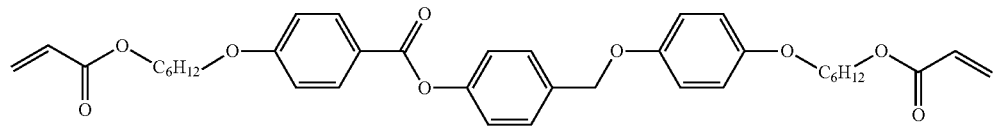
(LC-62)
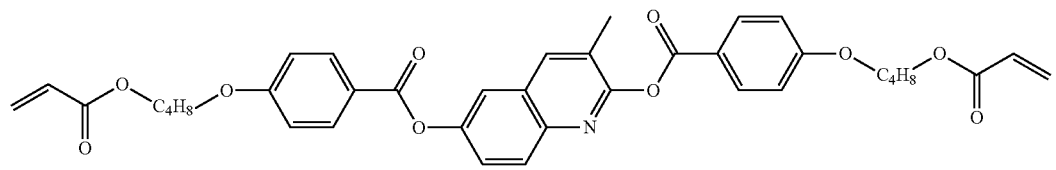
(LC-63)
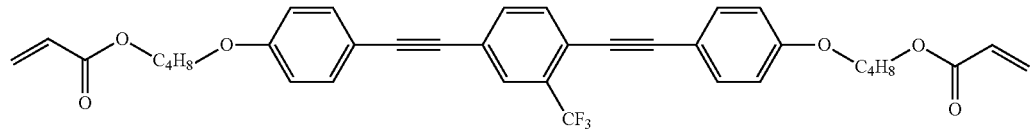
(LC-64)
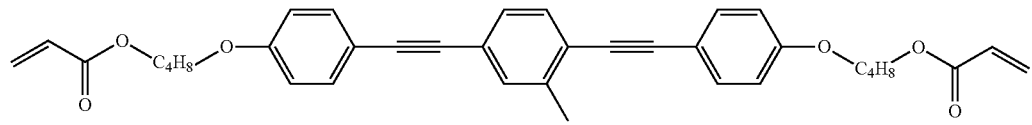
(LC-65)
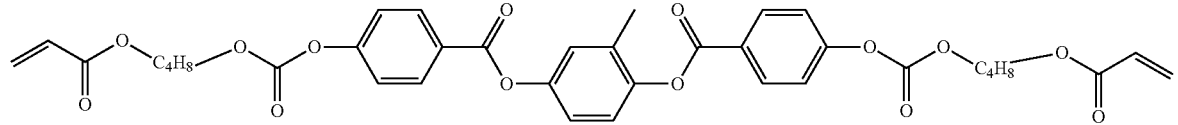
(LC-65)
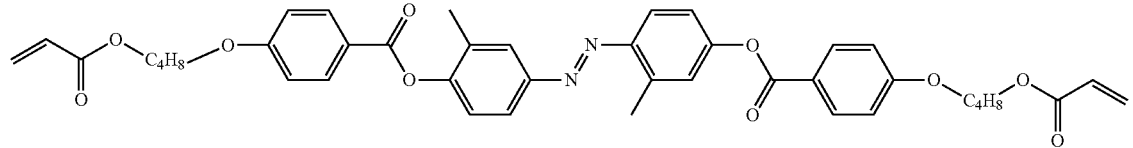
(LC-66)
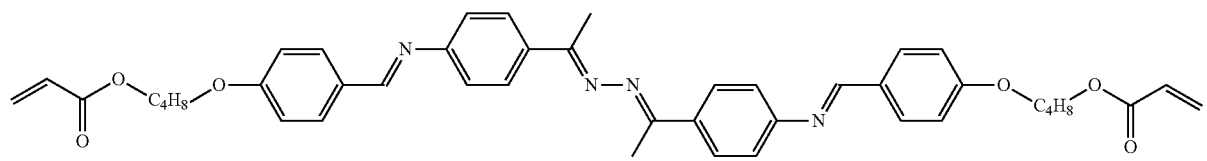
(LC-67)
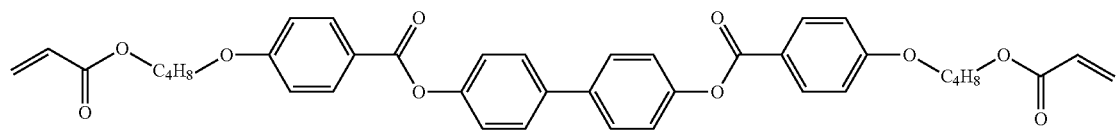
(LC-68)
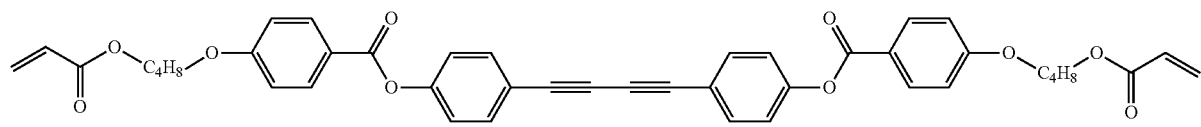
(LC-69)

(LC-70)
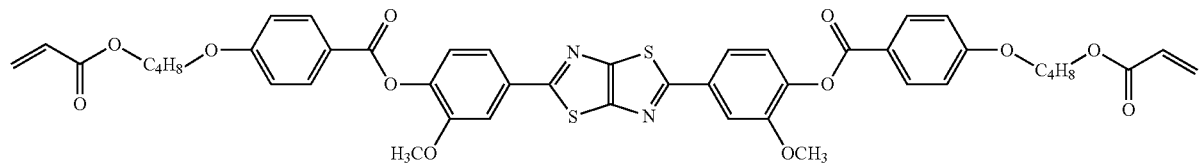
(LC-71)
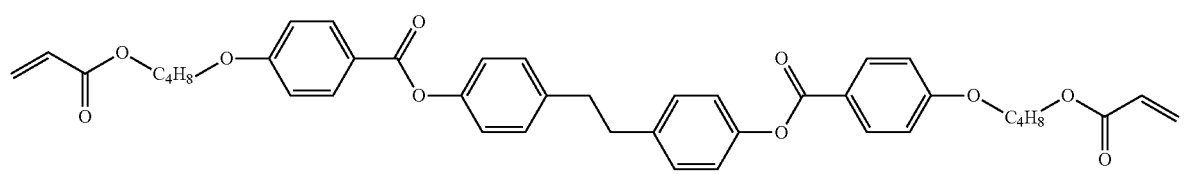
(LC-72)
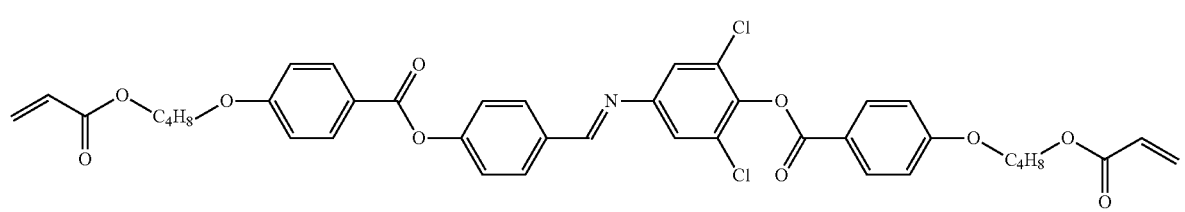
(LC-73)
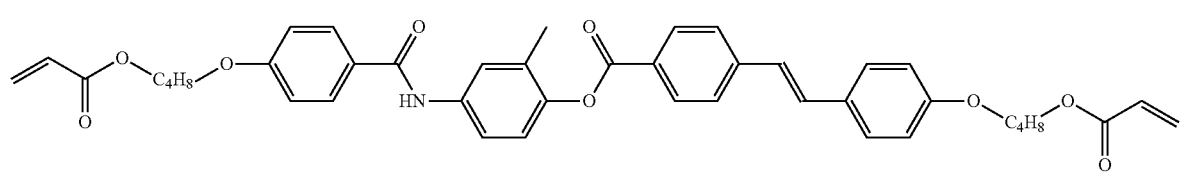
(LC-74)
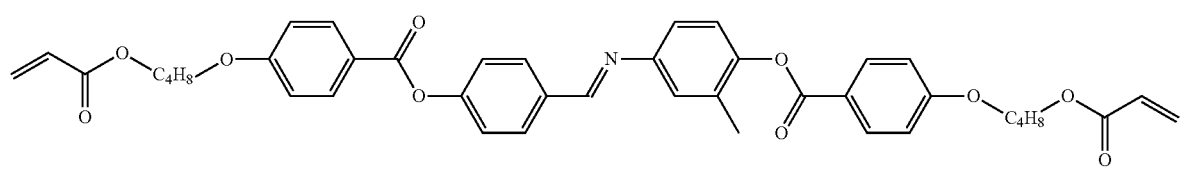
(LC-75)
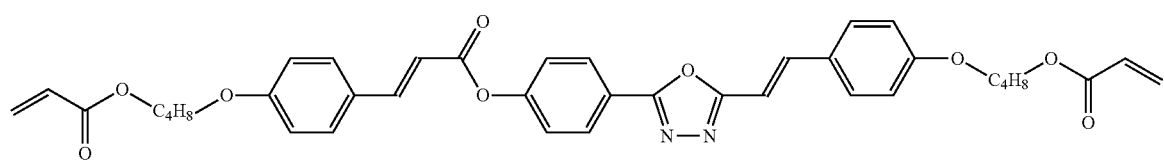
(LC-76)
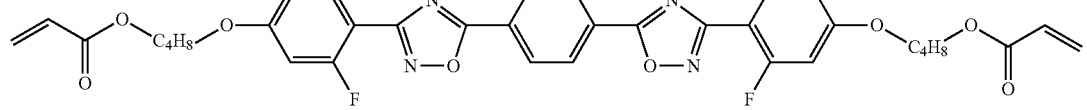
(LC-77)
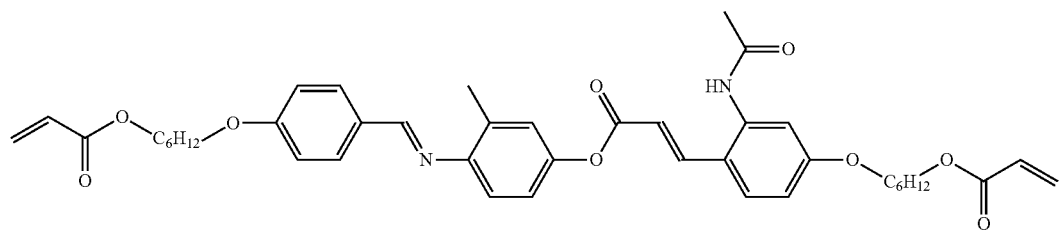

Examples of the polymer liquid crystal compound include thermotropic liquid crystal polymers described in JP2011-237513A. Further, from the viewpoint of enhancing the strength (particularly, the bending resistance) of the light absorption anisotropic layer, it is preferable that the polymer liquid crystal compound has a repeating unit containing a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In a case where the light absorption anisotropic layer in the present invention contains a polymer liquid crystal compound, the polymer liquid crystal compound may exhibit a smectic liquid crystal phase or a nematic liquid crystal phase, and it is preferable that the polymer liquid crystal compound exhibits a nematic liquid crystal phase.

The temperature at which the nematic liquid crystal phase is exhibited is preferably in a range of room temperature (23° C.) to 450° C. and more preferably in a range of 50° C. to 400° C. from the viewpoints of handleability and manufacturing suitability.

The content of the liquid crystal compound is preferably in a range of 25 to 2000 parts by mass, more preferably in a range of 100 to 1300 parts by mass, and still more preferably in a range of 200 to 900 parts by mass with respect to 100 parts by mass of the content of the dichroic substances in the light absorption anisotropic layer. In a case where the content of the liquid crystal compound is in the above-described range, the alignment degree of the polarizer is further improved.

The liquid crystal composition may contain only one or two or more kinds of liquid crystal compounds. In a case where the liquid crystal composition contains two or more kinds of liquid crystal compounds, the content of the liquid crystal compounds denotes the total content of the liquid crystal compounds.

From the viewpoint that the alignment degree is more excellent, it is preferable that the liquid crystal compound is a polymer liquid crystal compound having a repeating unit represented by Formula (1L) (hereinafter, also referred to as "repeating unit (1L)").

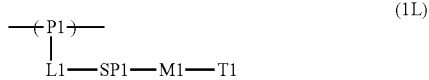

(1L)

In Formula (1L), P1 represents the main chain of the repeating unit, L1 represents a single bond or a divalent linking group, SP1 represents a spacer group, M1 represents a mesogen group, and T1 represents a terminal group.

Examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

(P1-A)

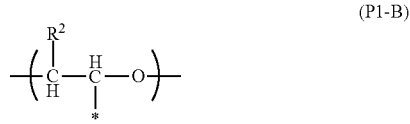

(P1-B)

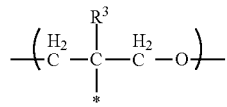

(P1-C)

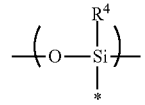

(P1-D)

In Formulae (P1-A) to (P1-D), "*" represents a bonding position with respect to L1 in Formula (1L). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^4(OR^5)_2$—. In the formula, $R^4$ has the same definition as that for $R^4$ in (P1-D), and a plurality of $R^5$'s each independently represent a hydrogen atom or an alkyl group having 1 to 10 carbon atoms.

$L^1$ represents a single bond or a divalent linking group. Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent W described below.

In a case where P1 represents a group represented by Formula (P1-A), from the viewpoint that the alignment degree is more excellent, it is preferable that L1 represents a group represented by —C(O)O—.

In a case where P1 represents a group represented by any of Formulae (P1-B) to (P1-D), from the viewpoint that the alignment degree is more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and "*"

represents a bonding position with respect to L1 or M1 in Formula (1L). From the viewpoint that the alignment degree is more excellent, n1 represents preferably an integer of 2 to 10, more preferably an integer of 2 to 4, and still more preferably 3.

Further, from the viewpoint that the alignment degree is more excellent, a group represented by *—(CH(CH$_3$)—CH$_2$O)—* is preferable as the oxypropylene structure represented by SP1. In the formula, n2 represents an integer of 1 to 3, and "*" represents a bonding position with respect to L1 or M1.

Further, from the viewpoint that the alignment degree is more excellent, a group represented by *—(Si(CH$_3$)$_2$—O)$_{n3}$—* is preferable as the polysiloxane structure represented by SP1. In the formula, n3 represents an integer of 6 to 10, and "*" represents a bonding position with respect to L1 or M1.

Further, from the viewpoint that the alignment degree is more excellent, a group represented by *—(CF$_2$—CF$_2$)$_{n4}$—* is preferable as the alkylene fluoride structure represented by SP1. In the formula, n4 represents an integer of 6 to 10, and "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint that the alignment degree is more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the alignment degree is more excellent, a group represented by Formula (M1-A) or Formula (M1-B) is preferable, and a group represented by Formula (M1-B) is more preferable as the mesogen group.

(M1-A)

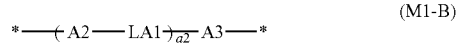

(M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent W described below.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and suitable aspects of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the alignment degree is more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the alignment degree is more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)₂—C(Z')₂—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —N=N—, —S—, —S(O)—, —S(O)(O)—, —(O)S(O)O—, —O(O)S(O)O—, —SC(O)—, and —C(O)S—. Among these, —C(O)O— is preferable from the viewpoint that the alignment degree is more excellent. LA1 may represent a group obtained by combining two or more of these groups.

Specific examples of M1 include the following structures. In the following specific examples, "Ac" represents an acetyl group.

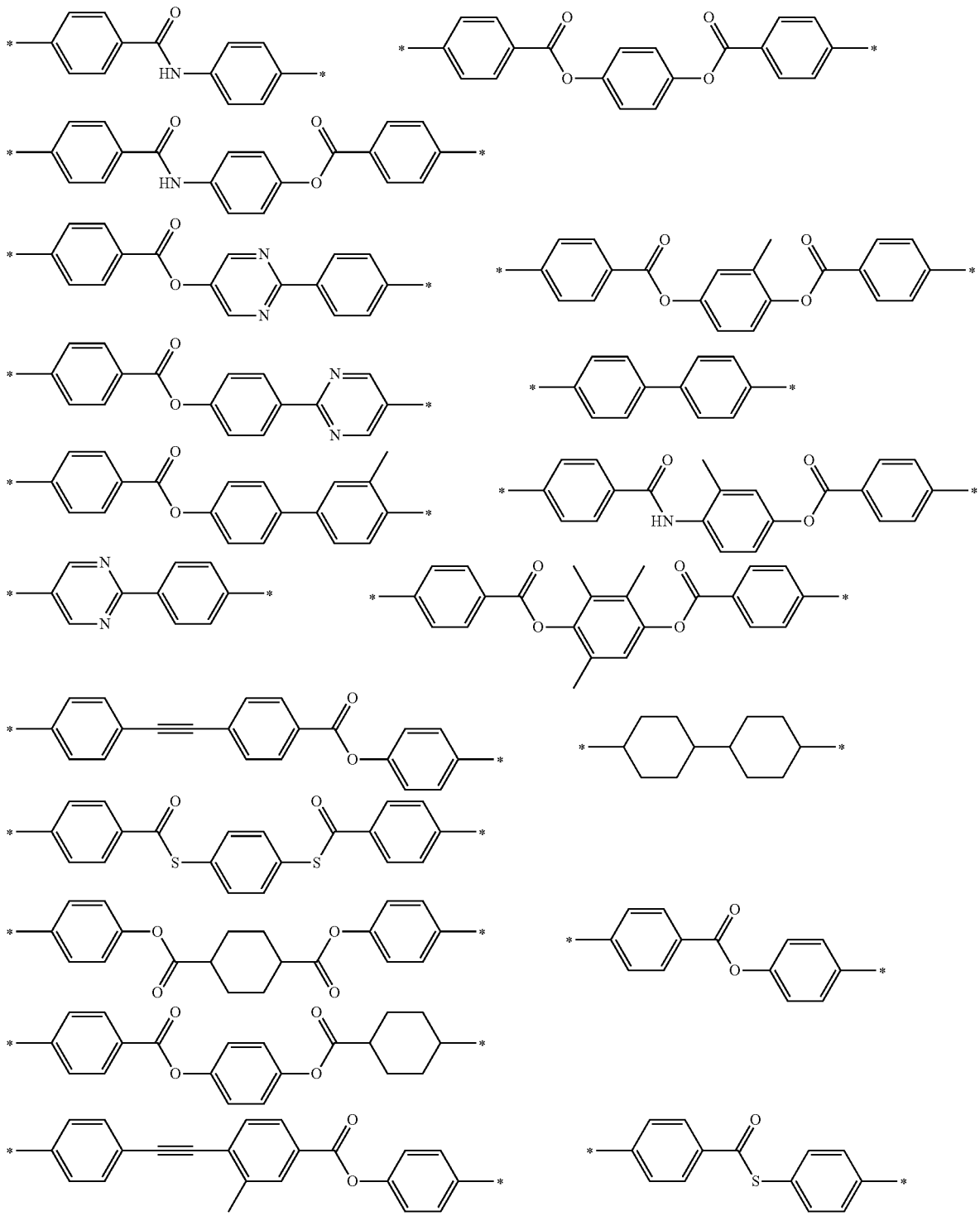

-continued
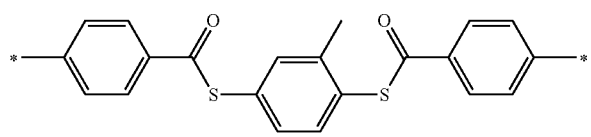
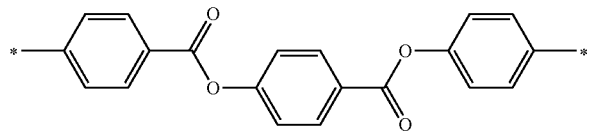
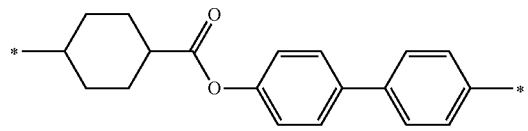
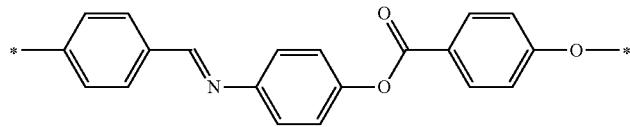
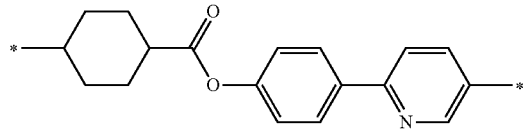
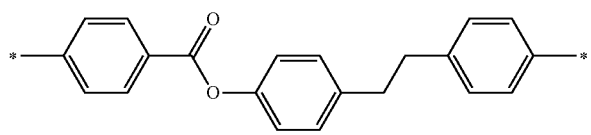
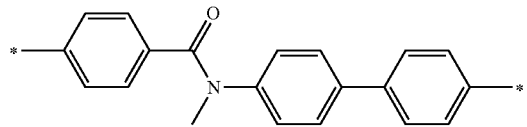
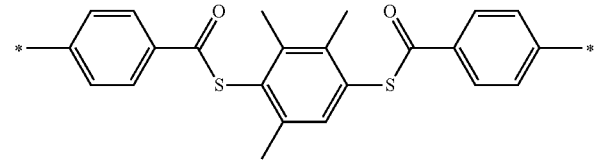
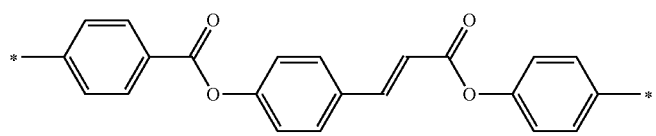
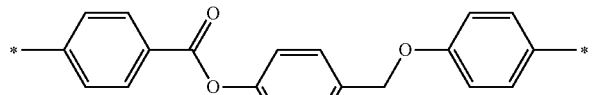
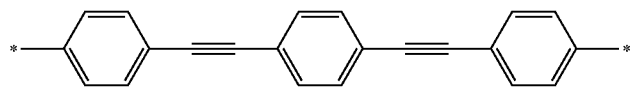
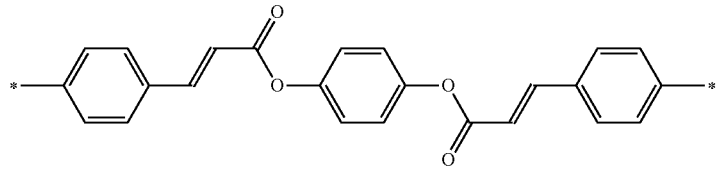
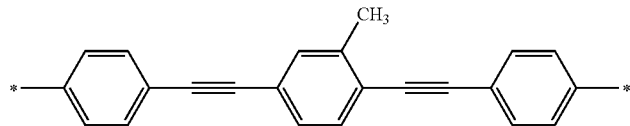
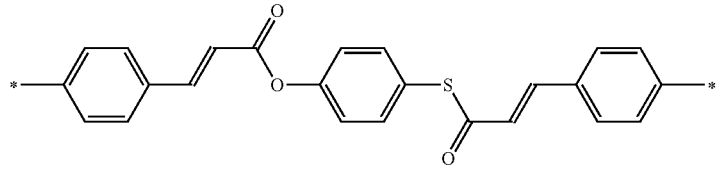
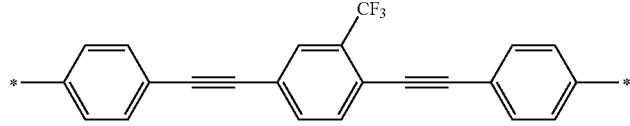

-continued
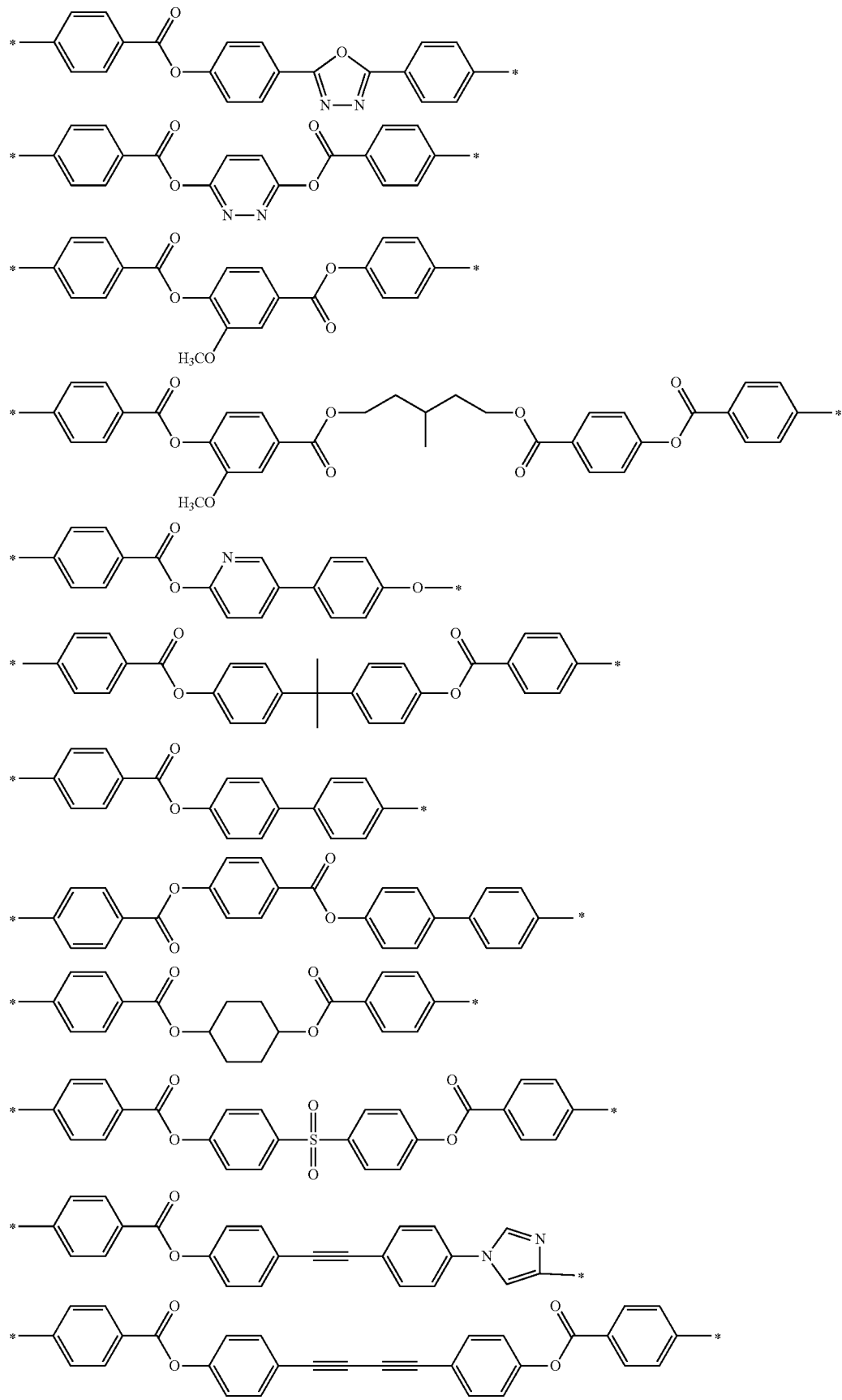

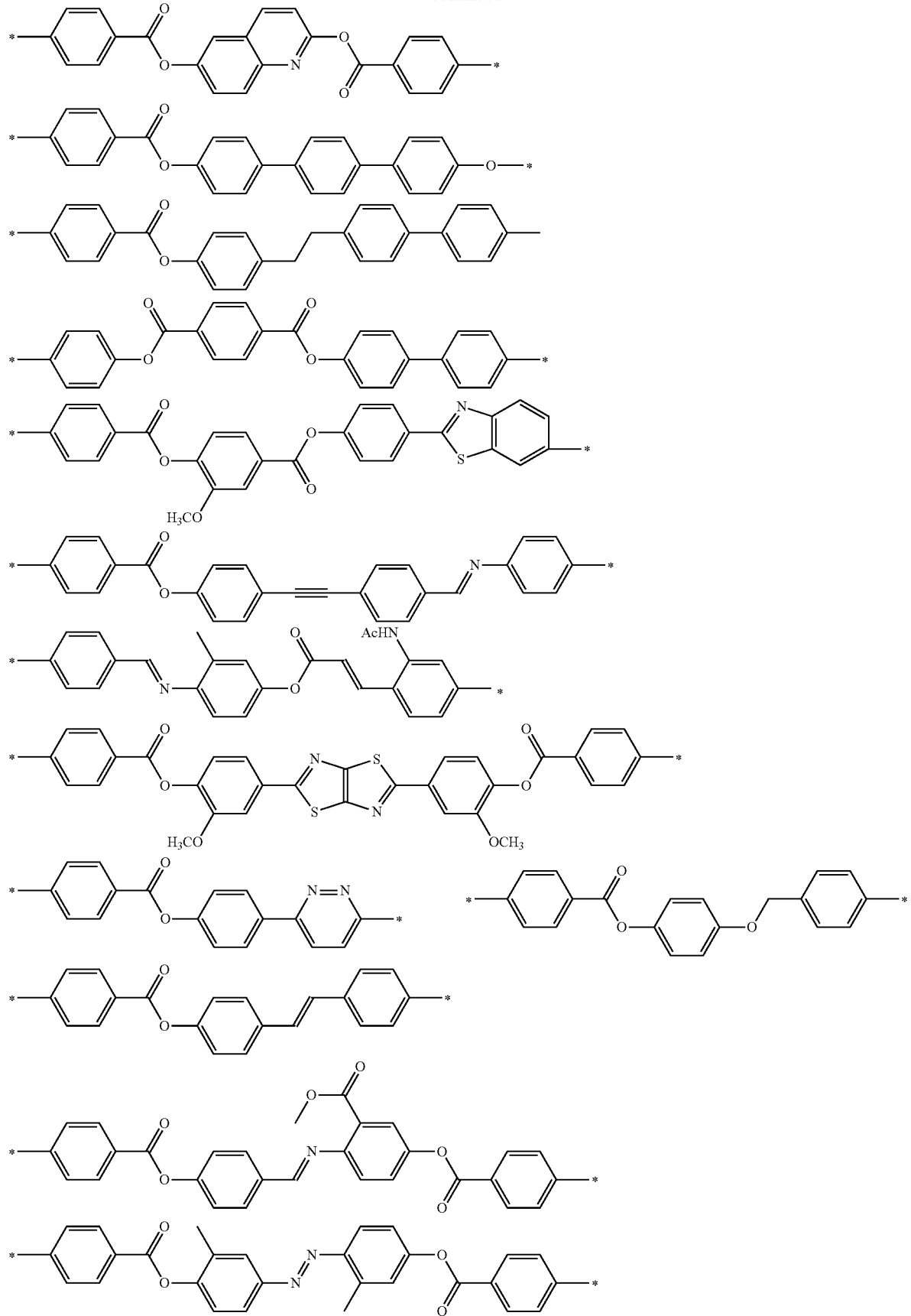

-continued

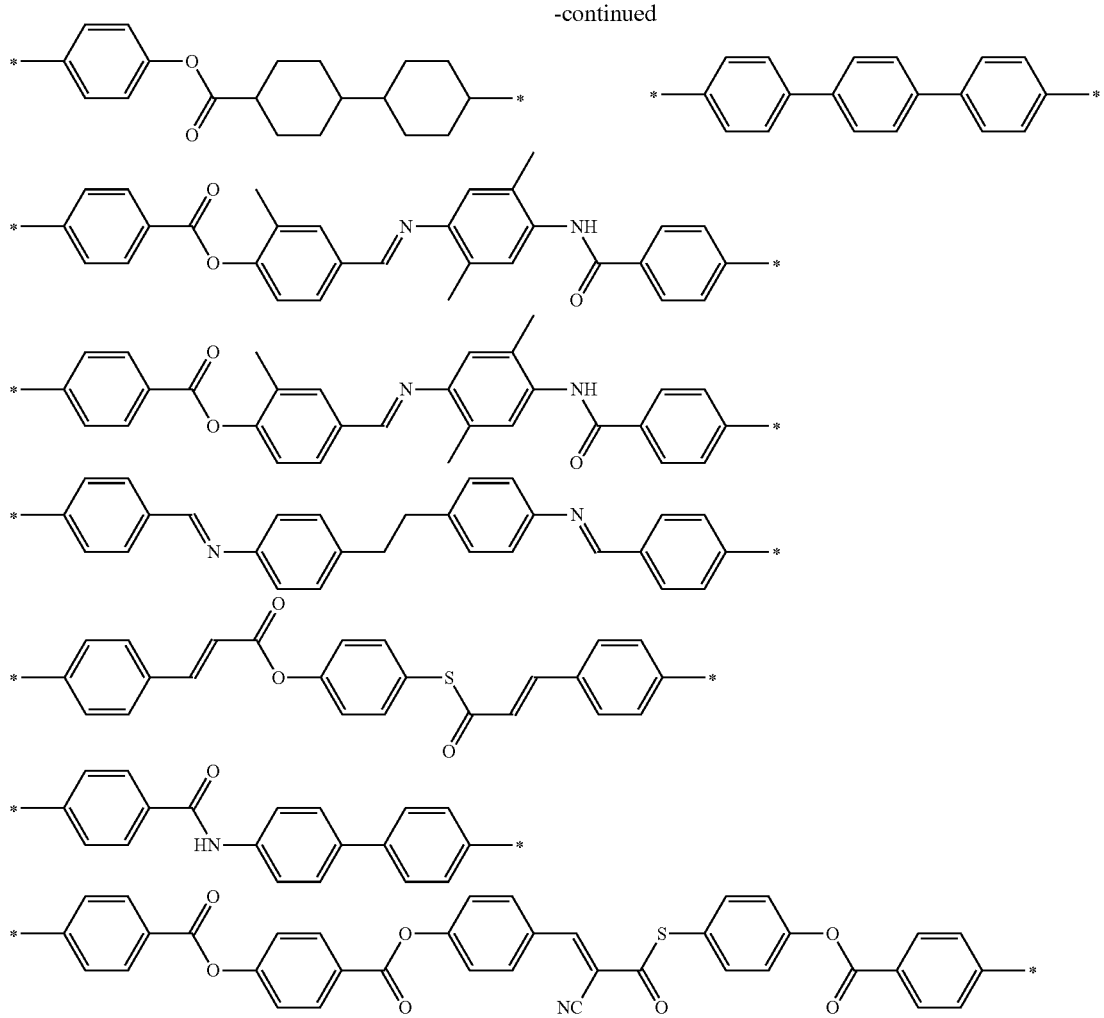

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint that the alignment degree is more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the above-described cross-linkable groups.

From the viewpoint that the alignment degree is more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree of the light absorption anisotropic layer is further improved. Here, "main chain" in T1 denotes the longest molecular chain bonded to M1, and the number of hydrogen atoms is not included in the number of atoms in the main chain of T1. For example, the number of atoms in the main chain is 4 in a case where T1 represents an n-butyl group, and the number of atoms in the main chain is 3 in a case where T1 represents a sec-butyl group.

From the viewpoint that the alignment degree is more excellent, the content of the repeating unit (1L) is preferably in a range of 20% to 100% by mass with respect to 100% by mass of all repeating units of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of repeating units (1L). Among these, from the viewpoint that the alignment degree is more excellent, the polymer liquid crystal compound may have two kinds of the repeating units (1L).

In a case where the polymer liquid crystal compound has two kinds of the repeating units (1L), from the viewpoint that the alignment degree is more excellent, it is preferable that the terminal group represented by T1 in one (repeating unit A) is an alkoxy group and the terminal group represented by T1 in the other (repeating unit B) is a group other than the alkoxy group.

From the viewpoint that the alignment degree is more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the alignment degree is more excellent, the ratio (AB) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

Further, the polymer liquid crystal compound may have the repeating unit (1L) and a repeating unit containing no mesogen group. Examples of the repeating unit containing no mesogen group include a repeating unit in which M1 in Formula (1L) represents a single bond. For the purpose of increasing the film hardness of the light absorption anisotropic layer, it is also preferable that the repeating unit containing no mesogen group contains a radically polymerizable group at the terminal.

In a case where the polymer liquid crystal compound has a repeating unit containing no mesogen group, from the viewpoint that the alignment degree is more excellent, the content of the repeating unit is preferably greater than 0% by mass and 30% by mass or less and more preferably greater than 10% by mass and 20% by mass or less with respect to 100% by mass of all repeating units of the polymer liquid crystal compound.

From the viewpoint that the alignment degree is more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described ranges, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the alignment degree, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

The substituent W in the present specification will be described.

Examples of the substituent W include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfonic acid group, and a phosphoric acid group.

(Dichroic Substance)

It is preferable that the light absorption anisotropic layer used in the present invention contains a dichroic substance. The dichroic substance is not particularly limited, and examples thereof include a visible light absorbing substance (a dichroic coloring agent or a dichroic azo coloring agent compound), a light emitting substance (such as a fluorescent substance or a phosphorescent substance), an ultraviolet absorbing substance, an infrared absorbing substance, a non-linear optical substance, a carbon nanotube, and an inorganic substance (for example, a quantum rod). Further, known dichroic substances of the related art can be used.

As the dichroic substance, an organic dichroic substance is preferable, and a dichroic azo coloring agent compound is more preferable.

The dichroic azo coloring agent compound is not particularly limited, and known dichroic azo coloring agents of the related art can be used, but the compounds described below are preferably used.

In the present invention, the dichroic azo coloring agent compound denotes a coloring agent having different absorbances depending on the direction.

The dichroic azo coloring agent compound may or may not exhibit liquid crystallinity.

In a case where the dichroic azo coloring agent compound exhibits liquid crystallinity, the dichroic azo coloring agent compound may exhibit any of nematic liquid crystallinity or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In the present invention, from the viewpoint of adjusting the tint, the light absorption anisotropic layer contains preferably at least one coloring agent compound having a maximum absorption wavelength in a wavelength range of 560 to 700 nm (hereinafter, also referred to as "first dichroic azo coloring agent compound") and at least one coloring agent compound having a maximum absorption wavelength in a wavelength range of 455 nm or greater and less than 560 nm (hereinafter, also referred to as "second dichroic azo coloring agent compound") and specifically more preferably at least a dichroic azo coloring agent compound represented by Formula (1) and a dichroic azo coloring agent compound represented by Formula (2).

In the present invention, three or more kinds of dichroic azo coloring agent compounds may be used in combination. For example, from the viewpoint of making the color of the light absorption anisotropic layer close to black, it is preferable to use a first dichroic azo coloring agent compound, a second dichroic azo coloring agent compound, and at least one coloring agent compound having a maximum absorption wavelength in a wavelength range of 380 nm or greater and less than 455 nm (hereinafter, also referred to as "third dichroic azo coloring agent compound") in combination.

In the present invention, from the viewpoint of further enhancing pressing resistance, it is preferable that the dichroic azo coloring agent compound contains a crosslinkable group.

Specific examples of the crosslinkable group include a (meth)acryloyl group, an epoxy group, an oxetanyl group, and a styryl group. Among these, a (meth)acryloyl group is preferable.

[First Dichroic Azo Coloring Agent Compound]

It is preferable that the first dichroic azo coloring agent compound is a compound having a chromophore which is a nucleus and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic ring group and an azo group is preferable, and a bisazo structure containing an aromatic heterocyclic group (preferably a thienothiazole group) and two azo groups is more preferable.

The side chain is not particularly limited, and examples thereof include a group represented by R1, R2, or R3 in Formula (1).

The first dichroic azo coloring agent compound is a dichroic azo coloring agent compound having a maximum absorption wavelength in a wavelength range of 560 to 700 nm, and from the viewpoint of adjusting the tint of the light absorption anisotropic layer, preferably a dichroic azo coloring agent compound having a maximum absorption wavelength in a wavelength range of 560 to 650 nm and more preferably a dichroic azo coloring agent compound having a maximum absorption wavelength in a wavelength range of 560 to 640 nm.

The maximum absorption wavelength (nm) of the dichroic azo coloring agent compound in the present specification is acquired from an ultraviolet visible spectrum in a wavelength range of 380 to 800 nm measured by a spectrophotometer using a solution prepared by dissolving the dichroic azo coloring agent compound in a good solvent.

In the present invention, from the viewpoint of further improving the alignment degree of the light absorption anisotropic layer to be formed, it is preferable that the first dichroic azo coloring agent compound is a compound represented by Formula (1).

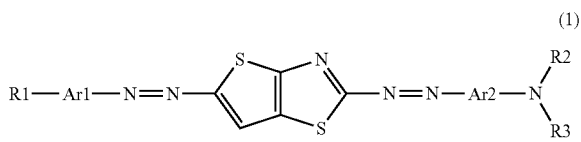

(1)

In Formula (1), Ar1 and Ar2 each independently represent a phenylene group which may have a substituent or a naphthylene group which may have a substituent. Among these, a phenylene group is preferable.

In Formula (1), R1 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group.

Further, —CH$_2$— constituting the alkyl group may be substituted with —O—, —CO—, —C(O)—O—, —O—C(O)—, —Si(CH$_3$)$_2$—O—Si(CH$_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —N=N—, —C(R1')=CH—C(O)—, or —O—C(O)—O—.

In a case where R1 represents a group other than a hydrogen atom, the hydrogen atom in each group may be substituted with a halogen atom, a nitro group, a cyano group, —N(R1')$_2$, an amino group, —C(R1')=C(R1')—NO$_2$, —C(R1')=C(R1')—CN, or —C(R1')=C(CN)$_2$.

R1' represents a hydrogen atom or a linear or branched alkyl group having 1 to 6 carbon atoms. In a case where a plurality of R1's are present in each group, these may be the same as or different from one another.

In Formula (1), R2 and R3 each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

Further, —CH$_2$— constituting the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—, —NR2'—CO—, —CO—NR2'—, —NR2'—C(O)—O—, —O—C(O)—NR2'—, —NR2'—C(O)—NR2'—, —CH=CH—, —N=N—, —C(R2')=CH—C(O)—, or —O—C(O)—O—.

In a case where R2 and R3 represent a group other than a hydrogen atom, the hydrogen atom of each group may be substituted with a halogen atom, a nitro group, a cyano group, a —OH group, —N(R2')$_2$, an amino group, —C(R2')=C(R2')—NO$_2$, —C(R2')=C(R2')—CN, or —C(R2')=C(CN)$_2$.

R2' represents a hydrogen atom or a linear or branched alkyl group having 1 to 6 carbon atoms. In a case where a plurality of R2's are present in each group, these may be the same as or different from one another.

R2 and R3 may be bonded to each other to form a ring, or R2 or R3 may be bonded to Ar2 to form a ring.

From the viewpoint of the light resistance, it is preferable that R1 represents an electron-withdrawing group and R2 and R3 represent a group having a low electron-donating property.

Specific examples of such groups as R1 include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of such a group as R2 and R3 include groups having the following structures. In addition, the groups having the following structures are shown in the form having a nitrogen atom to which R2 and R3 are bonded in Formula (1).

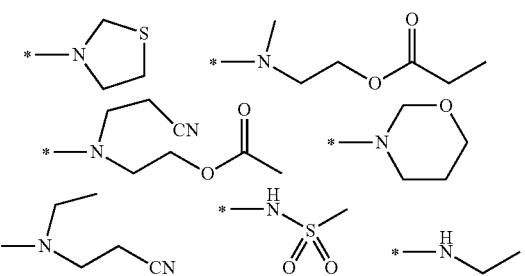

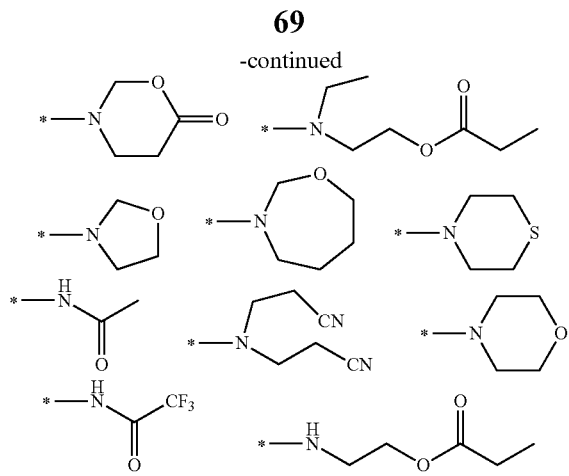
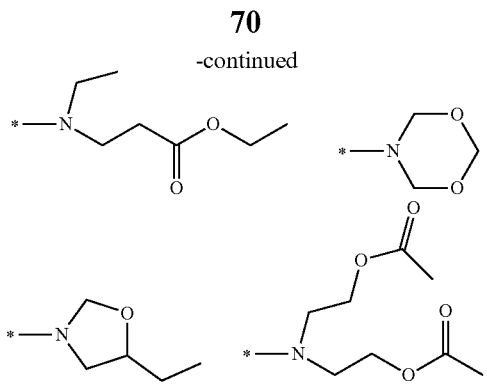
Specific examples of the first dichroic azo coloring agent compound are shown below, but the present invention is not limited thereto.
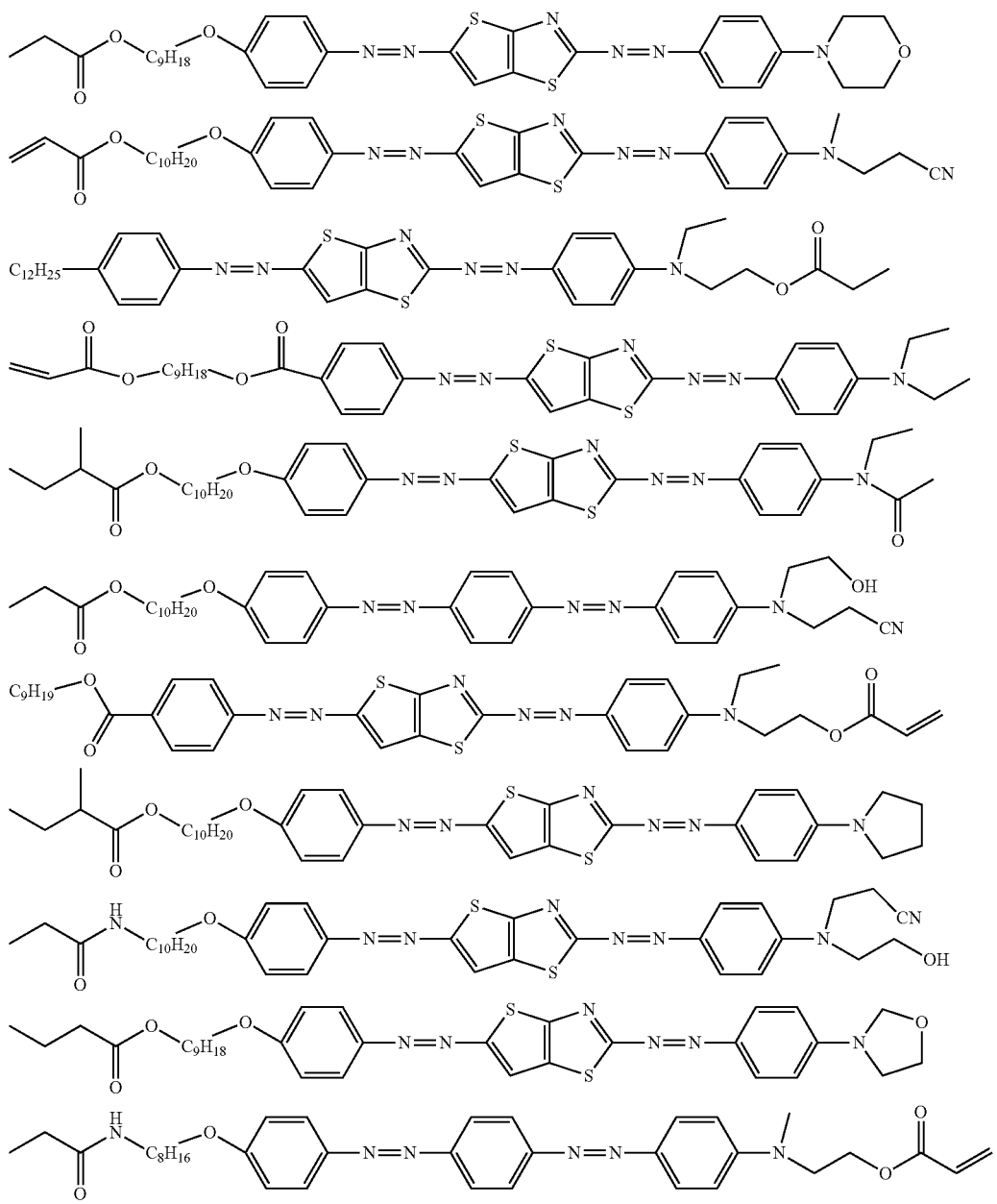

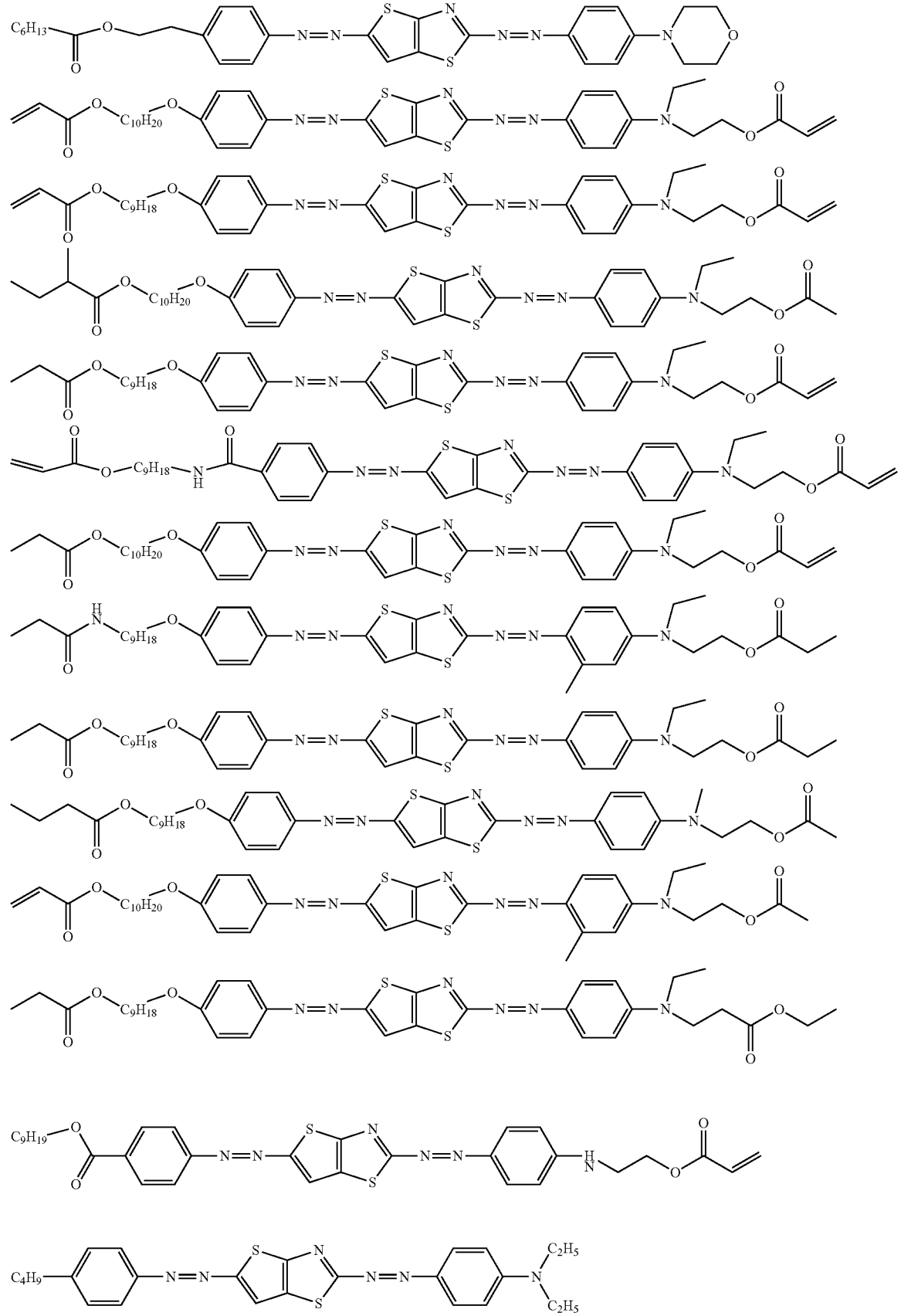

[Second Dichroic Azo Coloring Agent Compound]

The second dichroic azo coloring agent compound is a compound different from the first dichroic azo coloring agent compound, and specifically, the chemical structure thereof is different from that of the first dichroic azo coloring agent compound.

It is preferable that the second dichroic azo coloring agent compound is a compound having a chromophore which is a nucleus of a dichroic azo coloring agent compound and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic hydrocarbon group and an azo group is preferable, and a bisazo or trisazo structure containing an aromatic hydrocarbon group and two or three azo groups is more preferable.

The side chain is not particularly limited, and examples thereof include a group represented by R4, R5, or R6 in Formula (2).

The second dichroic azo coloring agent compound is a dichroic azo coloring agent compound having a maximum absorption wavelength in a wavelength range of 455 nm or greater and less than 560 nm, and from the viewpoint of adjusting the tint of the light absorption anisotropic layer, preferably a dichroic azo coloring agent compound having a maximum absorption wavelength in a wavelength range of 455 to 555 nm and more preferably a dichroic azo coloring agent compound having a maximum absorption wavelength in a wavelength range of 455 to 550 nm.

Particularly in a case where a first dichroic azo coloring agent compound having a maximum absorption wavelength in a range of 560 to 700 nm and a second dichroic azo coloring agent compound having a maximum absorption wavelength in a range of 455 nm or greater and less than 560 nm are used, the tint of the light absorption anisotropic layer is more easily adjusted.

From the viewpoint of further improving the alignment degree of the light absorption anisotropic layer, it is preferable that the second dichroic azo coloring agent compound is a compound represented by Formula (2).

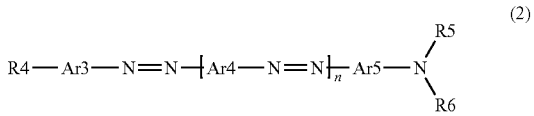

In Formula (2), n represents 1 or 2.

In Formula (2), Ar3, Ar4, and Ar5 each independently represent a phenylene group which may have a substituent, a naphthylene group which may have a substituent, or a heterocyclic group which may have a substituent.

The heterocyclic group may be aromatic or non-aromatic.

The atoms other than carbon constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

In Formula (2), R4 has the same definition as that for R1 in Formula (1).

In Formula (2), R5 and R6 each have the same definition as that for R2 and R3 in Formula (1).

From the viewpoint of the light resistance, it is preferable that R4 represents an electron-withdrawing group and R5 and R6 represent a group having a low electron-donating property.

Among such groups, specific examples of the electron-withdrawing group as R4 are the same as the specific examples of the electron-withdrawing group as R1, and specific examples of the group having a low electron-donating property as R5 and R6 are the same as the specific examples of the group having a low electron-donating property as R2 and R3.

Specific examples of the second dichroic azo coloring agent compound are shown below, but the present invention is not limited thereto.

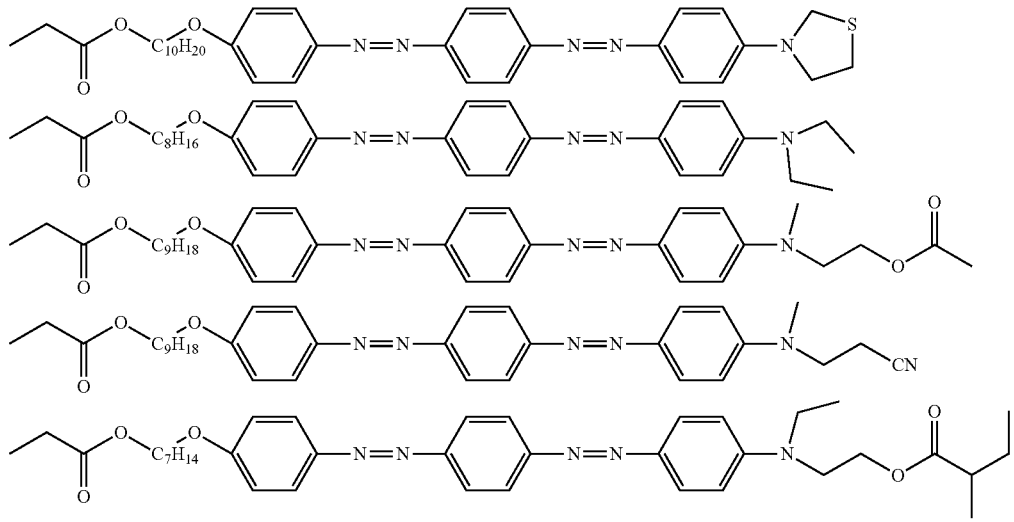

-continued
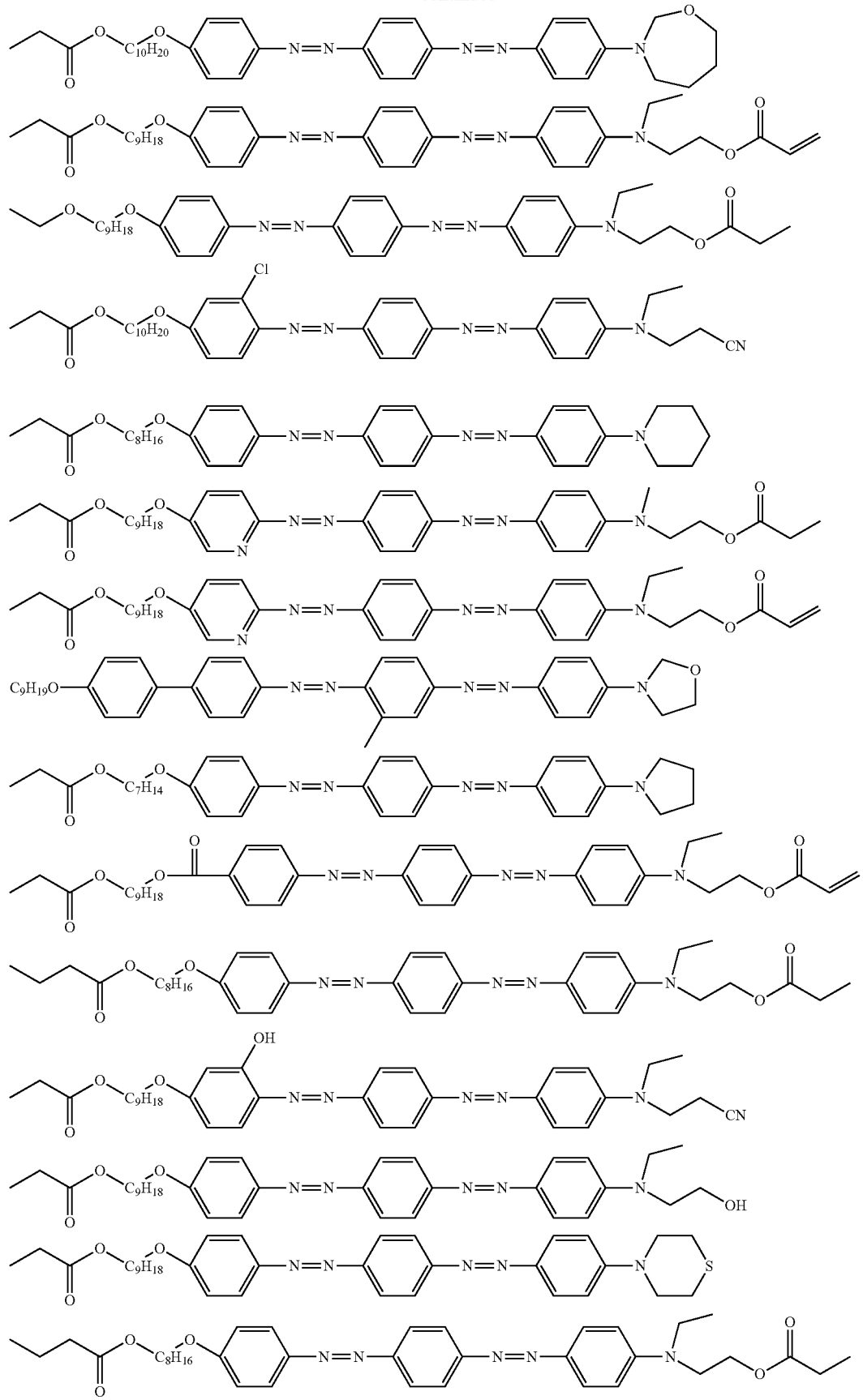

-continued
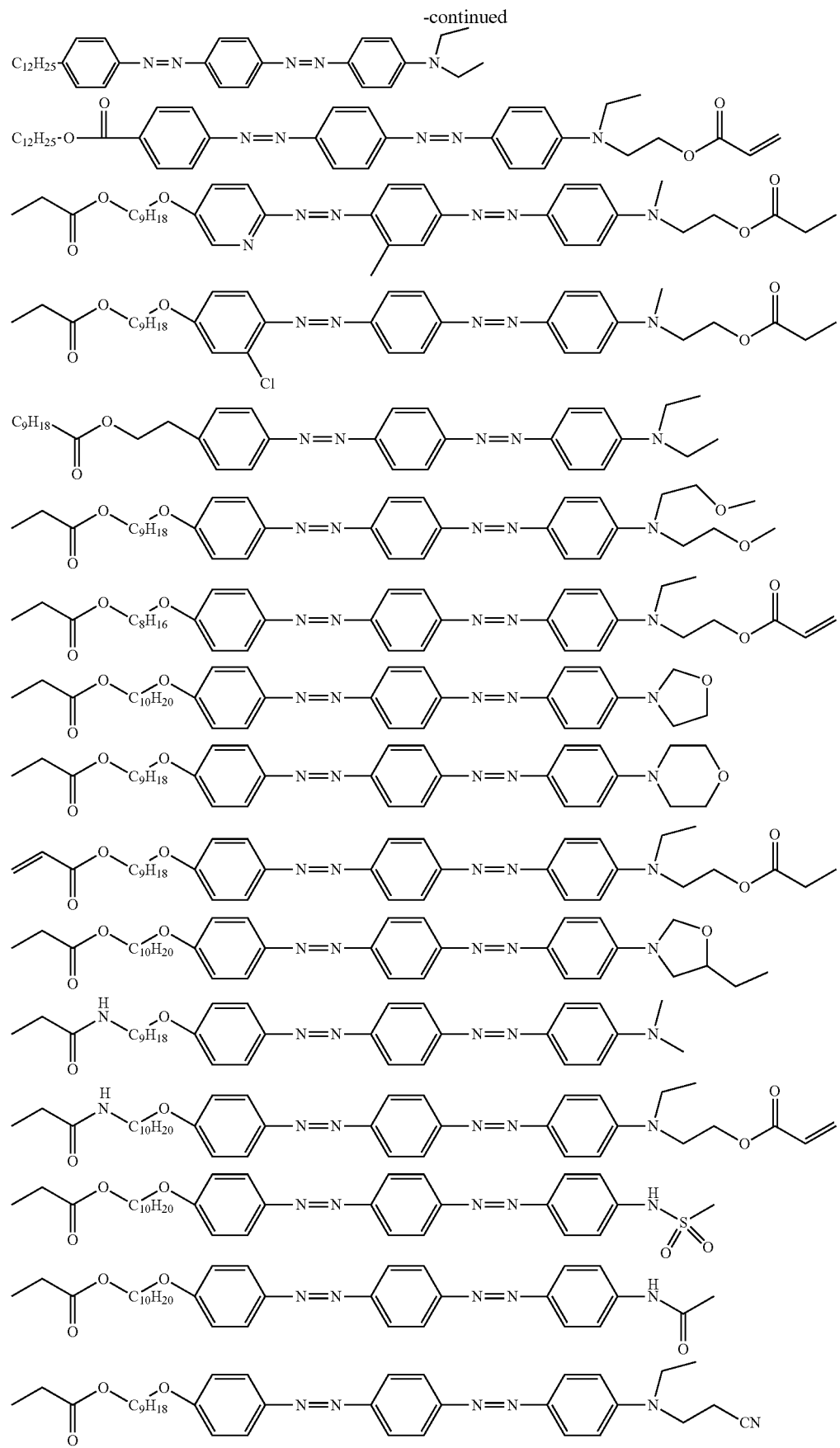

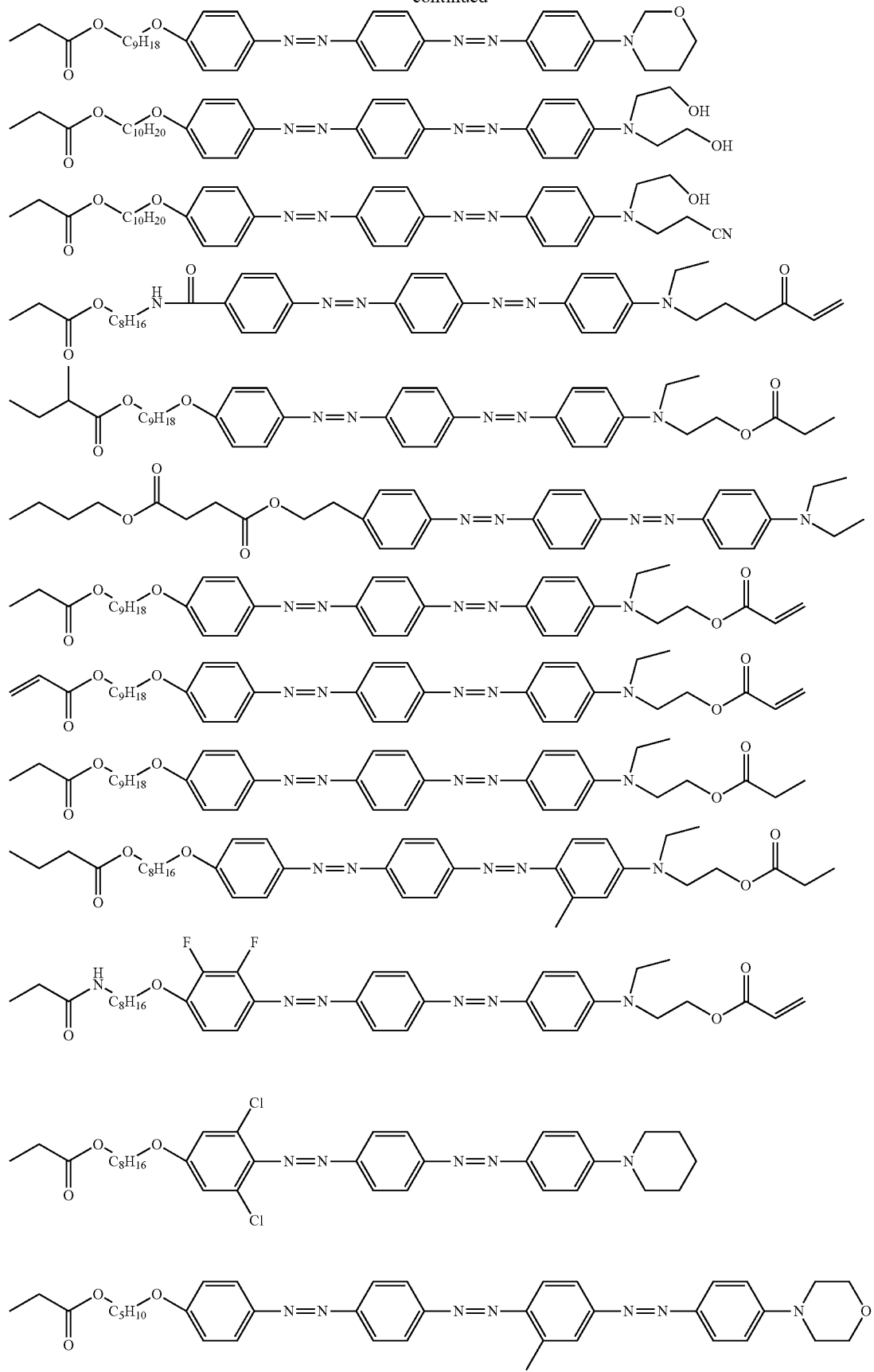

The log P value is an index expressing the hydrophilicity and the hydrophobicity of a chemical structure. An absolute value of a difference (hereinafter, also referred to as "difference in log P value") between the log P value of a side chain of the first dichroic azo coloring agent compound and the log P value of a side chain of the second dichroic azo coloring agent compound is preferably 2.30 or less, more preferably 2.0 or less, still more preferably 1.5 or less, and particularly preferably 1.0 or less. In a case where the difference in log P value is 2.30 or less, since the affinity between the first dichroic azo coloring agent compound and the second dichroic azo coloring agent compound is enhanced and an aligned structure is more easily formed, the alignment degree of the light absorption anisotropic layer is further improved.

Further, in a case where the first dichroic azo coloring agent compound or the second dichroic azo coloring agent compound has a plurality of side chains, it is preferable that at least one difference in log P value is in the above-described ranges.

Here, the side chain of the first dichroic azo coloring agent compound and the side chain of the second dichroic azo coloring agent compound denote a group bonded to the terminal of the above-described chromophore. For example, R1, R2, and R3 in Formula (1) represent a side chain in a case where the first dichroic azo coloring agent compound is a compound represented by Formula (1), and R4, R5, and R6 in Formula (2) represent a side chain in a case where the second dichroic azo coloring agent compound is a compound represented by Formula (2). Particularly in a case where the first dichroic azo coloring agent compound is a compound represented by Formula (1) and the second dichroic azo coloring agent compound is a compound represented by Formula (2), it is preferable that at least one of the difference in log P value between R1 and R4, the difference in log P value between R1 and R5, the difference in log P value between R2 and R4, or the difference in log P value between R2 and R5 is in the above-described ranges.

Here, the log P value is an index for expressing the properties of the hydrophilicity and hydrophobicity of a chemical structure and is also referred to as a hydrophilic-hydrophobic parameter. The log P value can be calculated using software such as ChemBioDraw Ultra or HSPiP (Ver. 4.1.07). Further, the logP value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

[Third Dichroic Azo Coloring Agent Compound]

The third dichroic azo coloring agent compound is a dichroic azo coloring agent compound other than the first dichroic azo coloring agent compound and the second dichroic azo coloring agent compound, and specifically, the chemical structure thereof is different from those of the first dichroic azo coloring agent compound and the second dichroic azo coloring agent compound. In a case where the light absorption anisotropic layer contains the third dichroic azo coloring agent compound, there is an advantage that the tint of the light absorption anisotropic layer is easily adjusted.

The maximum absorption wavelength of the third dichroic azo coloring agent compound is 380 nm or greater and less than 455 nm and preferably in a range of 385 to 454 nm.

As the third dichroic azo coloring agent compound, a dichroic azo coloring agent represented by Formula (6) is preferable.

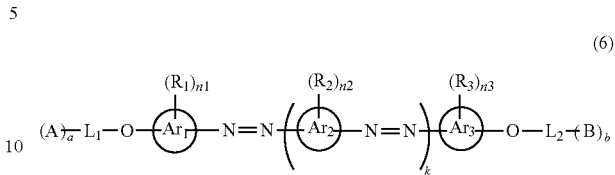

(6)

In Formula (6), A and B each independently represent a crosslinkable group.

In Formula (6), a and b each independently represent 0 or 1. From the viewpoint that the alignment degree at a wavelength of 420 nm is excellent, it is preferable that both a and b represent 0.

In Formula (6), $L_1$ represents a monovalent substituent in a case where a represents 0, and $L_1$ represents a single bond or a divalent linking group in a case where a represents 1. Further, L2 represents a monovalent substituent in a case where b represents 0, and L2 represents a single bond or a divalent linking group in a case where b represents 1.

In Formula (6), $Ar_1$ represents a (n1+2)-valent aromatic hydrocarbon group or a heterocyclic group, $Ar_2$ represents a (n2+2)-valent aromatic hydrocarbon group or a heterocyclic group, and Ara represents a (n3+2)-valent aromatic hydrocarbon group or a heterocyclic group.

In Formula (6), $R_1$, $R_2$, and $R_3$ each independently represent a monovalent substituent. A plurality of $R_1$'s may be the same as or different from each other in a case of "n1≥2", a plurality of $R_2$'s may be the same as or different from each other in a case of "n2≥2", and a plurality of R3's may be the same as or different from each other in a case of "n3≥2".

In Formula (6), k represents an integer of 1 to 4. In a case of "k≥2", a plurality of Ar2's may be the same as or different from each other and a plurality of $R_2$'s may be the same as or different from each other.

In Formula (6), n1, n2, and n3 each independently represent an integer of 0 to 4. Here, an expression of "n1+n2+n3≥0" is satisfied in a case of "k=1", and an expression of "n1+n2+n3≥1" is satisfied in a case of "k≥2".

In Formula (6), examples of the crosslinkable group represented by A and B include the polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are more preferable from the viewpoint of further improving the solubility.

In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and L2 represents a single bond or a divalent linking group in a case where b represents 1.

As the monovalent substituent represented by $L_1$ and L2, a group to be introduced to increase the solubility of the dichroic substance or a group having an electron-donating property or an electron-withdrawing property which is to be introduced to adjust the color tone of the coloring agent is preferable.

Examples of the substituent include an alkyl group (preferably an alkyl group having 1 to 20 carbon atoms, more preferably an alkyl group having 1 to 12 carbon atoms, and still more preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and still more preferably an alkenyl group having 2 to 8 carbon atoms, and examples thereof include a vinyl group, an allyl group, a 2-butenyl group, and a 3-pentenyl group), an alkynyl group (preferably an alkynyl group having 2 to 20 carbon atoms, more preferably an alkynyl group 2 to 12 carbon atoms, and still more preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and still more preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and still more preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and still more preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and still more preferably an acyloxy group having 2 to 6 carbon atoms, and examples thereof include an acetoxy group and a benzoyloxy group), an acylamino group (preferably an acylamino group having 2 to 20 carbon atoms, more preferably an acylamino group having 2 to 10 carbon atoms, and still more preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and still more preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and still more preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and still more preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and still more preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and still more preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and still more preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and still more preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and still more preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and still more preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and still more preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and still more preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a furyl group, a piperidyl group, a morpholino group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and still more preferably a silyl group having 3 to 24 carbon atoms, and examples thereof include a trimethylsilyl group and a triphenylsilyl group), a halogen atom (examples thereof include a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group. These substituents may be further substituted with these substituents. Further, in a case where two or more substituents are present, these may be the same as or different from each other. Further, these may be bonded to each other to form a ring where possible.

As the group in which the above-described substituent is further substituted with the above-described substituent, an $R_B$—$(O$—$R_A)_{na}$— group which is a group in which an alkoxy group is substituted with an alkyl group is exemplified. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, and groups in which these groups are further substituted with these groups (for example, $R_B$—$(O$—$R_A)_{na}$— group) are preferable, an alkyl group, an alkoxy group, and groups in which these groups are further substituted with these groups (for example, an $R_B$—$(O$—$R_A)_{na}$— group) are more preferable.

Examples of the divalent linking group represented by $L_1$ and $L_2$ include —O—, —S—, —CO—, —COO—, —OCO—, —O—CO—O—, —CO—$NR_N$—, —O—CO—$NR_N$—, —$NR_N$—CO—$NR_N$—, —$SO_2$—, —SO—, an alkylene group, a cycloalkylene group, an alkenylene group, and a group obtained by combining two or more of these groups.

required for directly linking "B" with the "O" atom linked to $L_2$, and "number of atoms in the main chain" denotes the number of atoms constituting the above-described portion. Further, "number of atoms in the main chain" does not include the number of atoms in a branched chain described below.

Further, in a case where A is not present, "number of the main chain of atoms" in $L_1$ denotes the number of atoms in $L_1$ that does not have a branched chain. In a case where B is not present, "number of the main chain of atoms" in $L_2$ denotes the number of atoms in $L_2$ that does not have a branched chain.

Specifically, in Formula (D1), the number of atoms in the main chain of $L_1$ is 5 (the number of atoms in the dotted frame on the left side of Formula (D1)), and the number of atoms in the main chain of $L_2$ is 5 (the number of atoms in the dotted frame on the right side of Formula (D1)). Further, in Formula (D10), the number of atoms in the main chain of $L_1$ is 7 (the number of atoms in the dotted frame on the left side of Formula (D10)), and the number of atoms in the main chain of $L_2$ is 5 (the number of atoms in the dotted frame on the right side of Formula (D10)).

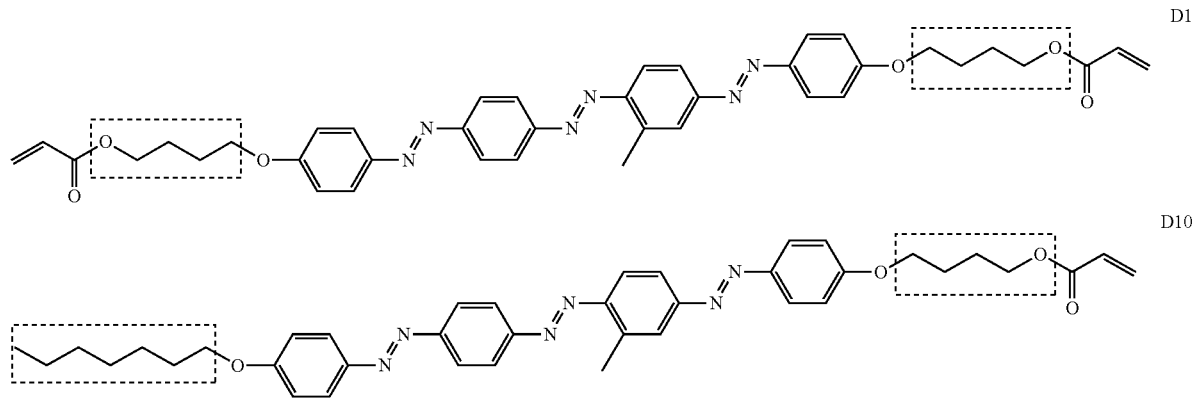

D1

D10

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same as or different from each other.

From the viewpoint of further improving the solubility of the dichroic substance, the number of atoms in the main chain of at least one of $L_1$ or $L_2$ is preferably 3 or greater, more preferably 5 or greater, still more preferably 7 or greater, and particularly preferably 10 or greater. Further, the upper limit value of the number of atoms in the main chain is preferably 20 or less and more preferably 12 or less.

In addition, from the viewpoint of further improving the alignment degree of the light absorption anisotropic layer, the number of atoms of the main chain of at least one of $L_1$ or $L_2$ is preferably in a range of 1 to 5.

Here, in a case where A is present in Formula (6), "main chain" of $L_1$ denotes a portion required for directly linking "A" with the "O" atom linked to $L_1$, and "number of atoms in the main chain" denotes the number of atoms constituting the above-described portion. Similarly, in a case where B is present in Formula (6), "main chain" of $L_2$ denotes a portion $L_1$ and $L_2$ may have a branched chain.

Here, in a case where A is present in Formula (6), "branched chain" of $L_1$ denotes a portion other than a portion required for directly linking "A" with the "O" atom linked to $L_1$ in Formula (6). Similarly, in a case where B is present in Formula (6), "branched chain" of $L_2$ denotes a portion other than a portion required for directly linking "B" with the "O" atom linked to $L_2$ in Formula (6).

Further, in a case where A is not present in Formula (6), "branched chain" of $L_1$ denotes a portion other than the longest atomic chain (that is, the main chain) extending from the "O" atom linked to $L_1$ in Formula (6) which is the starting point. Similarly, in a case where B is not present in Formula (6), "branched chain" of $L_2$ denotes a portion other than the longest atomic chain (that is, the main chain) extending from the "O" atom linked to $L_2$ in Formula (6) which is a starting point.

The number of atoms in the branched chain is preferably 3 or less. In a case where the number of atoms in the branched chain is set to 3 or less, there is an advantage that the alignment degree of the light absorption anisotropic layer is further improved. Further, the number of atoms in the branched chain does not include the number of hydrogen atoms.

In Formula (6), $Ar_1$ represents an (n1+2)-valent (for example, trivalent in a case where n1 represents 1) aromatic hydrocarbon group or heterocyclic group, $Ar_2$ represents an (n2+2)-valent (for example, trivalent in a case where n2 represents 1) aromatic hydrocarbon group or heterocyclic group, and $Ar_3$ represents an (n3+2)-valent (for example, trivalent in a case where n3 represents 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below).

The divalent aromatic hydrocarbon group represented by $Ar_1$ to $Ar_3$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group).

Specific examples of the divalent aromatic hydrocarbon group include a phenylene group, an azulene-diyl group, a naphthylene group, a fluorene-diyl group, an anthracene-diyl group, and a tetracene-diyl group. From the viewpoint of further improving the solubility, a phenylene group or a naphthylene group is preferable, and a phenylene group is more preferable.

Specific examples of the third dichroic azo coloring agent compound are shown below, but the present invention is not limited thereto. In the following specific examples, n represents an integer of 1 to 10.

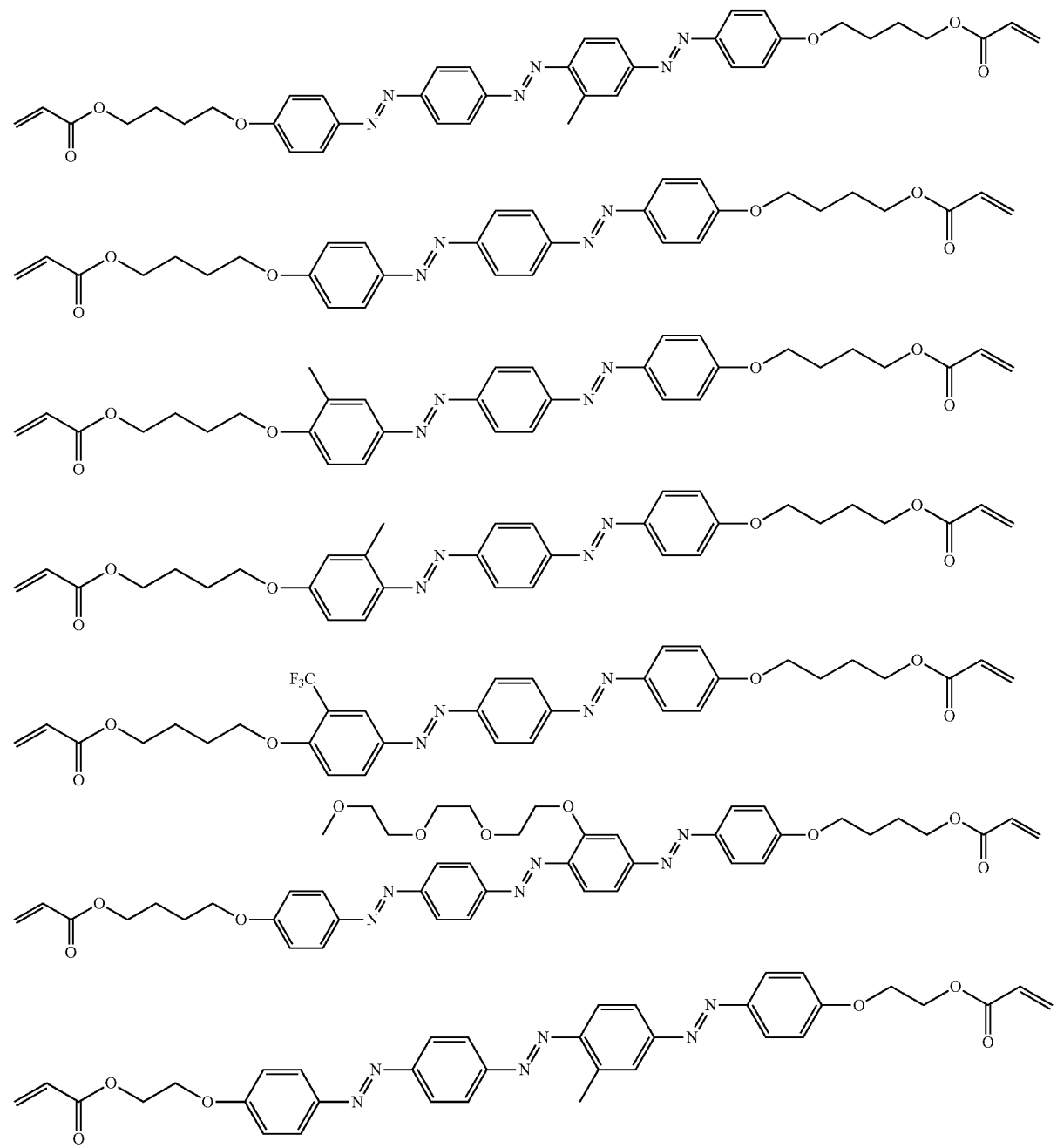

-continued
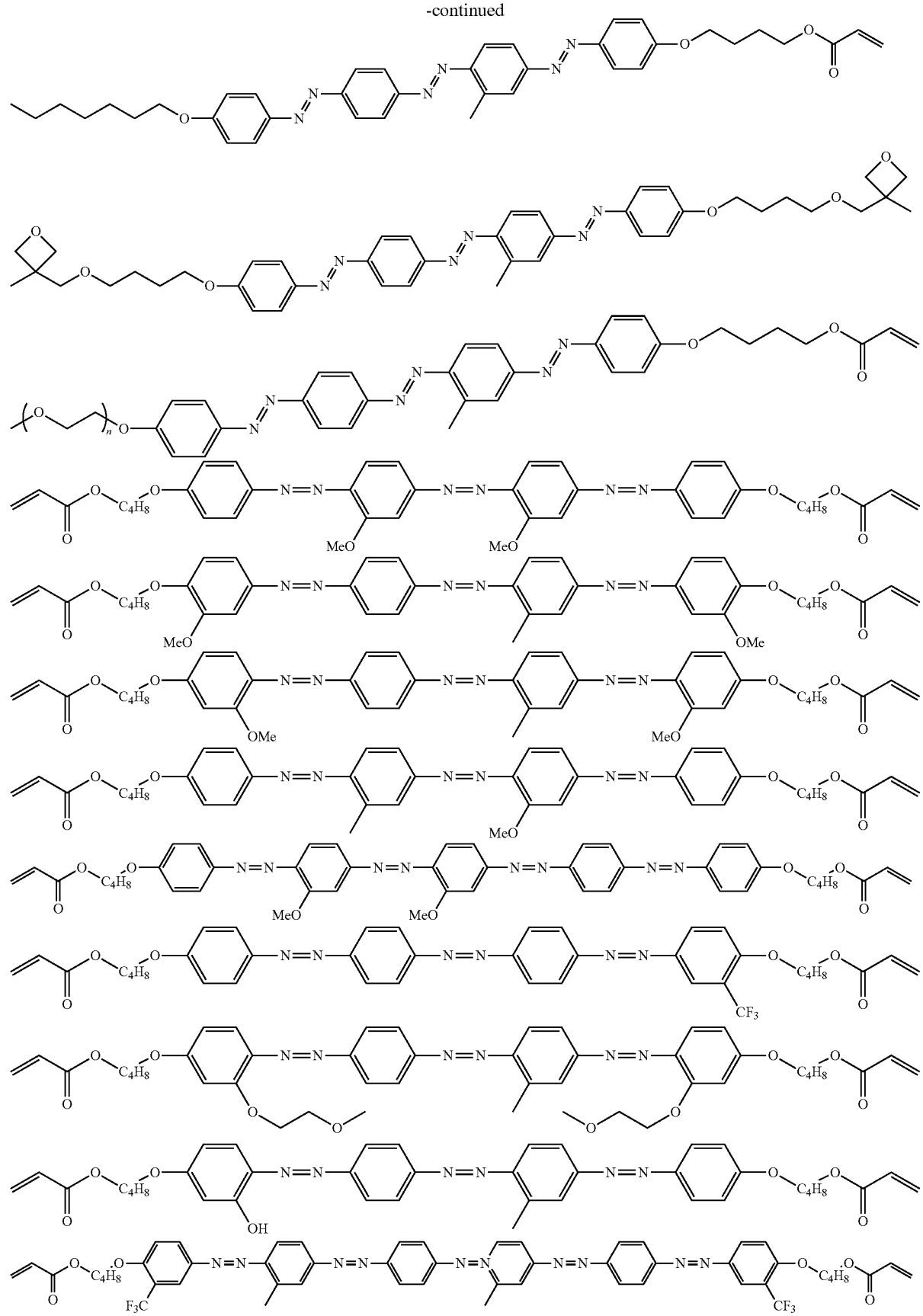

From the viewpoint that the alignment degree at a wavelength of 420 nm is excellent, it is preferable that the third dichroic azo coloring agent compound does not contain a radically polymerizable group. Examples thereof include the following structures.

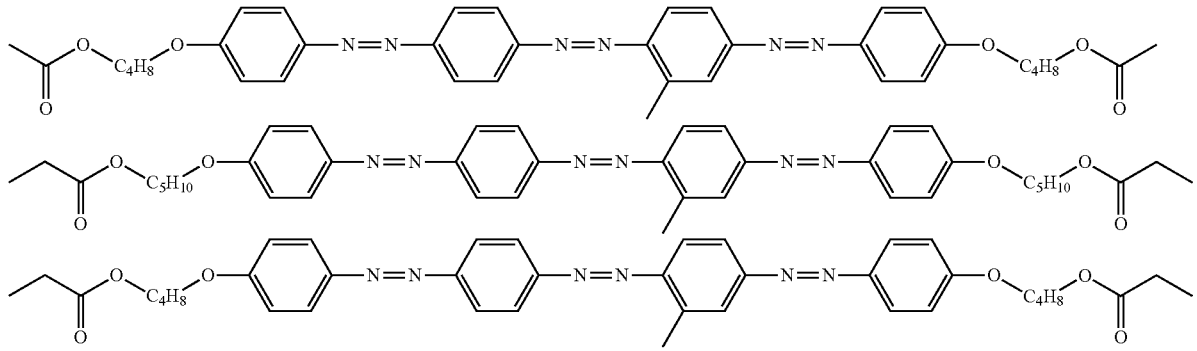

From the viewpoint that the alignment degree at a wavelength of 420 nm is particularly excellent, it is more preferable that the third dichroic azo coloring agent compound is a dichroic substance having a structure represented by Formula (1-1).

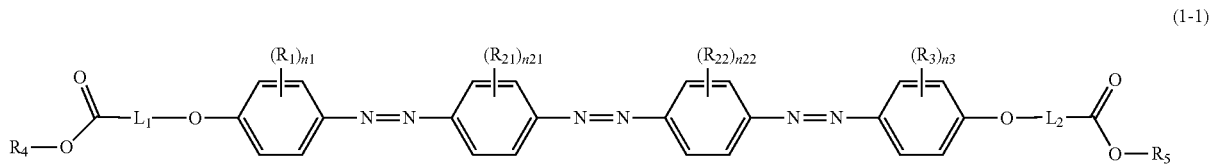

(1-1)

In Formula (1-1), $R_1$, $R_3$, $R_4$, $R_5$, n1, n3, $L_1$, and $L_2$ each have the same definition as that for $R_1$, $R_3$, $R_4$, $R_5$, n1, n3, $L_1$, and $L_2$ of Formula (1).

In Formula (1-1), $R_{21}$ and $R_{22}$ each have the same definition as that for $R_2$ in Formula (1).

In Formula (1-1), n21 and n22 each have the same definition as that for n2 in Formula (1).

An expression of "n1+n21+n22+n3≥1" is satisfied, and "n1+n21+n22+n3" is preferably in a range of 1 to 9 and more preferably in a range of 1 to 5.

Specific examples of the dichroic substance will be described below, but the present invention is not limited thereto.

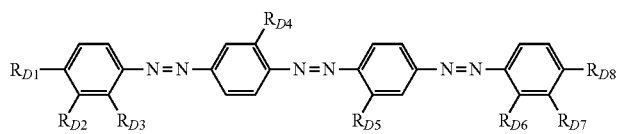

| No | $R_{D1}$ | $R_{D2}$ | $R_{D3}$ | $R_{D4}$ | $R_{D5}$ | $R_{D6}$ | $R_{D7}$ | $R_{D8}$ |
|---|---|---|---|---|---|---|---|---|
| D1 | $OC_4H_8C(O)OCH_2CH_3$ | H | H | H | $CH_3$ | H | H | $OC_4H_8C(O)OCH_2CH_3$ |
| D2 | $OC_4H_8C(O)OCH_3$ | H | H | H | $CH_3$ | H | H | $OC_4H_8C(O)OCH_3$ |
| D3 | $OC_4H_8C(O)OCH_2CH_3$ | H | H | H | $CH_3$ | H | H | $OC_{11}H_{23}$ |
| D4 | $OC_4H_8C(O)OCH_2CH_3$ | H | H | H | $CH_3$ | H | H | $OC_5H_{11}$ |
| D5 | $OC_4H_8C(O)OCH_2CH_3$ | H | H | H | $CH_3$ | H | H | $OCH_2CH_3$ |
| D6 | $OC_4H_8C(O)OCH_2CH_3$ | H | H | H | $CH_3$ | H | Cl | $OC_4H_8C(O)OCH_2CH_3$ |
| D7 | $OC_3H_6C(O)OCH_2CH_3$ | H | H | H | $CH_3$ | H | H | $OC_3H_6C(O)OCH_2CH_3$ |
| D8 | $OC_3H_6C(O)OCH_2CH_3$ | H | H | Cl | H | Cl | H | $OC_3H_6C(O)OCH_2CH_3$ |
| D9 | $OC_9H_{18}C(O)OCH_2CH_3$ | H | H | H | $CH_3$ | H | H | $OC_9H_{18}C(O)OCH_2CH_3$ |
| D10 | $OC_4H_8C(O)OCH_2CH=CH_2$ | H | H | H | $CH_3$ | H | H | $OC_4H_8C(O)OCH_2CH=CH_2$ |
| D11 | $OC_4H_8O(O)OCH_2CH_3$ | H | H | H | Cl | H | H | $OC_4H_8C(O)OCH_2CH_3$ |
| D12 | $OC_5H_4C(O)OCH_2CH_3$ | H | H | H | $CH_3$ | H | H | $OC_5H_4C(O)OCH_2CH_3$ |

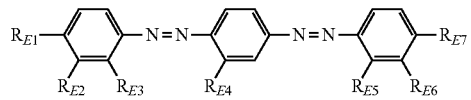

| No | $R_{E1}$ | $R_{E2}$ | $R_{E3}$ | $R_{E4}$ | $R_{E5}$ | $R_{E6}$ | $R_{E7}$ |
|---|---|---|---|---|---|---|---|
| E1 | OC$_4$H$_8$C(O)OCH$_2$CH$_3$ | H | H | H | H | H | OC$_4$H$_8$C(O)OCH$_2$CH$_3$ |
| E2 | OC$_4$H$_8$C(O)OCH$_3$ | H | H | H | H | H | OC$_4$H$_8$C(O)OCH$_3$ |
| E3 | OC$_4$H$_8$C(O)OCH$_2$CH$_3$ | Cl | H | H | H | Cl | OC$_4$H$_8$C(O)OCH$_2$CH$_3$ |
| E4 | OC$_4$H$_8$C(O)OCH$_2$CH$_3$ | H | H | H | H | Cl | O$_5$CH$_{11}$ |
| E5 | OC$_4$H$_8$C(O)OCH$_2$CH$_3$ | H | H | CH$_3$ | H | H | OCH$_2$CH$_3$ |
| E6 | OC$_3$H$_6$C(O)OCH$_2$CH$_3$ | H | H | H | H | H | OC$_3$H$_6$C(O)OCH$_2$CH$_3$ |
| E7 | OC$_9$H$_{18}$O(O)OCH$_2$CH$_3$ | H | H | H | H | H | OC$_9$H$_{18}$O(O)OCH$_2$CH$_3$ |
| E8 | OC$_4$H$_8$C(O)OCH$_2$CH=CH$_2$ | H | H | H | H | H | OC$_4$H$_8$C(O)OCH$_2$CH=CH$_2$ |

| No | $R_{F1}$ | $R_{F2}$ | $R_{F3}$ | $R_{F4}$ | $R_{F5}$ | $R_{F6}$ |
|---|---|---|---|---|---|---|
| F1 | OC$_4$H$_8$C(O)OCH$_2$CH$_3$ | H | H | OC$_4$H$_8$C(O)OCH$_2$CH$_3$ | H | H |
| F2 | OC$_4$H$_8$C(O)OCH$_3$ | H | CH$_3$ | OC$_4$H$_8$C(O)OCH$_3$ | H | H |
| F3 | OC$_3$H$_6$C(O)OCH$_2$CH$_3$ | H | H | OC$_3$H$_6$C(O)OCH$_2$CH$_3$ | H | Cl |

The content of the dichroic substance is preferably in a range of 5% to 30% by mass, more preferably in a range of 10% to 28% by mass, and still more preferably in a range of 20% to 26% by mass with respect to the total mass of the light absorption anisotropic layer. In a case where the content of the dichroic substance is in the above-described ranges, a light absorption anisotropic layer having a high alignment degree can be obtained even in a case where the light absorption anisotropic layer is formed into a thin film. Therefore, a light absorption anisotropic layer having excellent flexibility is likely to be obtained.

From the viewpoint of increasing the contrast between the illuminance at the center of the viewing angle and the illuminance in a direction deviated from the center of the viewing angle, the content of the dichroic substance in the light absorption anisotropic layer per unit area is preferably 0.2 g/m$^2$ or greater, more preferably 0.3 g/m$^2$ or greater, and still more preferably 0.5 g/m$^2$ or greater. The upper limit thereof is not particularly limited, but is 1.0 g/m$^2$ or less in many cases.

The content of the first dichroic azo coloring agent compound is preferably in a range of 40 to 90 parts by mass and more preferably in a range of 45 to 75 parts by mass with respect to 100 parts by mass of the total content of the dichroic substance in the light absorption anisotropic layer.

The content of the second dichroic azo coloring agent compound is preferably in a range of 6 to 50 parts by mass and more preferably in a range of 8 to 35 parts by mass with respect to 100 parts by mass of the total content of the dichroic substance in the light absorption anisotropic layer.

The content of the third dichroic azo coloring agent compound is preferably in a range of 3 to 35 parts by mass and more preferably in a range of 5 to 35 parts by mass with respect to 100 parts by mass of the content of the dichroic azo coloring agent compound in the light absorption anisotropic layer.

The content ratio between the first dichroic azo coloring agent compound, the second dichroic azo coloring agent compound, and the third dichroic azo coloring agent compound used as necessary can be optionally set in order to adjust the tint of the light absorption anisotropic layer. However, the content ratio of the second dichroic azo coloring agent compound to the first dichroic azo coloring agent compound (second dichroic azo coloring agent compound/first dichroic azo coloring agent compound) is preferably in a range of 0.1 to 10, more preferably in a range of 0.2 to 5, and particularly preferably in a range of 0.3 to 0.8 in terms of moles. In a case where the content ratio of the second dichroic azo coloring agent compound to the first dichroic azo coloring agent compound is in the above-described ranges, the alignment degree is increased.

The light absorption anisotropic layer in the present invention can be prepared, for example, by using a composition for forming a light absorption anisotropic layer which contains the liquid crystal compound and the dichroic substance described above.

The composition for forming a light absorption anisotropic layer may contain components other than the liquid crystal compound and the dichroic substance, and examples thereof include a solvent, a vertical alignment agent, an interface improver, a polymerizable component, and a polymerization initiator (such as a radical polymerization initiator). In this case, the light absorption anisotropic layer in the present invention contains a solid component other than a liquid component (such as a solvent).

(Interface Improver)

As the interface improver, the interface improver described in the columns of the examples described below can be used.

In a case where the composition for forming a light absorption anisotropic layer contains an interface improver, the content of the interface improver is preferably in a range of 0.001 to 5 parts by mass with respect to 100 parts by mass of the total amount of the dichroic substance and the liquid crystal compound in the composition for forming a light absorption anisotropic layer.

(Polymerizable Component)

Examples of the polymerizable component include a compound containing an acrylate (such as an acrylate monomer). In this case, the light absorption anisotropic layer in the present invention contains a polyacrylate obtained by polymerizing the compound containing an acrylate.

Examples of the polymerizable component include the compounds described in paragraph [0058] of JP2017-122776A.

In a case where the composition for forming a light absorption anisotropic layer contains a polymerizable component, the content of the polymerizable component is preferably in a range of 3 to 20 parts by mass with respect to 100 parts by mass of the total content of the dichroic substance and the liquid crystal compound in the composition for forming a light absorption anisotropic layer.
(Vertical Alignment Agent)

Examples of the vertical alignment agent include a boronic acid compound and an onium salt.

As the boronic acid compound, a compound represented by Formula (30) is preferable.

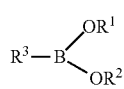

Formula (30)

In Formula (30), $R^1$ and $R^2$ each independently represent a hydrogen atom, a substituted or unsubstituted aliphatic hydrocarbon group, a substituted or unsubstituted aryl group, or a substituted or unsubstituted heterocyclic group.

$R^3$ represents a substituent containing a (meth)acryl group.

Specific examples of the boronic acid compound include a boronic acid compound represented by General Formula (I) described in paragraphs [0023] to [0032] of JP2008-225281A.

As the boronic acid compound, compounds shown below are also preferable.

In Formula (31), the ring A represents a quaternary ammonium ion consisting of a nitrogen-containing heterocyclic ring. $X^-$ represents an anion. L' represents a divalent linking group. $L^2$ represents a single bond or a divalent linking group. Y' represents a divalent linking group having a 5- or 6-membered ring as a partial structure. Further, Z represents a divalent linking group containing an alkylene group having 2 to 20 carbon atoms as a partial structure. Further, $P^1$ and $P^2$ each independently represent a monovalent substituent having a polymerizable ethylenically unsaturated bond.

Specific examples of the onium salt include the onium salts described in paragraphs [0052] to [0058] of JP2012-208397A, the onium salts described in paragraphs [0024] to [0055] of JP2008-026730A, and the onium salts described in JP2002-037777A.

The content of the vertical alignment agent in the composition for forming a light absorption anisotropic layer (light absorption anisotropic layer) is preferably in a range of 0.1% to 400% by mass and more preferably in a range of 0.5% to 350% by mass with respect to the total mass of the liquid crystal compound.

The vertical alignment agent may be used alone or in combination of two or more kinds thereof. In a case where two or more kinds of vertical alignment agents are used, the total amount thereof is preferably in the above-described ranges.

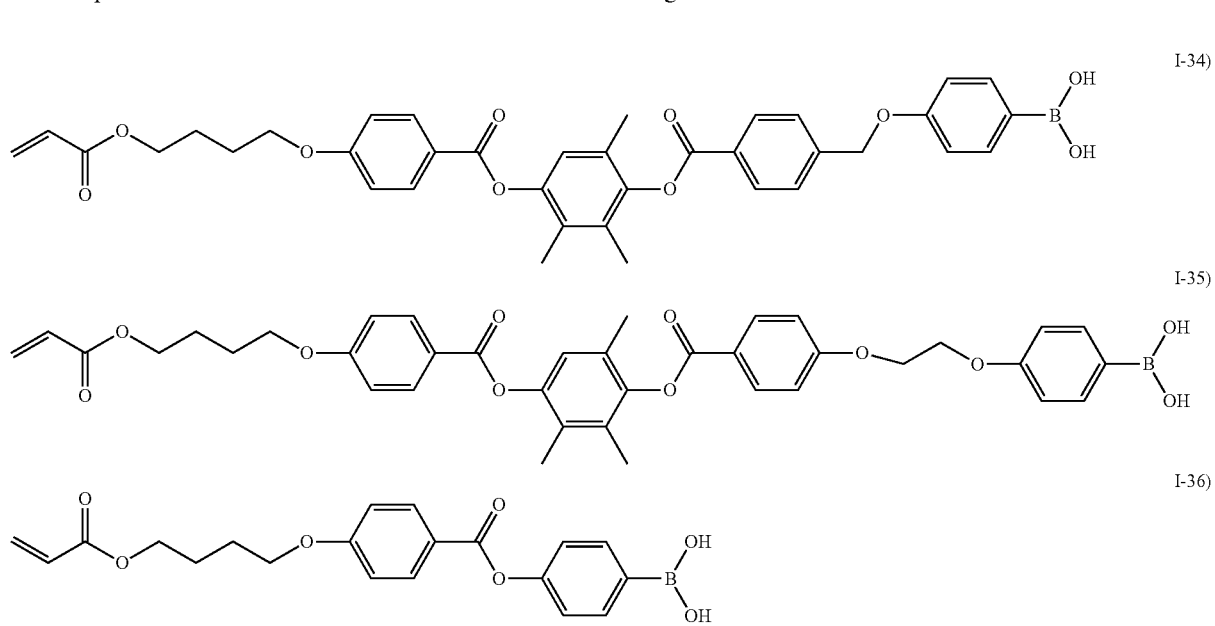

As the onium salt, a compound represented by Formula (31) is preferable.
Formula (31)

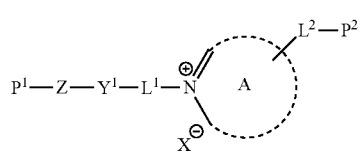

(Leveling Agent Suitable for Vertical Alignment)

It is preferable that the composition for forming a light absorption anisotropic layer (light absorption anisotropic layer) contains the following leveling agents. In a case where the composition for forming a light absorption anisotropic layer (light absorption anisotropic layer) contains a leveling agent, the surface roughness due to dry air applied to the surface of the light absorption anisotropic layer is suppressed, and the dichroic substance is more uniformly aligned.

The leveling agent is not particularly limited, and a leveling agent having a fluorine atom (fluorine-based leveling agent) or a leveling agent having a silicon atom (silicon-based leveling agent) is preferable, and a fluorine-based leveling agent is more preferable.

Examples of the fluorine-based leveling agent include fatty acid esters of polyvalent carboxylic acids in which a part of a fatty acid is substituted with a fluoroalkyl group and polyacrylates having a fluoro substituent. Particularly in a case where a rod-like compound is used as the dichroic substance and the liquid crystal compound, a leveling agent having a repeating unit derived from a compound represented by Formula (40) is preferable from the viewpoint of promoting the vertical alignment of the dichroic substance and the liquid crystal compound.

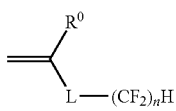

Formula (40)

$R^0$ represents a hydrogen atom, a halogen atom, or a methyl group.

L represents a divalent linking group. It is preferable that L represents an alkylene group having 2 to 16 carbon atoms, and optional —$CH_2$— that is not adjacent to the alkylene group may be substituted with —O—, —COO—, —CO—, or —CONH—.

n represents an integer of 1 to 18.

The leveling agent having a repeating unit derived from a compound represented by Formula (40) may further have other repeating units.

Examples of the other repeating units include a repeating unit derived from a compound represented by Formula (41).

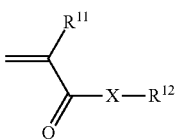

Formula (41)

$R^{11}$ represents a hydrogen atom, a halogen atom, or a methyl group.

X represents an oxygen atom, a sulfur atom, or —N($R^{13}$)—. $R^{13}$ represents a hydrogen atom or an alkyl group having 1 to 8 carbon atoms.

$R^{12}$ represents a hydrogen atom, an alkyl group which may have a substituent, or an aromatic group which may have a substituent. Further, the number of carbon atoms of the alkyl group is preferably in a range of 1 to 20. The alkyl group may be any of linear, branched, or cyclic.

Further, examples of the substituent that the alkyl group may have include a poly(alkyleneoxy) group and a polymerizable group. The definition of the polymerizable group is as described above.

In a case where the leveling agent has a repeating unit derived from a compound represented by Formula (40) and a repeating unit derived from a compound represented by Formula (41), the content of the repeating unit derived from the compound represented by Formula (40) is preferably in a range of 10% to 90% by mole and more preferably in a range of 15% to 95% by mole with respect to all the repeating units of the leveling agent.

In the case where the leveling agent has a repeating unit derived from a compound represented by Formula (40) and a repeating unit derived from a compound represented by Formula (41), the content of the repeating unit derived from the compound represented by Formula (41) is preferably in a range of 10% to 90% by mole and more preferably in a range of 5% to 85% by mole with respect to all the repeating units of the leveling agent.

Further, examples of the leveling agent include a leveling agent having a repeating unit derived from a compound represented by Formula (42) in place of the repeating unit derived from a compound represented by Formula (40).

Formula (42)

$R^2$ represents a hydrogen atom, a halogen atom, or a methyl group.

$L^2$ represents a divalent linking group.

n represents an integer of 1 to 18.

Specific examples of the leveling agent include the compounds described in paragraphs [0046] to [0052] of JP2004-331812A and the compounds described in paragraphs [0038] to [0052] of JP2008-257205A.

The content of the leveling agent in the composition for forming a light absorption anisotropic layer (light absorption anisotropic layer) is preferably in a range of 0.001% to 10% by mass and more preferably in a range of 0.01% to 5% by mass with respect to the total mass of the liquid crystal compound.

The leveling agent may be used alone or in combination of two or more kinds thereof. In a case where two or more leveling agents are used, it is preferable that the total amount thereof is in the above-described ranges.

(Polymerization Initiator)

It is preferable that the composition for forming a light absorption anisotropic layer contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-027384A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the composition for forming a light absorption anisotropic layer contains a polymerization initiator, the content of the polymerization initiator is preferably in a range of 0.01 to 30 parts by mass and more preferably in a range of 0.1 to 15 parts by mass with respect to 100 parts by mass of the total amount of the dichroic substance and the liquid crystal compound in the composition for forming a light absorption anisotropic layer. The durability of the light absorption anisotropic layer is enhanced in a case where the content of the polymerization initiator is 0.01 parts by mass or greater, and the alignment degree of the light absorption anisotropic layer is further enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

(Solvent)

From the viewpoints of the workability and the like, it is preferable that the composition for forming a light absorption anisotropic layer contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tertrahydropyran, and dioxolanes), aliphatic hydrocarbons (such as hexane), alicyclic hydrocarbons (such as cyclohexane), aromatic hydrocarbons (such as benzene, toluene, xylene, and trimethylbenzene), carbon halides (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, from the viewpoint of exhibiting the effect of the excellent solubility, ketones (particularly cyclopentanone and cyclohexanone), ethers (particularly tetrahydrofuran, cyclopentyl methyl ether, tetrahydropyran, and dioxolan), and amides (particularly dimethylformamide, dimethylacetamide, N-methylpyrrolidone, and N-ethylpyrrolidone) are preferable.

In a case where the composition for forming a light absorption anisotropic layer contains a solvent, the content of the solvent is preferably in a range of 80% to 99% by mass, more preferably in a range of 83% to 97% by mass, and still more preferably in a range of 85% to 95% by mass with respect to the total mass of the composition for forming a light absorption anisotropic layer.

These solvents may be used alone or in combination of two or more kinds thereof. In a case where the composition contains two or more kinds of solvents, it is preferable that the total amount of the solvents is in the above-described range.

<Method of Forming Light Absorption Anisotropic Layer>

A method of forming the light absorption anisotropic layer is not particularly limited, and examples thereof include a method of sequentially performing a step of applying a composition for forming a light absorption anisotropic layer to form a coating film (hereinafter, also referred to as "coating film forming step") and a step of aligning liquid crystal components contained in the coating film (hereinafter, also referred to as "aligning step").

Further, the liquid crystal component is a component that also includes a dichroic substance having liquid crystallinity in a case where the above-described dichroic substance has liquid crystallinity, in addition to the above-described liquid crystal compound.

The light absorption anisotropic layer is preferably a layer formed of the composition for forming a light absorption anisotropic layer and more preferably a layer (cured layer) obtained by performing a curing treatment on the coating film formed of the composition for forming a light absorption anisotropic layer.

(Coating Film Forming Step)

The coating film forming step is a step of applying a composition for forming a light absorption anisotropic layer to form a coating film.

The composition for forming a light absorption anisotropic layer can be easily applied by using the composition for forming a light absorption anisotropic layer which contains the above-described solvent or using a liquid such as a melt obtained by heating the composition for forming a light absorption anisotropic layer.

Further, it is preferable that the content of various components contained in the composition for forming the light absorption anisotropic layer is adjusted to the content of each component in the above-described light absorption anisotropic layer.

Examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Aligning Step)

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal component contained in the composition for forming a light absorption anisotropic layer may be aligned by the coating film forming step or the drying treatment described above. For example, in an embodiment in which the composition for forming a light absorption anisotropic layer is prepared as a coating solution containing a solvent, a coating film having light absorption anisotropy (that is, a light absorption anisotropic layer) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic layer.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

The light absorption anisotropic layer can be obtained by performing the above-described steps.

In the present aspect, examples of the method of aligning the liquid crystal component contained in the coating film include a drying treatment and a heat treatment, but the method is not limited thereto, and the liquid crystal component can be aligned by a known alignment treatment.

(Other Steps)

The method of forming the light absorption anisotropic layer may include a step of curing the light absorption anisotropic layer after the aligning step (hereinafter, also referred to as a "curing step").

The curing step is performed by heating the light absorption anisotropic layer and/or irradiating the layer with light (exposing the layer to light), for example, in a case where the light absorption anisotropic layer contains a crosslinkable group (polymerizable group). Between these, it is preferable that the curing step is performed by irradiating the film with light.

Various light sources such as infrared rays, visible light, and ultraviolet light (ultraviolet rays) can be used as the light source for curing, but ultraviolet rays are preferable. In addition, ultraviolet rays may be applied while the layer is heated during curing, or ultraviolet rays may be applied through a filter that transmits only a specific wavelength.

In a case where the exposure is performed while the layer is heated, the heating temperature during the exposure depends on the transition temperature of the liquid crystal components contained in the liquid crystal film to a liquid crystal phase, but is preferably in a range of 25° to 140° C.

Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

The thickness of the light absorption anisotropic layer is not particularly limited, but is preferably in a range of 100 to 8000 nm and more preferably in a range of 300 to 5000 nm from the viewpoint of reducing the size and the weight.

<Polarizer>

The polarizer used in the present invention is not particularly limited as long as the polarizer is a member having a function of converting light into specific linearly polarized light, and known polarizers of the related art can be used.

Examples of the polarizer include an iodine-based polarizer, a dye-based polarizer formed of a dichroic dye, and a polyene-based polarizer. Examples of the iodine-based polarizer and the dye-based polarizer include a coating type polarizer and a stretching type polarizer, and both polarizers can be applied. A polarizer in which a dichroic organic coloring agent is aligned by using alignment of the liquid crystal compound is preferable as the coating type polarizer, and a polarizer prepared by adsorbing iodine or a dichroic dye on polyvinyl alcohol and stretching the polyvinyl alcohol is preferable as the stretching type polarizer.

Further, examples of the method of obtaining a polarizer by stretching and dyeing a laminated film in which a polyvinyl alcohol layer is formed on a base material include methods described in JP5048120B, JP5143918B, JP5048120B, JP4691205B, JP4751481B, and JP4751486B, and known techniques related to these polarizers can also be preferably used.

Among these, from the viewpoints of the availability and the excellent degree of polarization, a polarizer containing a polyvinyl alcohol-based resin (a polymer having —$CH_2$—CHOH— as a repeating unit, particularly at least one selected from the group consisting of polyvinyl alcohol and an ethylene-vinyl alcohol copolymer) is preferable.

The thickness of the polarizer is not particularly limited, but is preferably in a range of 3 to 60 µm, more preferably in a range of 5 to 20 µm, and still more preferably in a range of 5 to 10 µm.

<Retardation Layer>

As described above, the viewing angle control system according to the embodiment of the present invention may include a retardation layer.

The in-plane retardation Re of the retardation layer at a wavelength of 550 nm is not particularly limited, but is preferably greater than 60 nm, more preferably in a range of 100 to 250 nm, and still more preferably in a range of 150 to 200 nm.

Further, the Nz coefficient of the retardation layer 20 is not particularly limited, but is preferably 1.5 or greater, more preferably in a range of 2.0 to 10.0, and still more preferably in a range of 3.0 to 5.0.

It is preferable that the retardation Rth of the retardation layer at a wavelength of 550 nm in the thickness direction is set such that both the Re and the Nz coefficient are set to be in the above-described preferable ranges, and specifically, the retardation Rth thereof is preferably greater than 60 nm.

Further, the azimuthal angle of the slow axis 21 of the retardation layer 20 illustrated in FIG. 1 is preferably in a range of −10° to 10°, more preferably in a range of −5° to 5°, and still more preferably 0° (that is, parallel to the absorption axis 31) in a case where the direction of the absorption axis of the polarizer is set to 0° as a reference. In other words, the angle between the slow axis (in-plane slow axis) of the retardation layer 20 and the absorption axis of the polarizer is preferably in a range of 0° to 10°, more preferably in a range of 0° to 5°, and still more preferably 0°.

The azimuthal angle is represented by a positive angle value in the counterclockwise direction and a negative angle value in the clockwise direction with reference to the absorption axis of the polarizer as the viewing angle control system is observed from the light absorption anisotropic layer side.

As the retardation layer, a B-plate having an Nz coefficient of 1.5 or greater is preferable.

<Transparent Base Material Film>

The viewing angle control system according to the embodiment of the present invention may include a transparent base material film.

The transparent base material film may be used as a base material for forming the light absorption anisotropic layer or may be used as a film for protecting the light absorption anisotropic layer. The transparent base material film may also serve as a retardation layer.

As the transparent base material film, known transparent resin films, transparent resin plates, transparent resin sheets, and the like can be used without particular limitation.

Preferred examples of the transparent resin film include a cellulose acylate film (such as a cellulose triacetate film (refractive index of 1.48), a cellulose diacetate film, a cellulose acetate butyrate film, or a cellulose acetate propionate film), a polyethylene terephthalate film, a polyether sulfone film, a polyurethane-based resin film, a polyester film, a polycarbonate film, a polysulfone film, a polyether film, a polymethylpentene film, a polyether ketone film, a (meth)acrylonitrile film, a cycloolefin-based polymer film (polymer film formed of a cycloolefin-based polymer), a polycarbonate-based polymer film, a polystyrene-based polymer film, and an acrylic polymer film. It is preferable that the acrylic polymer film contains an acrylic polymer having at least one unit selected from a lactone ring unit, a maleic acid anhydride unit, or a glutaric anhydride unit.

The thickness of the transparent base material film is preferably in a range of 20 to 100 µm.

In the present invention, it is preferable that the transparent base material film is a cellulose ester-based film having a film thickness of 20 to 70 µm.

<Alignment Layer>

The viewing angle control system according to the embodiment of the present invention may include an alignment layer between the transparent base material film and the light absorption anisotropic layer.

The alignment layer may be any layer as long as the dichroic substance can be made to be in a desired alignment state on the alignment layer.

Examples of the alignment layer include a film formed of a polyfunctional acrylate compound and a film containing polyvinyl alcohol. Among these, the film containing polyvinyl alcohol is preferable.

In a case of inclining an alignment axis, for example, the alignment axis can be inclined by irradiating the photoalignment layer containing a photoalignment compound such as an azo compound or a cinnamoyl compound with UV light in an oblique direction, and as a result, the transmittance central axis can be inclined with respect to the film normal direction (the normal direction with respect to the surface of the light absorption anisotropic layer).

<Barrier Layer>

It is also preferable that the viewing angle control system according to the embodiment of the present invention includes a barrier layer together with the light absorption anisotropic layer.

Here, the barrier layer is also referred to as a gas blocking layer (oxygen blocking layer) and has a function of protecting the light absorption anisotropic layer of the present invention from gas such as oxygen in the atmosphere, the moisture, or the compound contained in an adjacent layer.

As the barrier layer, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

<Refractive Index Adjusting Layer>

In the viewing angle control system according to the embodiment of the present invention, the above-described light absorption anisotropic layer contains a dichroic substance, and internal reflection due to the high refractive index of the light absorption anisotropic layer may be a problem. In that case, it is preferable that the refractive index adjusting layer is present. The refractive index adjusting layer is a layer disposed to come into contact with the light absorption anisotropic layer and has an in-plane average refractive index of 1.55 to 1.70 at a wavelength of 550 nm. It is preferable that the refractive index adjusting layer is a refractive index adjusting layer for performing so-called index matching.

<Pressure Sensitive Adhesive Layer>

The viewing angle control system and the image display device according to the embodiment of the present invention may include a pressure sensitive adhesive layer.

As the material constituting the pressure sensitive adhesive layer in the present invention, a known adhesive used in a liquid crystal display device and a self-light emitting type display device is preferable, and a pressure sensitive adhesive is more preferable.

The pressure sensitive adhesive layer may be blended with appropriate additives such as a crosslinking agent (such as an isocyanate-based crosslinking agent or an epoxy-based crosslinking agent), a viscosity imparting agent (such as a rosin derivative resin, a polyterpene resin, a petroleum resin, or an oil-soluble phenol resin), a plasticizer, a filler, an antiaging agent, a surfactant, an ultraviolet absorbing agent, a light stabilizer, and an antioxidant in addition to a parent material (pressure sensitive adhesive), conductive particles, and thermally expandable particles used as necessary.

The thickness of the pressure sensitive adhesive layer is preferably in a range of 5 to 500 µm and more preferably in a range of 5 to 250 µm. The required adhesive strength and rework suitability can be easily obtained in a case where the thickness thereof is 5 µm or greater, and the pressure sensitive adhesive may protrude or bleed from a peripheral end portion of the image display device in a case where the thickness thereof is 500 µm or less.

Examples of a method of forming the pressure sensitive adhesive layer include a method of applying a coating solution containing a parent material, conductive particles, and, as necessary, thermally expandable particles, an additive, a solvent, and the like and performing pressure bonding via a release liner and a method of coating an appropriate release liner (release paper or the like) with a coating solution to form a pressure sensitive adhesive layer and pressure-bonding and transferring (transporting) the pressure sensitive adhesive layer.

In addition, for example, a configuration in which conductive particles are added to a configuration of a thermally-releasable pressure sensitive adhesive sheet described in JP2003-292916A can be employed as the pressure sensitive adhesive layer.

Further, a layer in which conductive particles are sprayed on the surface of a pressure sensitive adhesive layer in commercially available products such as "REVALPHA"

(manufactured by Nitto Denko Corporation) may be used as the pressure sensitive adhesive layer.

<Adhesive Layer>

The viewing angle control system and the image display device according to the embodiment of the present invention may include an adhesive layer.

The adhesive contained in the adhesive layer exhibits adhesiveness due to drying or reaction after attachment.

For example, a polyvinyl alcohol-based adhesive (PVA-based adhesive) exhibits adhesiveness due to drying and is capable of bonding materials to each other.

Specific examples of the curable adhesive that exhibits adhesiveness due to reaction include an active energy ray-curable adhesive such as a (meth) acrylate-based adhesive and a cationic polymerization curable adhesive. Further, the (meth)acrylate denotes acrylate and/or methacrylate. Examples of the curable component in the (meth)acrylate-based adhesive include a compound containing a (meth) acryloyl group and a compound containing a vinyl group. Further, as the cationic polymerization curable adhesive, a compound containing an epoxy group or an oxetanyl group can also be used. The compound containing an epoxy group is not particularly limited as long as the compound contains at least two epoxy groups in a molecule, and various generally known curable epoxy compounds can be used. Preferred examples of the epoxy compound include a compound (aromatic epoxy compound) containing at least two epoxy groups and at least one aromatic ring in a molecule and a compound (alicyclic epoxy compound) containing at least two epoxy groups in a molecule, in which at least one of the epoxy groups is formed between two adjacent carbon atoms constituting an alicyclic ring.

Among these, an ultraviolet curable adhesive that is cured by irradiation with ultraviolet rays is preferably used from the viewpoint of heat deformation resistance.

An ultraviolet absorbing agent such as a salicylic acid ester-based compound, a benzophenol-based compound, a benzotriazole-based compound, a cyanoacrylate-based compound, or a nickel complex salt-based compound may be added to each of the adhesive layer and the pressure sensitive adhesive layer so that these layers have an ultraviolet absorbing ability.

A method of attaching the pressure sensitive adhesive layer and the adhesive layer is not particularly limited. Examples of the method include a method of dissolving or dispersing a base polymer or a composition thereof in a solvent such as toluene or ethyl acetate to prepare a pressure sensitive adhesive solution having a concentration of approximately 10% to 40% by mass and directly attaching the pressure sensitive adhesive solution onto a material to be coated using a method such as a casting method or a coating method. Further, other examples thereof include a method of forming a pressure sensitive adhesive layer or an adhesive layer on a separator and transferring the layer.

The pressure sensitive adhesive layer and the adhesive layer can also be provided on one or both surfaces of a film as superposed layers with different compositions or different types. In a case where the pressure sensitive adhesive layer and the adhesive layer are provided on both surfaces, the pressure sensitive adhesive layer and the adhesive layer with different compositions, types, or thicknesses may be used on the front and rear surfaces of the film.

<Other Layers>

In order to control the angle dependence of the viewing angle, the viewing angle control system and the image display device according to the embodiment of the present invention may further include an optically anisotropic film or an azimuth rotator.

For example, it is also preferable to use a resin film having optical anisotropy which consists of a polymer having repeating units derived from carbonate, cycloolefin, cellulose acylate, methyl methacrylate, styrene, a maleic acid anhydride, and the like.

<Image Display Device>

The viewing angle control system according to the embodiment of the present invention can be used for an optional image display device. That is, the present invention also relates to an image display device including the viewing angle control system.

The image display device is not particularly limited, and examples thereof include a liquid crystal display device, a self-light emitting type display device (an organic EL display device or a micro LED display device), a head-up display, and a head-mounted display. Examples of the display panel in the image display device include a display panel including a liquid crystal cell and a display panel of a self-light emitting type display device, and the viewing angle control system is disposed on these display panels.

A liquid crystal display device typically includes a liquid crystal cell and a backlight, and a polarizer is provided on both the viewing side and the backlight side of the liquid crystal cell. The viewing angle control system according to the embodiment of the present invention can be applied to any one or both surfaces on the viewing side or the backlight side of the liquid crystal display device. The application of the viewing angle control system to a liquid crystal display device can be realized by replacing the polarizer on any one or both surfaces of the liquid crystal display device with the viewing angle control system according to the embodiment of the present invention. That is, as the polarizers provided on both sides of the liquid crystal cell, the polarizer included in the viewing angle control system according to the embodiment of the present invention can be used.

In a case where the viewing angle control system according to the embodiment of the present invention is applied to a liquid crystal display device, it is preferable that the polarizer in the viewing angle control system is disposed on a side closer to the liquid crystal cell with respect to the light absorption anisotropic layer from the viewpoint of enhancing the display performance of the liquid crystal display device. Further, in a case where the viewing angle control system according to the embodiment of the present invention is applied to the backlight side of the liquid crystal display device, it is preferable that the polarizer in the viewing angle control system is a reflective polarizer or a laminate of a typical polarizer and a reflective polarizer from the viewpoint of increasing the light utilization efficiency.

In the present invention, in a case where the absorption axis of the polarizer on the viewing side between the polarizers provided on both sides of the liquid crystal cell is set as the lateral direction, the light shielding properties in the longitudinal direction can be controlled in a case where the polarizer in the viewing angle control system according to the embodiment of the present invention is used as the polarizer on the viewing side, and the light shielding properties in the lateral direction can be controlled in a case where the polarizer in the viewing angle control system is used as the polarizer on the non-viewing side.

In a case where the viewing angle control system according to the embodiment of the present invention is applied to an organic EL display device, it is preferable that the viewing angle control system is disposed on the viewing side of the organic EL display device and the polarizer in the viewing angle control system according to the embodiment of the present invention is disposed on a side closer to the organic EL display device with respect to the light absorption anisotropic layer. In addition, it is preferable that a λ/4 plate is disposed between the polarizer and the organic EL display device.

In the viewing angle control system in the image display device, it is preferable that the light absorption anisotropic layer is disposed on the viewing side with respect to the polarizer.

Hereinafter, the liquid crystal cell constituting the liquid crystal display device will be described in detail.

(Liquid Crystal Cell)

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twistedly aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H2-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photoalignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizer are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

EXAMPLES

Hereinafter, the present invention will be described in more detail based on the following examples. The materials, the reagents, the amounts of substances and the proportions of the substances, the operations, and the like shown in the following examples can be appropriately changed within a range not departing from the scope of the present invention. Therefore, the scope of the present invention is not limited to the following specific examples.

Comparative Example 1

A light absorption anisotropic layer in which a coloring agent (dichroic substance) was aligned in the vertical direction was prepared in the following manner.

(Preparation of Retardation Layer)

Various retardation layers used in the examples of the present invention were prepared as follows.

(Extrusion Molding)

A cycloolefin resin ARTON G7810 (manufactured by JSR Corporation) was dried at 100° C. for 2 hours or longer and melt-extruded at 280° C. using a twin screw kneading extruder. Here, a screen filter, a gear pump, and a leaf disc filter were disposed in this order between the extruder and the die, these were connected by a melt pipe, and the resultant was extruded from a T die having a width of 1000 mm and a lip gap of 1 mm and was cast on a triple cast roll whose temperature was set to 180° C., 175° C., and 170° C., thereby obtaining an unstretched film 1 having a width of 900 mm and a thickness of 320 μm.

(Stretching/Thermal Fixation)

The unstretched film 1 being transported was subjected to a stretching step and a thermal fixing step by the following method.

(a) Machine-Direction Stretching

The unstretched film 1 was machine-directionally stretched under the following conditions while being transported using an inter-roll machine-direction stretching machine having an aspect ratio (L/W) of 0.2.

[Conditions]
Preheating temperature: 170° C.
Stretching temperature: 170° C.
Stretching ratio: 155%

(b) Cross-Direction Stretching

The machine-directionally stretched film was cross-directionally stretched under the following conditions while being transported using a tenter.

[Conditions]
Preheating temperature: 170° C.
Stretching temperature: 170° C.
Stretching ratio: 80%

(c) Thermal Fixation

After the stretching step, the stretched film was subjected to a heat treatment under the following conditions while end portions of the stretched film were gripped with a tenter clip to hold both end portions of the stretched film such that the width thereof was constant (within 3% of expansion or contraction), and the stretched film was thermally fixed.

Thermal fixation temperature: 165° C.
Thermal fixation time: 30 seconds

Further, the preheating temperature, the stretching temperature, and the thermal fixation temperature are average values of values measured at five points in the width direction using a radiation thermometer.

(Winding)

After the thermal fixation, both ends of the stretched film were trimmed and wound at a tension of 25 kg/m, thereby obtaining a film roll having a width of 1340 mm and a winding length of 2000 m.

The obtained stretched film had an in-plane retardation Re of 170 nm at a wavelength of 550 nm, a retardation Rth of 510 nm at a wavelength of 550 nm in the thickness direction, an Nz coefficient of 3.5, a slow axis in the MD direction, and a film thickness of 68 µm. The obtained film was set as a B-plate 20 and used as the retardation layer of Comparative Example 1.

(Preparation of transparent support 1 with alignment layer)

One surface of the B-plate 20 prepared above was subjected to a corona treatment and coated with the following coating solution 1 for forming an alignment base layer with a wire bar. The support on which the coating film had been formed was dried with hot air at 60° C. for 60 seconds and further dried with hot air at 100° C. for 120 seconds to form an alignment base layer, thereby obtaining a transparent support 1 with an alignment base layer.

The film thickness of the alignment layer was 0.5

| (Coating solution 1 for forming alignment layer) | |
|---|---|
| Modified polyvinyl alcohol shown below: | 3.80 parts by mass |
| Initiator Irg2959: | 0.20 parts by mass |
| Water: | 70 parts by mass |
| Methanol: | 30 parts by mass |

Modified Polyvinyl Alcohol

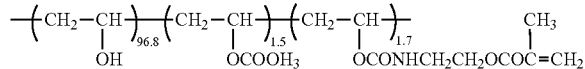

The alignment base layer was further coated with the following composition liquid E1 for forming a photoalignment layer and dried at 60° C. for 2 minutes. Thereafter, the obtained coating film was irradiated with ultraviolet rays (UV) (irradiation amount: 2000 mJ/cm²) at a polar angle θuv of 0° (film normal direction) using an ultraviolet exposure device, thereby preparing a transparent support 1 with a photoalignment layer having a thickness of 0.03 Here, the reference 0° of the azimuthal angle φuv is defined as the slow axis of the transparent support 1 (negative B-plate 20), and the reference 0° of the polar angle θuv is defined as the normal direction of the transparent support 1.

Figure 6:
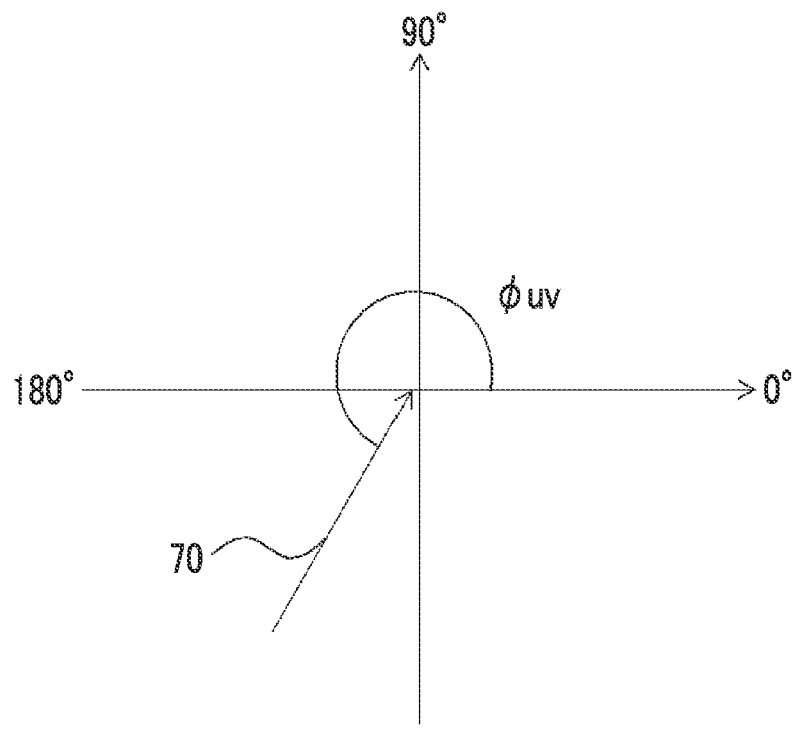
FIG. 6 is a schematic view illustrating a definition of an azimuthal angle φuv of ultraviolet light (UV light) irradiation in a case of preparing the light absorption anisotropic layer of the viewing angle control system according to the present invention.
Figure 7:
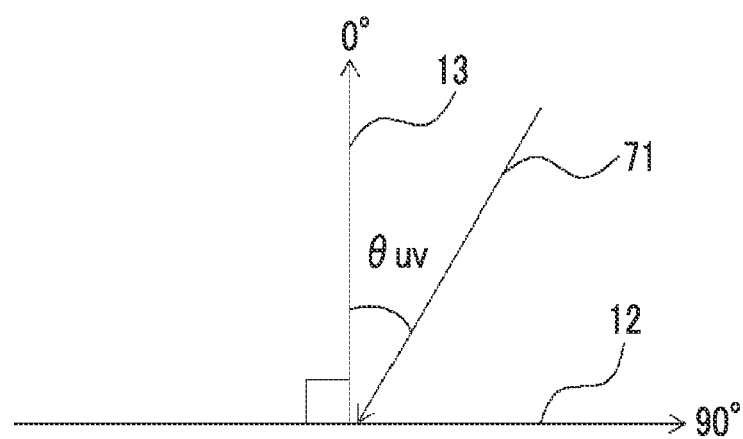
FIG. 7 is a schematic view illustrating the definition of a polar angle θuv of UV light irradiation in a case of preparing the light absorption anisotropic layer of the viewing angle control system according to the present invention.
Figure 8:
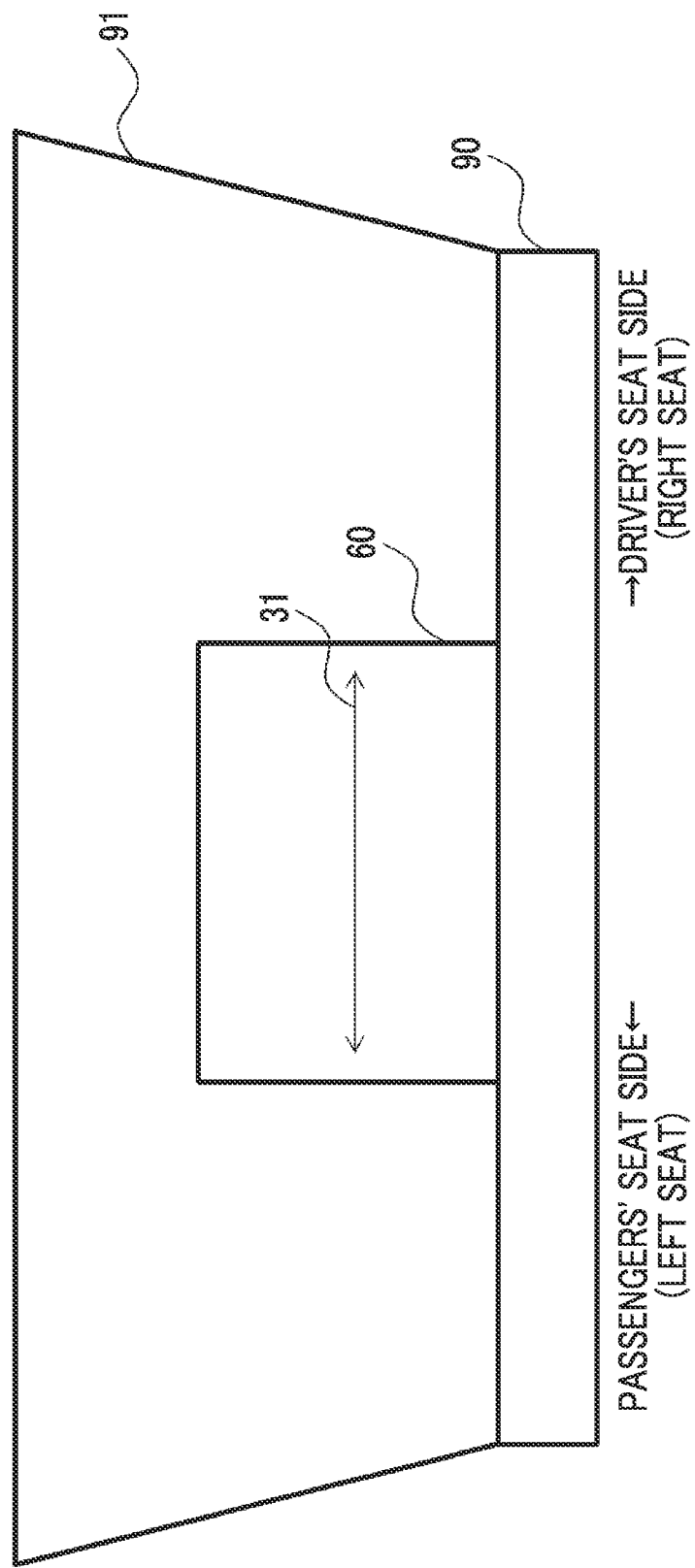
FIG. 8 is a schematic view illustrating installation of a dashboard portion of an automobile of an image display device according to the present invention as viewed from the front.

FIGS. 6 and 8 illustrate the definitions of the azimuthal angle φuv and the polar angle θuv of irradiation with UV light during the preparation of the light absorption anisotropic layer of the viewing angle control system. More specifically, FIG. 6 is a view illustrating the azimuthal angle φuv in a UV light irradiation direction 70 and shows the azimuthal angle in a direction at which ultraviolet light is applied, as a positive angle value in the counterclockwise direction using the slow axis of the transparent support 1 (negative B-plate 20) as a reference (0°). FIG. 7 is a view illustrating a polar angle θuv in a UV light irradiation direction 71, and the angle between a normal line 13 (the normal direction with respect to the surface of the alignment base layer) with respect to a film surface 12 (the surface of the alignment base layer) and a UV light irradiation direction 71 is defined as the polar angle θuv.

(Preparation of Composition Liquid E1 for Forming Photoalignment Layer)

The composition liquid E1 for forming a photoalignment layer was prepared with the following composition, dissolved for 1 hour while being stirred, and filtered through a filter with a hole diameter of 0.45

| Composition liquid E1 for forming photoalignment layer | |
|---|---|
| Photoalignment material E-1 shown below: | 0.3 parts by mass |
| 2-Butoxyethanol: | 41.6 parts by mass |
| Dipropylene glycol monomethyl ether: | 41.6 parts by mass |
| Pure water: | 16.5 parts by mass |

Photoalignment material E-1

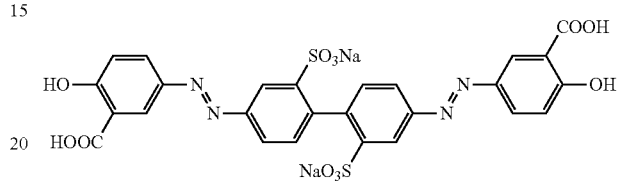

(Formation of Light Absorption Anisotropic Layer P1)

A coating layer P1 was formed by continuously coating the obtained photoalignment layer with the following composition P1 for forming a light absorption anisotropic layer using a wire bar.

Next, the coating layer P1 was heated at 120° C. for 30 seconds, and the coating layer P1 was cooled to room temperature (23° C.).

Next, the coating layer was heated at 80° C. for 60 seconds and cooled to room temperature again.

Thereafter, the coating layer was irradiated with an LED lamp (center wavelength of 365 nm) for 2 seconds under an irradiation condition of an illuminance of 200 mW/cm², thereby preparing a light absorption anisotropic layer P1 on the photoalignment layer.

The film thickness of the light absorption anisotropic layer P1 was 3.5 and the alignment degree thereof was 0.96. The angle θ between the transmittance central axis of the light absorption anisotropic layer P1 and the normal line of the film (the normal direction with respect to the surface of the light absorption anisotropic layer) was 0°.

The obtained layer was defined as a light absorption anisotropic film 1.

| Composition of composition P1 for forming light absorption anisotropic layer | |
|---|---|
| Dichroic substance D-1 shown below: | 0.40 parts by mass |
| Dichroic substance D-2 shown below: | 0.15 parts by mass |
| Dichroic substance D-3 shown below: | 0.63 parts by mass |
| Polymer liquid crystal compound P-1 shown below: | 3.20 parts by mass |
| Low-molecular-weight liquid crystal compound M-1 shown below: | 0.45 parts by mass |
| Polymerization initiator IRGACURE OXE-02 (manufactured by BASF SE): | 0.040 parts by mass |
| Compound E-1 shown below: | 0.060 parts by mass |
| Compound E-2 shown below: | 0.060 parts by mass |
| Surfactant F-1 shown below: | 0.010 parts by mass |
| Surfactant F-2 shown below: | 0.015 parts by mass |
| Cyclopentanone: | 90.00 parts by mass |
| Benzyl alcohol: | 5.00 parts by mass |

Dichroic substance D-1
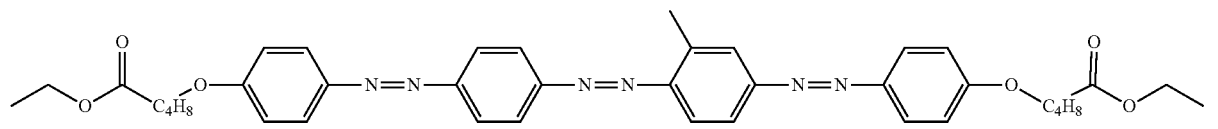
Dichroic substance D-2
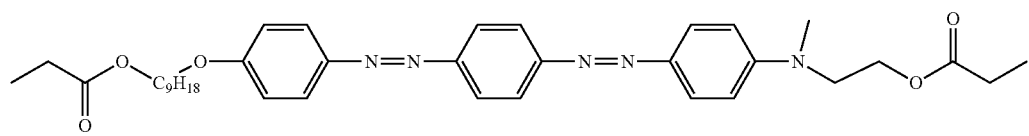
Dichroic substance D-3
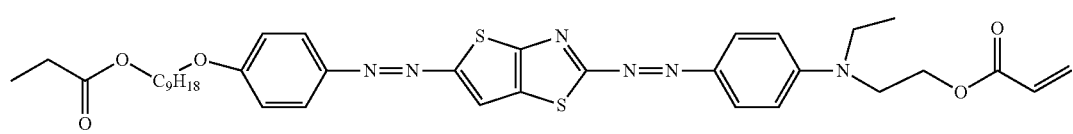
Polymer liquid crystal compound P-1
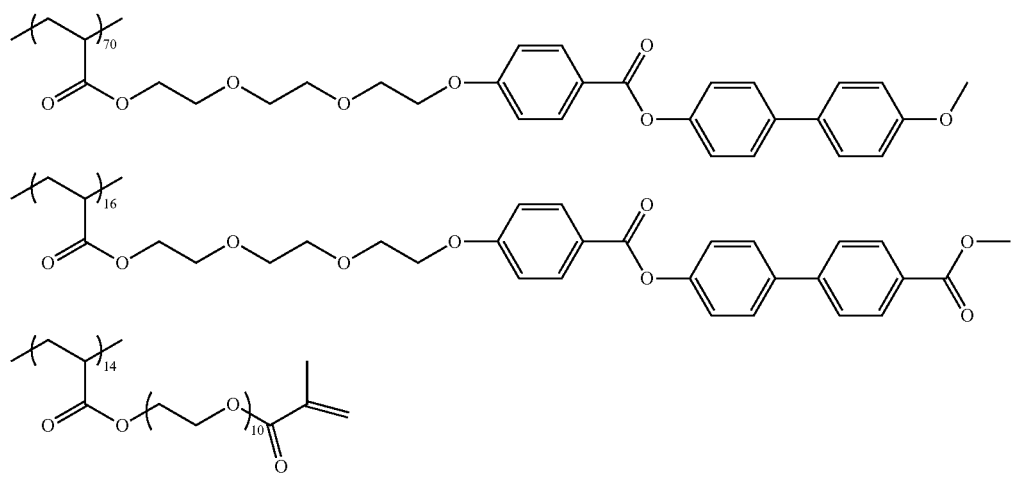
Low-molecular-weight liquid crystal compound M-1
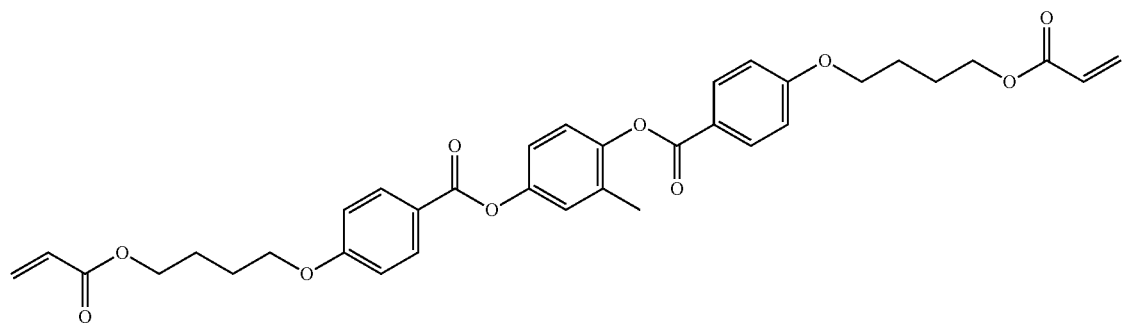
Compound E-1
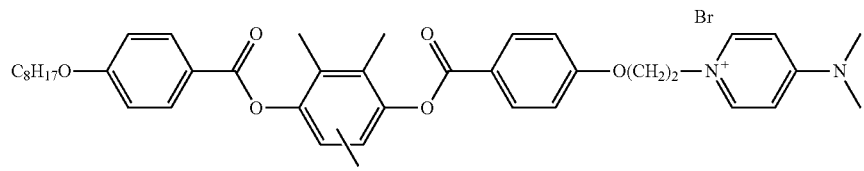

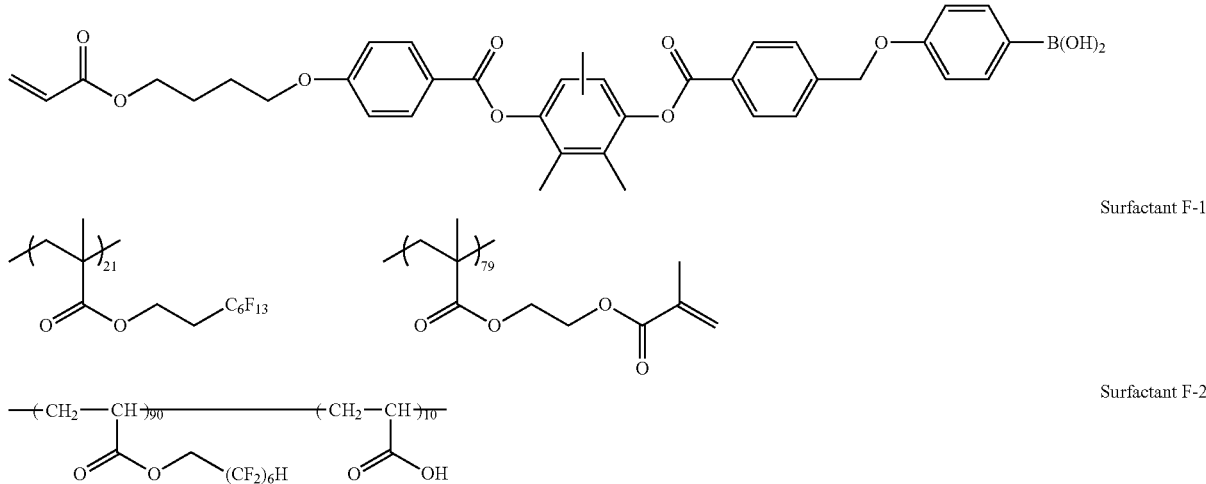

(Preparation of Viewing Angle Control System 1)

A polarizing plate 1 in which the thickness of the polarizer was 8 μm and one surface of the polarizer was exposed was prepared by the same method as that for a polarizing plate 02 with a one-surface protective film described in WO2015/166991A.

The surface of the polarizing plate 1 in which the polarizer was exposed and the surface of the transparent support 1 of the light absorption anisotropic film 1 prepared above were subjected to a corona treatment, and both surfaces were bonded to each other using the following PVA adhesive 1, thereby preparing a viewing angle control system 1. At this time, the slow axis of the transparent support 1 (negative B-plate 20) and the absorption axis of the polarizer were bonded to each other such that the slow axis and the absorption axis were parallel to each other. Further, the transmittance central axis of the light absorption anisotropic layer and the normal line of the film surface (the normal direction with respect to the surface of the light absorption anisotropic layer) coincided with each other, and the angle between the transmittance central axis of the light absorption anisotropic layer and the absorption axis of the polarizer in the polarizing plate 1 was 90°.

(Preparation of PVA Adhesive 1)

20 parts by mass of methylol melamine with respect to 100 parts by mass of a polyvinyl alcohol-based resin containing an acetoacetyl group (average degree of polymerization: 1200, degree of saponification: 98.5% by mole, degree of acetoacetylation: 5% by mole) was dissolved in pure water under a temperature condition of 30° C. to prepare an aqueous solution in which the concentration of solid contents was adjusted to 3.7% by mass.

(Preparation of Image Display Device 1)

A Wi-Fi model iPad (registered trademark) Air (manufactured by APPLE, Inc.) with a capacity of 16 GB, which is an IPS mode liquid crystal display device, was disassembled to take out the liquid crystal display panel including a liquid crystal cell and polarizers disposed on both surfaces of the liquid crystal cell. The viewing angle control system 1 prepared above was bonded to the surface formed by peeling the viewing-side polarizing plate off from the liquid crystal display panel such that the polarizing plate 1 side was the liquid crystal cell side, using the following pressure sensitive adhesive sheet 1. Here, the laminate was bonded to the surface such that the direction of the absorption axis of the polarizer in the polarizing plate 1 was set as the longitudinal direction of the liquid crystal screen. The device was reassembled after the bonding to the liquid crystal cell to prepare an image display device 1.

(Preparation of Pressure Sensitive Adhesive Sheet 1)

Next, an acrylate-based polymer was prepared according to the following procedures.

95 parts by mass of butyl acrylate and 5 parts by mass of acrylic acid were polymerized by a solution polymerization method in a reaction container equipped with a cooling pipe, a nitrogen introduction pipe, a thermometer, and a stirrer, thereby obtaining an acrylate-based polymer A1 with an average molecular weight of 2000000 and a molecular weight distribution (Mw/Mn) of 3.0.

Next, the obtained acrylate-based polymer A1 (100 parts by mass), coronate L (75% by mass ethyl acetate solution of trimethylolpropane adduct of tolylene isocyanate, number of isocyanate groups in one molecule: 3, manufactured by Nippon Polyurethane Industry Co., Ltd.) (1.0 parts by mass), and a silane coupling agent KBM-403 (manufactured by Shin-Etsu Chemical Co., Ltd.) (0.2 parts by mass) were mixed with each other, and ethyl acetate was finally added to the mixture such that the concentration of the total solid contents reached 10% by mass, thereby preparing a composition for forming a pressure sensitive adhesive. A separate film subjected to a surface treatment with a silicone-based release agent was coated with the composition using a die coater and dried in an environment of 90° C. for 1 minute, thereby obtaining an acrylate-based pressure sensitive adhesive sheet. The film thickness was 25 and the storage elastic modulus was 0.1 MPa.

Comparative Example 2 and Examples 1 to 5

Viewing angle control films 2 to 7 and image display devices 2 to 7 were prepared in the same manner as in Comparative Example 1 except that the composition liquid E1 for forming a photoalignment layer was applied and the azimuthal angle φuv and the polar angle θuv at which the coating film obtained by being dried at 60° C. for 2 minutes was irradiated with ultraviolet light were changed as listed in Table 1.

Example 6

A viewing angle control film 8 and an image display device 8 were prepared in the same manner as in Comparative Example 1 except that the following composition P2 for forming a light absorption anisotropic layer was used as the composition for forming a light absorption anisotropic layer, the composition liquid E1 for forming a photoalignment layer was applied, and the azimuthal angle φuv and the polar angle θuv at which the coating film obtained by being dried at 60° C. for 2 minutes was irradiated with ultraviolet light were changed as listed in Table 1.

| Composition of composition P2 for forming light absorption anisotropic layer | |
|---|---|
| Dichroic substance D-1: | 0.40 parts by mass |
| Dichroic substance D-2: | 0.15 parts by mass |
| Dichroic substance D-3: | 0.63 parts by mass |
| Low-molecular-weight liquid crystal compound M-2: | 2.74 parts by mass |
| Low-molecular-weight liquid crystal compound M-3: | 0.91 parts by mass |
| Polymerization initiator IRGACURE OXE-02 (manufactured by BASF SE): | 0.040 parts by mass |
| Compound E-1: | 0.060 parts by mass |
| Compound E-2: | 0.060 parts by mass |
| Surfactant F-1: | 0.010 parts by mass |
| Surfactant F-2: | 0.015 parts by mass |
| Cyclopentanone: | 90.00 parts by mass |
| Benzyl alcohol: | 5.00 parts by mass |

A viewing angle control film 9 and an image display device 9 were prepared in the same manner as in Comparative Example 1 except that the following composition P3 for forming a light absorption anisotropic layer was used as the composition for forming a light absorption anisotropic layer, the composition liquid E1 for forming a photoalignment layer was applied, and the azimuthal angle φuv and the polar angle θuv at which the coating film obtained by being dried at 60° C. for 2 minutes was irradiated with ultraviolet light were changed as listed in Table 1.

| Composition of composition P3 for forming light absorption anisotropic layer | |
|---|---|
| Dichroic substance D-1: | 0.40 parts by mass |
| Dichroic substance D-2: | 0.15 parts by mass |
| Dichroic substance D-3: | 0.63 parts by mass |
| Low-molecular-weight liquid crystal compound M-4: | 2.74 parts by mass |
| Low-molecular-weight liquid crystal compound M-5: | 0.91 parts by mass |
| Polymerization initiator IRGACURE OXE-02 (manufactured by BASF SE): | 0.040 parts by mass |
| Compound E-1: | 0.060 parts by mass |
| Compound E-2: | 0.060 parts by mass |
| Surfactant F-1: | 0.010 parts by mass |
| Surfactant F-2: | 0.015 parts by mass |
| Cyclopentanone: | 90.00 parts by mass |
| Benzyl alcohol: | 5.00 parts by mass |

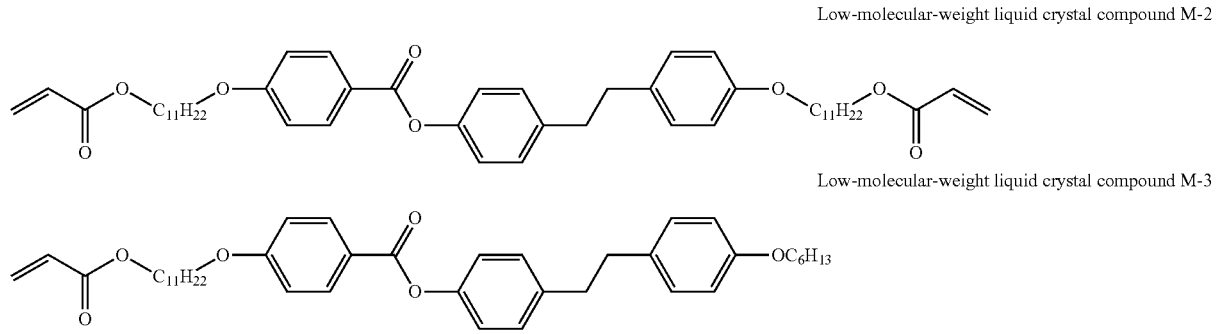

Low-molecular-weight liquid crystal compound M-2

Low-molecular-weight liquid crystal compound M-3

Example 7

A viewing angle control film 9 and an image display device 9 were prepared in the same manner as in Compara-

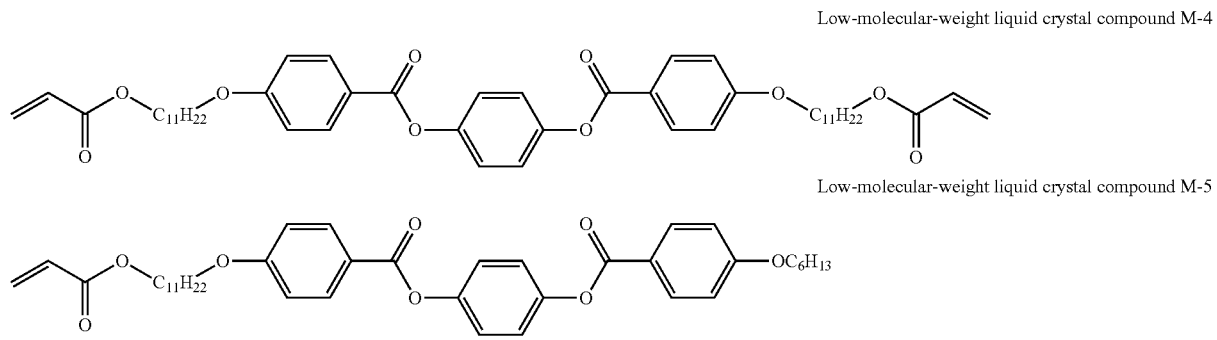

Low-molecular-weight liquid crystal compound M-4

Low-molecular-weight liquid crystal compound M-5

<Performance Evaluation>
(1) Evaluation of Alignment Degree and Transmittance

With the obtained light absorption anisotropic layer, the transmittance of P polarized light having a wavelength of 550 nm on the light absorption anisotropic layer was measured using AxoScan OPMF-1 (manufactured by Opto Science Inc.). More specifically, in the measurement, the transmittance of the light absorption anisotropic layer was measured by first investigating the azimuthal angle at which the transmittance central axis was inclined and allowing P polarized light having a wavelength of 550 nm to be incident while the polar angle which was the angle of the surface of the light absorption anisotropic layer in the normal direction was changed from 0° to 60° for every 5° in the plane (the plane that had the transmittance central axis and was orthogonal to the layer surface) having the normal direction of the light absorption anisotropic layer along the azimuthal angle thereof. As a result, the direction at which the highest transmittance was exhibited was defined as the transmittance central axis.

After removing the influence of surface reflection, ko [λ] and ke [λ] were calculated by fitting to the following theoretical equation considering Snell's formula and Fresnel's formula. The measurement wavelength λ, was 550 nm.

$$k = -\log(T) \times \lambda / (4\pi d)$$

The absorbance and the dichroic ratio in the in-plane direction and the thickness direction were calculated, and the alignment degree was finally acquired based on the obtained ko [λ] and ke [λ].

(2) Evaluation of Brightness of Image Display Device

Figure 4:
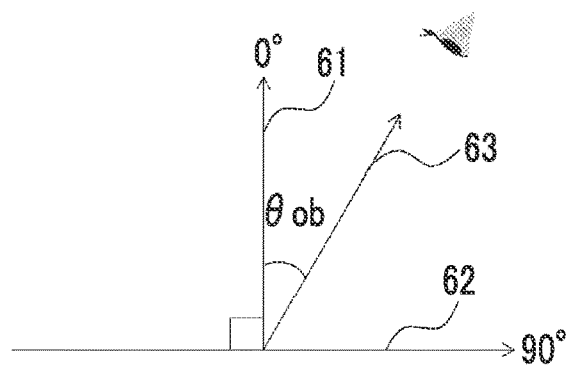
FIG. 4 is a schematic view illustrating the definition of a polar angle θob in an observation direction in a case of observing the image display device of the present invention.
Figure 5:
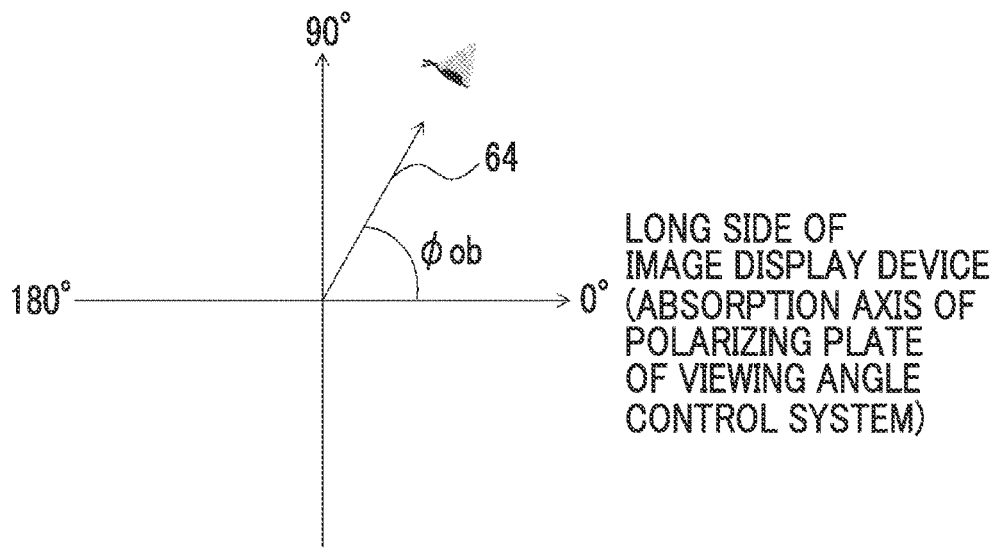
FIG. 5 is a schematic view illustrating the definition of an azimuthal angle φob in an observation direction in a case of observing the image display device of the present invention.

The brightness at a polar angle θob of 0° to 80° and an azimuthal angle φob of 0° (rightward toward the front surface) to 360° of a white display screen of each of the image display devices 1 to 7 prepared above was measured using a measuring device (EZ-Contrast XL88, manufactured by ELDIM). The polar angle θob of 0° was set as the normal direction of the surface of the image display device, and the azimuthal angle φob of 0° was set as the longitudinal direction of the screen of the image display device (the absorption axis direction of the polarizer of the viewing angle control system). The definitions of the polar angle θob and the azimuthal angle φob in the observation direction are shown in FIGS. 4 and 5. FIG. 4 is a view for describing a polar angle in the observation direction, and a normal direction 61 and an observation direction 63 with respect to the surface of an image display device 62 (the surface of the image display device) are illustrated in FIG. 4, and the angle between the normal direction 61 and the observation direction 63 corresponds to the polar angle θob. FIG. 5 is a view for describing an azimuthal angle in the observation direction, the azimuthal angle is represented by a positive angle value in the counterclockwise direction as the image display device is observed from the viewing angle control system side using a long side of the image display device (corresponding to the absorption axis of the polarizer of the viewing angle control system) as a reference (0°) in FIG. 5, and the angle between a direction 64 of orthogonal projection onto the image display surface in the observation direction of the image display device and a long side of the image display device (corresponding to the absorption axis of the polarizer of the viewing angle control system) corresponds to the azimuthal angle φob.

In a case where the brightness in the front direction (θob=0°) of the white display screen of the image display device is set to 100%, the brightnesses in other directions are listed in the columns of "observation direction" of Table 2. In the columns of "observation direction" of Table 2, the results of the brightness at a polar angle θob of 40° and an azimuthal angle φob of 45°, 90°, or 180° are listed.

It is assumed that the reason for observing at the angles is that the image display device is applied to an in-vehicle application.

Figure 9:
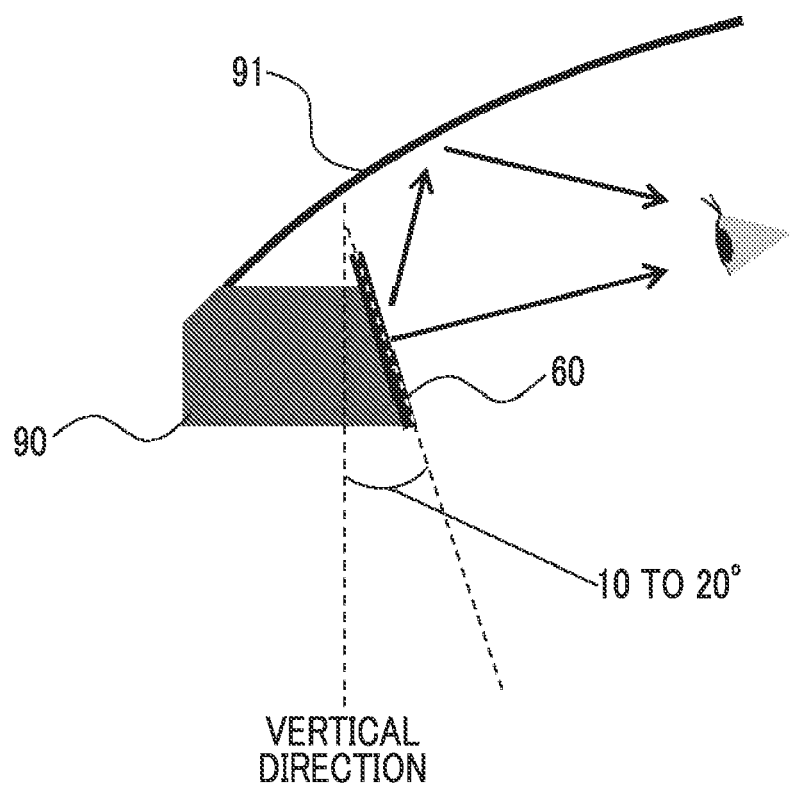
FIG. 9 is a schematic view (cross-sectional view) illustrating installation of a dashboard portion of an automobile of the image display device according to the present invention as viewed from a side.

FIG. 8 and FIG. 9 are schematic views illustrating an arrangement in a case where an image display device is installed on a dashboard at the central portion of a driver's seat and a passenger's seat (for example, a car navigation device) in a right-hand drive automobile. As illustrated in FIG. 8, in a case where the image display device 60 is disposed on a dashboard 90, an image from the image display device 60 may be reflected on a windshield 91 as described below. As illustrated in FIG. 9, the image display device 60 is tilted by 10° to 20° with respect to the vertical direction.

Figure 10:
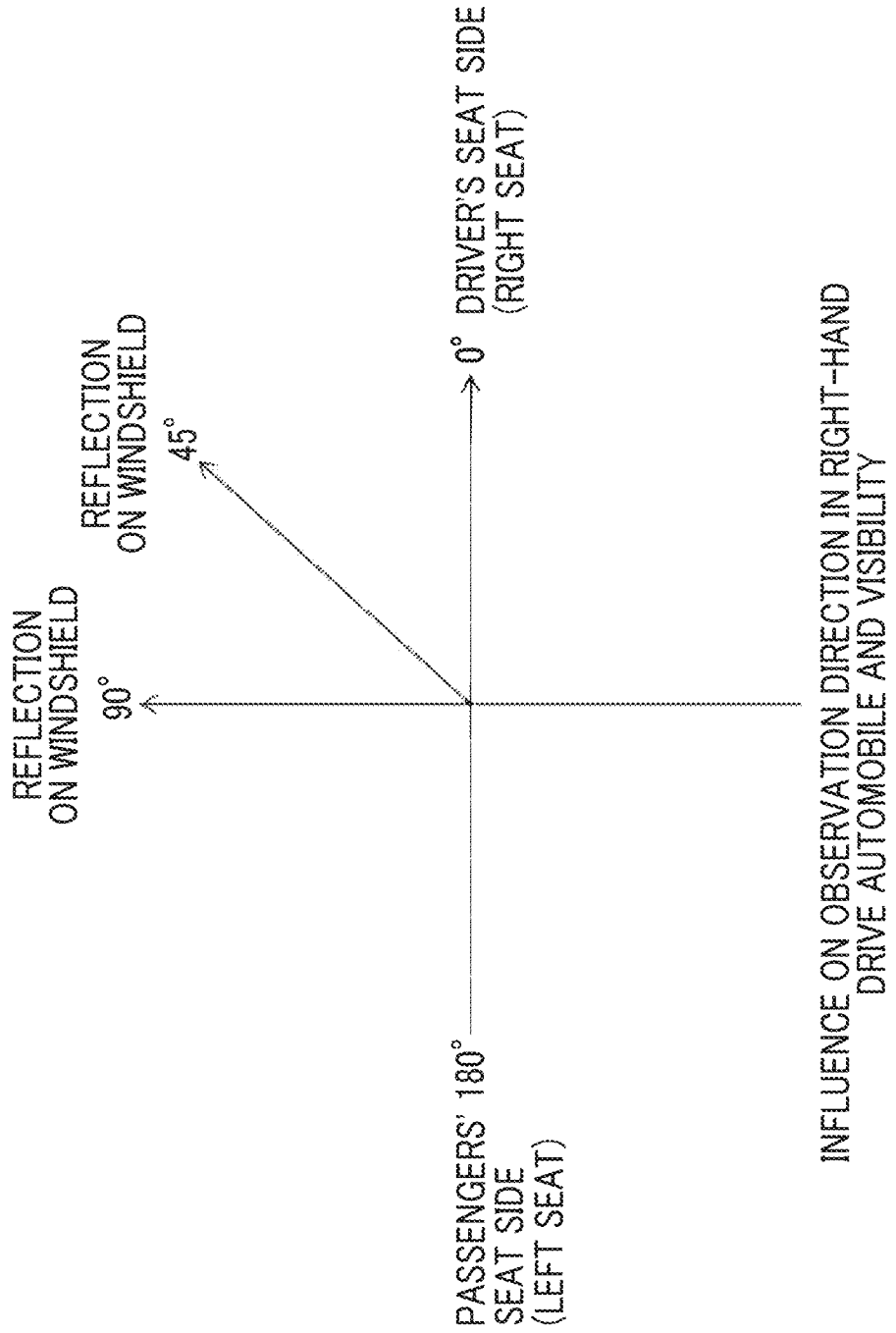
FIG. 10 is a schematic view illustrating an influence on an observation direction and visibility in a right-hand drive automobile in a case where the image display device according to the present invention is installed on a dashboard portion of an automobile.

FIG. 10 is a schematic view illustrating an influence on an observation direction and visibility in a right-hand drive automobile in a case where the image display device according to the present invention is installed on a dashboard portion of an automobile.

As illustrated in FIG. 10, each azimuthal angle φob at a polar angle θob=40° is as follows (FIG. 10).

φob=45° and 90°: azimuth in which an image of the image display device is reflected on the windshield. In a case where the brightness is greater than 25%, the reflected image on the driver's seat side is apparent and may hinder driving.

φob=180°: azimuth in which an image of the image display device is visually recognized from the passenger's seat side. In a case where the brightness is 70% or greater, the visibility from the passenger's seat side is satisfactory.

In a left-hand drive automobile, the same effects as those for the right-hand drive automobile can be obtained by applying the composition liquid E1 for forming a photoalignment layer, changing the azimuthal angle φuv in which the coating film obtained by being dried at 60° C. for 2 minutes is irradiated with ultraviolet light to an azimuthal angle φuv (right-hand)=540−φuv (right-hand), and adjusting the azimuthal angle φ of the transmittance central axis of the light absorption anisotropic layer to φ (left-hand)=540−φ (right-hand).

TABLE 1

| | | | | Conditions for preparing light absorption anisotropic film | | | | | |
|---|---|---|---|---|---|---|---|---|---|
| | | | | Coating solution for forming | Coating solution for forming | | | Composition for forming light absorption | Transmittance central axis |
| | Viewing angle control system | Transparent support | alignment base layer | photoalignment layer | φuv [°] | θuv [°] | anisotropic layer | φ [°] | θ [°] |
| Comparative Example 1 | Viewing angle control system 1 | B-plate 20 | 1 | E1 | 0 | 0 | P1 | 0 | 0 |
| Comparative Example 2 | Viewing angle control system 2 | B-plate 20 | 1 | E1 | 270 | 15 | P1 | 270 | 15 |

TABLE 1-continued

Conditions for preparing light absorption anisotropic film

| | Viewing angle control system | Transparent support | Coating solution for forming alignment base layer | Coating solution for forming photoalignment layer | φuv [°] | θuv [°] | Composition for forming light absorption anisotropic layer | Transmittance central axis φ [°] | θ [°] |
|---|---|---|---|---|---|---|---|---|---|
| Example 1 | Viewing angle control system 3 | B-plate 20 | 1 | E1 | 280 | 15 | P1 | 280 | 15 |
| Example 2 | Viewing angle control system 4 | B-plate 20 | 1 | E1 | 300 | 15 | P1 | 300 | 15 |
| Example 3 | Viewing angle control system 5 | B-plate 20 | 1 | E1 | 315 | 15 | P1 | 315 | 15 |
| Example 4 | Viewing angle control system 6 | B-plate 20 | 1 | E1 | 330 | 15 | P1 | 330 | 15 |
| Example 5 | Viewing angle control system 7 | B-plate 20 | 1 | E1 | 345 | 15 | P1 | 345 | 15 |
| Example 6 | Viewing angle control system 8 | B-plate 20 | 1 | E1 | 300 | 15 | P1 | 300 | 15 |
| Example 7 | Viewing angle control system 9 | B-plate 20 | 1 | E1 | 300 | 15 | P1 | 300 | 15 |

TABLE 2

| | Image display device | Viewing angle control system | Transmittance central axis θ (°) | Transmittance central axis Φ (°) | θob (°) | Observation direction Φob (°) 45 | Observation direction Φob (°) 90 | Observation direction Φob (°) 180 |
|---|---|---|---|---|---|---|---|---|
| Comparative Example 1 | Image display device 1 | Viewing angle control system 1 | 0 | 0 | 40 | 30.1% | 10.5% | 89.3% |
| Comparative Example 2 | Image display device 2 | Viewing angle control system 2 | 15 | 270 | 40 | 8.6% | 0.6% | 66.3% |
| Example 1 | Image display device 3 | Viewing angle control system 3 | 15 | 280 | 40 | 7.6% | 1.1% | 70.0% |
| Example 2 | Image display device 4 | Viewing angle control system 4 | 15 | 300 | 40 | 8.1% | 4.8% | 76.6% |
| Example 3 | Image display device 5 | Viewing angle control system 5 | 15 | 315 | 40 | 11.0% | 9.8% | 81.7% |
| Example 4 | Image display device 6 | Viewing angle control system 6 | 15 | 330 | 40 | 16.2% | 16.2% | 85.8% |
| Example 5 | Image display device 7 | Viewing angle control system 7 | 15 | 345 | 40 | 24.4% | 23.7% | 88.4% |
| Example 6 | Image display device 8 | Viewing angle control system 8 | 15 | 300 | 40 | 9.1% | 5.2% | 74.0% |
| Example 7 | Image display device 9 | Viewing angle control system 9 | 15 | 300 | 40 | 9.3% | 5.5% | 73.6% |

As listed in Table 2, in Examples 1 to 7, the reflection of the image on the windshield was weak, and the visibility from the passenger seat was sufficient.

On the contrary, in Comparative Example 1, the reflection of the image on the windshield was apparent.

In addition, in Comparative Example 2, the visibility from the passenger seat was insufficient.

EXPLANATION OF REFERENCES

10: light absorption anisotropic layer
11: transmittance central axis
11b: direction in which transmittance central axis is orthographically projected onto film surface
11b1: direction in which transmittance central axis is orthographically projected onto film surface (first quadrant)
11b2: direction in which transmittance central axis is orthographically projected onto film surface (second quadrant)
11b3: direction in which transmittance central axis is orthographically projected onto film surface (third quadrant)
11b4: direction in which transmittance central axis is orthographically projected onto film surface (fourth quadrant)
12: film surface
13: film normal direction
20: retardation layer
21: slow axis of retardation layer
30: polarizer
31: absorption axis of polarizer
40: display panel
50: viewing angle control system
60: image display device
61: normal line of image display device surface
62: image display device surface
63: observation direction of image display device
64: direction of orthogonal projection onto image display surface in observation direction of image display device 70,71: UV light irradiation direction
90: dashboard
91: windshield

What is claimed is:

1. A viewing angle control system comprising:
   a polarizer; and
   a light absorption anisotropic layer,
   wherein the direction of the absorption axis of the polarizer is parallel to the in-plane direction of the polarizer,
   an angle θ between a transmittance central axis of the light absorption anisotropic layer and a normal line of the light absorption anisotropic layer is in a range of 0.1° to 45°, and
   an angle φ between a direction in which the transmittance central axis of the light absorption anisotropic layer is orthographically projected onto the surface of the light absorption anisotropic layer and the absorption axis of the polarizer is 0° or greater and less than 85°, greater than 95° and less than 265°, or greater than 275° and 360° or less.

2. The viewing angle control system according to claim 1, further comprising:
   a retardation layer provided between a polarizer layer and the light absorption anisotropic layer,
   wherein an angle between a slow axis of the retardation layer and the absorption axis of the polarizer is in a range of 0° to 10°.

3. The viewing angle control system according to claim 2, wherein the retardation layer is a B-plate having an Nz coefficient of 1.5 or greater.

4. The viewing angle control system according to claim 3, wherein an in-plane retardation Re of the retardation layer at a wavelength of 550 nm is greater than 60 nm.

5. An image display device comprising:
   the viewing angle control system according to claim 3.

6. The viewing angle control system according to claim 2, wherein an in-plane retardation Re of the retardation layer at a wavelength of 550 nm is greater than 60 nm.

7. An image display device comprising:
   the viewing angle control system according to claim 6.

8. An image display device comprising:
   the viewing angle control system according to claim 2.

9. An image display device comprising:
   the viewing angle control system according to claim 1.

10. The image display device according to claim 9, comprising:
    a liquid crystal cell; and
    the viewing angle control system,
    wherein the viewing angle control system is disposed on the liquid crystal cell.

11. The image display device according to claim 10, wherein a light absorption anisotropic layer is disposed on a viewing side with respect to a polarizer in the viewing angle control system.

12. The image display device according to claim 9, comprising:
    a self-light emitting type display device; and
    wherein the viewing angle control system is disposed on a viewing side of the self-light emitting type display device.

13. The image display device according to claim 12, wherein a light absorption anisotropic layer is disposed on a viewing side with respect to a polarizer in the viewing angle control system.

14. The image display device according to claim 9, wherein a light absorption anisotropic layer is disposed on a viewing side with respect to a polarizer in the viewing angle control system.

* * * * *